United States Patent
Ichinose

(10) Patent No.: US 8,446,569 B2
(45) Date of Patent: May 21, 2013

(54) EXPOSURE APPARATUS, EXPOSURE METHOD AND DEVICE MANUFACTURING METHOD

(75) Inventor: Go Ichinose, Fukaya (JP)

(73) Assignee: Nikon Corporation, Tokyo (JP)

( * ) Notice: Subject to any disclaimer, the term of this patent is extended or adjusted under 35 U.S.C. 154(b) by 516 days.

(21) Appl. No.: 12/818,386

(22) Filed: Jun. 18, 2010

(65) Prior Publication Data

US 2011/0008717 A1    Jan. 13, 2011

Related U.S. Application Data

(60) Provisional application No. 61/218,460, filed on Jun. 19, 2009, provisional application No. 61/213,677, filed on Jul. 1, 2009, provisional application No. 61/213,680, filed on Jul. 1, 2009.

(30) Foreign Application Priority Data

Jun. 19, 2009   (JP) ................................ 2009-145959
Jun. 19, 2009   (JP) ................................ 2009-145967

(51) Int. Cl.
*G03B 27/58*   (2006.01)
*G03B 27/42*   (2006.01)

(52) U.S. Cl.
USPC .............................................. 355/72; 355/53

(58) Field of Classification Search
USPC ............ 355/53, 72, 75; 378/34, 35; 356/399, 356/400, 401; 250/548, 492.2; 318/649
See application file for complete search history.

(56) References Cited

U.S. PATENT DOCUMENTS

| 4,465,368 | A | 8/1984 | Matsuura et al. |
| 4,780,617 | A | 10/1988 | Umatate et al. |
| 5,646,413 | A | 7/1997 | Nishi |
| 6,437,463 | B1 | 8/2002 | Hazelton et al. |
| 6,611,316 | B2 | 8/2003 | Sewell |
| 6,778,257 | B2 | 8/2004 | Bleeker et al. |
| 7,023,610 | B2 | 4/2006 | Ohtsuki et al. |
| 2002/0041377 | A1 | 4/2002 | Hagiwara et al. |
| 2003/0025890 | A1 | 2/2003 | Nishinaga |
| 2003/0085676 | A1 | 5/2003 | Binnard |

(Continued)

FOREIGN PATENT DOCUMENTS

| EP | 1 450 208 A1 | 8/2004 |
| EP | 1 950 793 A1 | 7/2008 |

(Continued)

OTHER PUBLICATIONS

International Search Report issued in International Application No. PCT/JP2010/060923 dated Oct. 5, 2011.

(Continued)

*Primary Examiner* — Peter B Kim
(74) *Attorney, Agent, or Firm* — Oliff & Berridge, PLC

(57) ABSTRACT

Positional information of wafer stages is measured by a plurality of encoder heads, Z heads and the like that a measurement bar placed below surface has, using gratings placed on the lower surface of fine movement stages. Consequently, high-precision measurement of the positional information of the wafer stages can be performed. Further, since a guide surface of the wafer stages is formed by the two guide surface forming members placed side by side via a predetermined clearance, each guide surface forming member is easier to handle and also maintenance of the vicinity of the guide surface forming member is easier to perform, compared with the case where the guide surface forming members are integrated.

113 Claims, 40 Drawing Sheets

U.S. PATENT DOCUMENTS

| | | |
|---|---|---|
| 2004/0211920 A1 | 10/2004 | Derksen et al. |
| 2005/0255624 A1 | 11/2005 | Miyajima |
| 2005/0259234 A1 | 11/2005 | Hirukawa et al. |
| 2007/0201010 A1 | 8/2007 | Shibazaki |
| 2007/0288121 A1 | 12/2007 | Shibazaki |
| 2008/0088843 A1 | 4/2008 | Shibazaki |
| 2008/0094594 A1 | 4/2008 | Shibazaki |
| 2008/0143994 A1 | 6/2008 | Shibazaki |
| 2009/0208885 A1 | 8/2009 | Kiuchi |
| 2009/0233234 A1 | 9/2009 | Shibazaki |
| 2010/0259768 A1 | 10/2010 | Frissen et al. |
| 2010/0321666 A1 | 12/2010 | Shibazaki |

FOREIGN PATENT DOCUMENTS

| | | |
|---|---|---|
| WO | WO 99/49504 A1 | 9/1999 |
| WO | WO 01/35168 A1 | 5/2001 |
| WO | WO 03/065428 A1 | 8/2003 |
| WO | WO 2004/100237 A1 | 11/2004 |
| WO | WO 2004/100237 AI | 11/2004 |
| WO | WO 2006/038952 A2 | 4/2006 |
| WO | WO 2007/083758 A1 | 7/2007 |
| WO | WO 2008/044612 A1 | 4/2008 |
| WO | WO 2008/056735 A1 | 5/2008 |
| WO | WO 2009/050675 A2 | 4/2009 |

OTHER PUBLICATIONS

Written Opinion of International Searching Authority issued in International Application No. PCT/JP2010/060923 Dated Oct. 5, 2011.

U.S. Appl. No. 12/818,644 in the name of Go Ichinose, filed Jun. 18, 2010.

U.S. Appl. No. 12/818,394 in the name of Go Ichinose, filed Jun. 18, 2010.

U.S. Appl. No. 12/818,579 in the name of Go Ichinose, filed Jun. 18, 2010.

U.S. Appl. No. 12/818,276 in the name of Go Ichinose, filed Jun. 18, 2010.

U.S. Appl. No. 12/818,429 in the name of Go Ichinose, filed Jun. 18, 2010.

EXPOSURE APPARATUS, EXPOSURE METHOD AND DEVICE MANUFACTURING METHOD

CROSS-REFERENCE TO RELATED APPLICATIONS

This non-provisional application claims the benefit of Provisional Application No. 61/210,460 filed Jun. 19, 2009, Provisional Application No. 61/213,677 filed Jul. 1, 2009 and Provisional Application No. 61/213,680 filed Jul. 1, 2009, the disclosures of which are hereby incorporated herein by reference in its entirety.

BACKGROUND OF THE INVENTION

1. Field of the Invention

The present invention relates to exposure apparatuses, exposure methods and device manufacturing methods, and more particularly to an exposure apparatus and an exposure method to expose an object with an energy beam via an optical system, and a device manufacturing method that uses the exposure apparatus or the exposure method.

2. Description of the Background Art

Conventionally, in a lithography process for manufacturing electron devices (microdevices) such as semiconductor devices (integrated circuits or the like) or liquid crystal display elements, an exposure apparatus such as a projection exposure apparatus by a step-and-repeat method (a so-called stepper), or a projection exposure apparatus by a step-and-scan method (a so-called scanning stepper (which is also called a scanner)) is mainly used. This type of the projection exposure apparatus has a stage device that holds a substrate such as a wafer or a glass plate (hereinafter, generically referred to as a wafer) and drives the wafer along a predetermined two-dimensional plane.

In order to perform high-precision exposure, the high-precision positional controllability of a stage is required for the stage device, and in order to improve throughput of the exposure operation, higher speed and higher acceleration of the stage are also required. To cope with these requirements, in recent years, a stage device that controls the position of a wafer within a two-dimensional plane using a planar motor by an electromagnetic force drive method has been developed (e.g. refer to U.S. Pat. No. 6,437,463).

The integration degree of the semiconductor devices is gradually increased, and high-precision position controllability of a wafer that is subject to exposure used in a projection exposure apparatus is required, and as the premise, it is required to measure the position of a wafer stage on which the wafer is mounted, with high precision.

Further, for example, in the fifth embodiment of U.S. Patent Application Publication No. 2008/0094594, the exposure apparatus is disclosed in which encoder heads are placed inside a recessed section formed on the upper surface of surface plate. In the exposure apparatus of U.S. Patent Application Publication No. 2008/0094594, positional information of a wafer stage is measured with high precision by making measurement beams be incident on a two-dimensional grating placed on the wafer stage from directly below.

However, if the planar motor in which the wafer stage has a mover and the surface plate has a stator as disclosed in U.S. Pat. No. 6,437,463 is applied to the exposure apparatus in which the encoder heads are placed inside the surface plate as disclosed in the fifth embodiment of U.S. Patent Application Publication No. 2008/0094594, there is a possibility that the measurement accuracy of the encoder system is degraded owing to a reaction force that acts on the surface plate when the wafer stage is driven.

Meanwhile, the wafer increases in size every ten years and a 300 mm-wafer with a diameter of 300 mm is currently mainstream, and now the coming of age of the 450 mm-wafer with a diameter of 450 mm looms near. Consequently, it is certain that a wafer stage on which a wafer is mounted and a surface plate that forms a guide surface used on movement of the wafer stage increase in size, and therefore there is a concern that the maintenance becomes difficult.

SUMMARY OF THE INVENTION

According to a first aspect of the present invention, there is provided a first exposure apparatus that exposes an object with an energy beam via an optical system supported by a first support member, the apparatus comprising: a movable body that is movable along a two-dimensional plane that includes a first axis and a second axis orthogonal to each other, while holding the object; a guide surface forming member which has a first section and a second section that are placed side by side with at least one border line serving as a boundary, within the two-dimensional plane, the first section and the second section forming a guide surface used on movement of the movable body; a second support member that is placed on a side opposite to the optical system via the guide surface forming member so as to be away from the guide surface forming member, and has a positional relation with the first support member maintained in a predetermined relation; and a measurement system which includes a measurement member that irradiates a measurement surface parallel to the two-dimensional plane with a measurement beam and receives light from the measurement surface, and which obtains positional information of the movable body at least within the two-dimensional plane based on an output of the measurement member, the measurement surface being arranged at one of the movable body and the second support member and at least a part of the measurement member being arranged at the other of the movable body and the second support member.

With this apparatus, since the measurement member irradiates the measurement beam on the measurement surface parallel to the two-dimensional plane that is arranged at one of the movable body and the second support member, the influence of fluctuation of the surrounding atmosphere of the movable body and the like can be restrained, and the measurement system measures the positional information of the movable body with high precision. Further, since the measurement member or the measurement surface is placed at the second support member whose positional relation with the first support member is maintained in a predetermined relation, the measurement system measures the positional information of the movable body with high precision, with the position of the optical system serving as a reference. Further, since the guide surface of the movable body is formed by the first section and the second section that are placed side by side with at least one border line serving as a boundary within the two-dimensional plane, the workability at the time of maintenance of the apparatus that is accompanied by movement of the guide surface forming member is improved, compared with the case where the guide surface forming members that form the guide surface are integrated.

According to a second aspect of the present invention, there is provided a second exposure apparatus that exposes an object with an energy beam via an optical system supported by a first support member, the apparatus comprising; a movable body which is movable along a predetermined two-dimensional plane that includes a first axis and a second axis orthogonal to each other, while holding the object, and at which a measurement surface parallel to the two-dimensional plane is arranged; an exposure processing section in which exposure processing of irradiating the object with the energy beam is performed; a measurement processing section which is placed on one side in a direction parallel to the first axis within the two-dimensional plane so as to be away from the exposure processing section and in which measurement processing on the object is performed; a plurality of guide surface forming members which include a first and a second guide surface forming members that are adjacently placed via a predetermined clearance extending in a direction parallel to the second axis between the exposure processing section and the measurement processing section, and which form a guide surface used when the movable body moves along the two-dimensional plane; and a measurement system which has a first measurement member that includes at least a part of an optical system placed below the plurality of guide surface forming members and that has a constant positional relation with the first support member, and which obtains positional information within the two-dimensional plane of the movable body located in the exposure processing section based on an output of the first measurement member, the optical system irradiating the measurement surface of the movable body with a measurement beam from below when the movable body is located in the exposure processing section and receiving light from the measurement surface.

With this apparatus, since the first measurement member irradiates the measurement surface parallel to the two-dimensional plane of the movable body located in the exposure processing section with the measurement beam from below the movable body, the influence of fluctuation of the surrounding atmosphere of the movable body and, the like can be restrained, and the measurement system obtains the positional information of the movable body located in the exposure processing section, with high precision (can measure the position with high precision). Further, since the plurality of guide surface forming members, which form the guide surface used when the movable body moves along the two-dimensional plane, include the first and second guide surface forming members that are adjacently placed via a predetermined clearance extending in the direction parallel to the second axis between the exposure processing section and the measurement processing section, a reaction force accompanies the drive of the movable body located in the vicinity of the measurement processing section is not transmitted to the guide surface forming member on one side of the clearance in the direction parallel to the first axis. Then, using (based on measurement information by the measurement system, or more specifically, the positional information of the movable body measured with high precision, the movable body is driven.

In this specification, the guide surface forming member is to include a member that forms the guide surface that guides the direction orthogonal to the two-dimensional plane of the movable body, and the guide method can be of a contact type or a noncontact type. For example, the guide method of the noncontact type includes a configuration using static gas bearings such as air pads, a configuration using magnetic levitation, and the like. Further, the guide surface is not limited to a configuration in which the movable body is guided following the shape of the guide surface. For example, in the configuration using static gas bearings such as air pads described above, the opposed surface of the guide surface forming member that is opposed to the movable body is finished so as to have a high flatness degree and the movable body is guided in a noncontact manner via a predetermined gap so as to follow the shape of the opposed surface. On the other hand, in the configuration in which while a part of a motor or the like that uses an electromagnetic force is placed at the guide surface forming member, a part of the motor or the like is placed also at the movable body, and a force acting in a direction orthogonal to the two-dimensional plane described above is generated by the guide surface forming member and the movable body cooperating, the position of the movable body is controlled on a predetermined two-dimensional plane by the force. For example, a configuration is also included in which a planar motor is arranged at the guide surface forming member and forces in directions which include two directions orthogonal to each other within the two-dimensional plane and the direction orthogonal to the two-dimensional plane are made to be generated on the movable body and the movable body is levitated in a noncontact manner without arranging the static gas bearings described above.

According to a third aspect of the present invention, there is provided a first exposure method of exposing an object with an energy beam via an optical system supported by a first support member, the method comprising: moving a movable body that is movable along a two-dimensional plane that includes a first axis and a second axis orthogonal to each other, while holding the object, on a guide surface formed by a first section and a second section of a guide surface forming member, the guide surface forming member having the first section and the second section that are placed side by side with at least one border line serving as a boundary, within the two-dimensional plane; and obtaining positional information of the movable body at least within the two-dimensional plane, based on an output of a measurement member that irradiates a measurement surface parallel to the two-dimensional plane with a measurement beam and receives light from the measurement surface, the measurement surface being arranged at one of a second support member that is placed on a side opposite to the optical system via the guide surface forming member so as to be away from the guide surface forming member and having a positional relation with the first support member maintained in a predetermined relation and the movable body, and at least a part of the measurement member being arranged at the other of the second support member and the movable body.

With this method, the influence of fluctuation of the surrounding atmosphere of the movable body and the like can be restrained, and the positional information of the movable body is measured with high precision by the measurement system. Further, the positional information of the movable body with the position of the optical system serving as a reference is measured with high precision by the measurement system. Further, the workability at the time of maintenance of the apparatus that is accompanied by movement of the guide surface forming member is improved, compared with the case where the guide surface forming members that form the guide surface are integrated.

According to a fourth aspect of the present invention, there is provided a second exposure method of exposing an object with an energy beam via an optical system supported by a first support member, the method comprising: moving a movable body that is movable along a two-dimensional plane that includes a first axis and a second axis orthogonal to each other, while holding the object, on a guide surface formed by a plurality of guide surface forming members which include a first and a second guide surface forming members that are adjacently placed via a predetermined clearance extending in a direction parallel to the second axis, between an exposure processing section and a measurement processing section, the exposure processing section being a section in which exposure processing of irradiating the object with the energy beam is performed and the measurement processing section being a section in which measurement processing on the object is performed, and the exposure processing section and the measurement processing section being placed apart in a direction parallel to the first axis within the two-dimensional plane; and obtaining positional information within the two-dimensional plane of the movable body located in the exposure processing section based on an output of a first measurement member that includes at least a part of an optical system placed below the plurality of guide surface forming members and that has a constant positional relation with the first support member, the optical system irradiating a measurement surface arranged at the movable body with a measurement beam from below when the movable body is located in the exposure processing section and receiving light from the measurement surface.

With this method, the first measurement member can restrain the influence of fluctuation of the surrounding atmosphere of the movable body and the like, and the positional information of the movable body located in the exposure processing section can be obtained with high precision by the measurement system (the position can be measured with high precision). Further, a reaction force that accompanies the drive of the movable body located in the vicinity of the measurement processing section is not transmitted to the guide surface forming member on one side of the clearance in the direction parallel to the first axis. Then, using (based on) measurement information by the measurement system, or more specifically, the positional information of the movable body measured with high precision, the movable body is driven.

According to a fifth aspect of the present invention, there is provided a device manufacturing method, comprising: exposing an object using any one of the first and second exposure apparatuses of the present invention and the first and second exposure methods of the present invention; and developing the exposed object.

BRIEF DESCRIPTION OF THE DRAWINGS

In the accompanying drawings;

FIG. 7 is a block diagram used to explain input/output relations of a main controller which the exposure apparatus of FIG. 1 is equipped with;

FIG. 19 is a block diagram used to explain input/output relations of a main controller which the exposure apparatus of FIG. 16 is equipped with;

FIG. 26 is a block diagram used to explain input/output relations of a main controller which the exposure apparatus of the third embodiment is equipped with;

FIG. 32 is a block diagram used to explain input/output relations of a main controller which the exposure apparatus of FIG. 28 is equipped with;

FIG. 39 is a block diagram used to explain input/output relations of a main controller which the exposure apparatus of the fifth embodiment is equipped with.

DESCRIPTION OF THE EMBODIMENTS

First Embodiment

A first embodiment of the present invention is described below, with reference to FIGS. 1 to 15.

Figure 1:
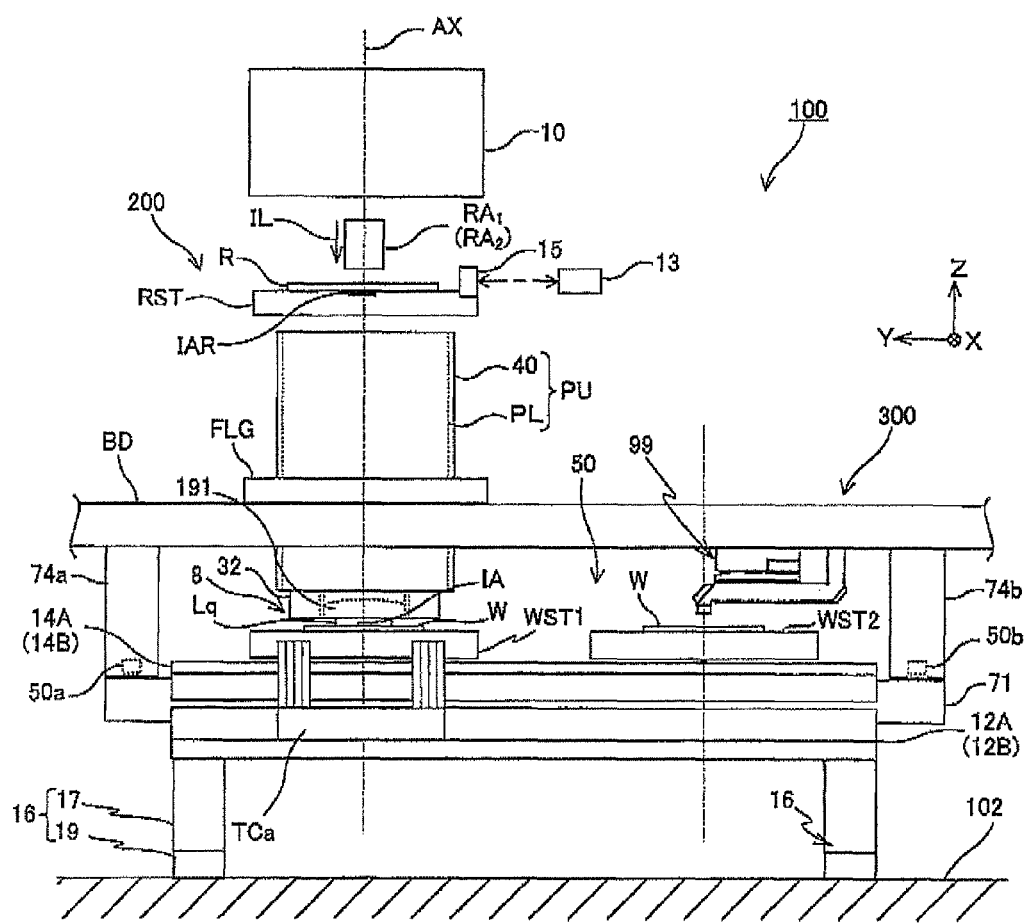
FIG. 1 is a view schematically showing a configuration of an exposure apparatus of a first embodiment.

FIG. 1 schematically shows a configuration of an exposure apparatus 100 related to the first embodiment. Exposure apparatus 100 is a projection exposure apparatus by a step-and-scan method, which is a so-called scanner. As described later on, a projection optical system PL is provided in the present embodiment, and in the description below, the explanation is given assuming that a direction parallel to an optical axis AX of projection optical system PL is a Z-axis direction, a direction in which a reticle and a wafer are relatively scanned within a plane orthogonal to the Z-axis direction is a Y-axis direction, and a direction orthogonal to the Z-axis and the Y-axis is an X-axis direction, and rotational (tilt) directions around the X-axis, Y-axis and Z-axis are θx, θy and θz directions, respectively.

As shown in FIG. 1, exposure apparatus 100 is equipped with an exposure station (exposure processing area) 200 placed in the vicinity of the +Y side end on a pair of base boards 12A and 12B (in FIG. 1, base board 12B hides behind base board 12A in the depth of the page surface), a measurement station (measurement processing area) 300 placed in the vicinity of the −Y side end on the pair of base boards 12A and 12B, a stage device 50 that includes two wafer stages WST1 and WST2, their control system and the like. In FIG. 1, wafer stage WST1 is located in exposure station 200 and a wafer W is held on wafer stage WST1. And, wafer stage WST2 is located in measurement station 300 and another wafer W is held on wafer stage WST2.

Exposure station 200 is equipped with an illuminations system 10, a reticle stage RST, a projection unit PU, a local liquid immersion device 8, and the like.

Illumination system 10 includes: a light source; and an illumination optical system that has an illuminance uniformity optical system including an optical integrator and the like, and a reticle blind and the like (none of which are illustrated), as disclosed in, for example, U.S. Patent Application Publication No. 2003/0025890 and the like. Illumination system 10 illuminates a slit-shaped illumination area TAR, which is defined by the reticle blind (which is also referred to as a masking system), on reticle R with illumination light (exposure light) IL with substantially uniform illuminance. As illumination light IL, ArF excimer laser light (wavelength: 193 nm) is used as an example.

On reticle stage RST, reticle R having a pattern surface (the lower surface in FIG. 1) on which a circuit pattern and the like are formed is fixed by, for example, vacuum adsorption. Reticle stage RET can be driven with a predetermined stroke at a predetermined scanning speed in a scanning direction (which is the Y-axis direction being a lateral direction of the page surface of FIG. 1) and can also be finely driven in the X-axis direction, with a reticle stage driving system 11 (not illustrated in FIG. 1, see FIG. 7) including, for example, a linear motor or the like.

Positional information within the XY plane (including rotational information in the $θz$ direction) of reticle stage RET is constantly detected at a resolution of, for example, around 0.25 nm with a reticle laser interferometer (hereinafter, referred to as a "reticle interferometer") 13 via a movable mirror 15 fixed to reticle stage RST (actually, a Y movable mirror (or a retroreflector) that has a reflection surface orthogonal to the Y-axis direction and an X movable mirror that has a reflection surface orthogonal to the X-axis direction are arranged). The measurement values of reticle interferometer 13 are sent to a main controller 20 (not illustrated in FIG. 1, see FIG. 7). Incidentally, as disclosed in, for example, PCT international Publication No. 2007/083758 (the corresponding U.S. Patent Application Publication No. 2007/0288121) and the like, the positional information of reticle stage RST can be measured by an encoder system.

Above reticle stage RST, a pair of reticle alignment systems $RA_1$ and $RA_2$ by an image processing method, each of which has an imaging device such as a CCD and uses light with an exposure wavelength (illumination light IL in the present embodiment) as alignment illumination light, are placed (in FIG. 1, reticle alignment system $RA_2$ hides behind reticle, alignment system $RA_1$ in the depth of the page surface), as disclosed in detail in, for example, U.S. Pat. No. 5,646,413 and the like. Main controller 20 detects projected images of a pair of reticle alignment marks (the illustration is omitted) formed on reticle R and a pair of first fiducial marks on a measurement plate, which is described later, on fine movement stage WFS1 (or WFS2), that correspond to the reticle alignment marks via projection optical system PL in a state where the measurement plate is located directly under projection optical system PL, and the pair of reticle alignment systems $RA_1$ and $RA_2$ are used to detect a positional relation between the center of a projection area of a pattern of reticle R by projection optical system PL and a fiducial position on the measurement plate, i.e. the center of the pair of the first fiducial marks, according to such detection performed by main controller 20 The detection signals of reticle alignment systems $RA_1$ and $RA_2$ are supplied to main controller 20 (see FIG. 7) via a signal processing system that is not illustrated. Incidentally, reticle alignment systems $RA_1$ and $RA_2$ do not have to be arranged. In such a case, it is preferable that a detection system that has a light-transmitting section (photo-detection section) arranged at a fine movement stage, which is described later on, is installed so as to detect projected images of the reticle alignment marks, as disclosed in, for example, U.S. Patent Application Publication No. 2002/0041377 and the like.

Projection unit PU is placed below reticle stage RST in FIG. 1. Projection unit PU is supported, via a flange section FLG that is fixed to the outer periphery of projection unit PU, by a main frame (which is also referred to as a metrology frame) BD that is horizontally supported by a support member that is not illustrated. Main frame BD can be configured such that vibration from the outside is not transmitted to the main frame or the main frame does not transmit vibration to the outside, by arranging a vibration isolating device or the like at the support member. Projection unit PU includes a barrel 40 and projection optical system PL held within barrel 40. As projection optical system PL, for example, a dioptric system that is composed of a plurality of optical elements (lens elements) that are disposed along optical axis AX parallel to the Z-axis direction is used. Projection optical system PL is, for example, both-side telecentric and has a predetermined projection magnification (e.g. one-quarter, one-fifth, one-eighth times, or the like). Therefore, when illumination area IAR on reticle R is illuminated with illumination light IL from illumination system 10, illumination light IL passes through reticle R whose pattern surface is placed substantially coincident with a first plane (object plane) of projection optical system PL. Then, a reduced image of a circuit pattern (a reduced image of a part of a circuit pattern) of reticle R within illumination area TAR is formed in an area (hereinafter, also referred to as an exposure area) IA that is conjugate to illumination area TAR described above on wafer W, which is placed on the second plane (image plane) side of projection optical system PL and whose surface is coated with a resist (sensitive agent), via projection optical system PL (projection unit PU). Then, by moving reticle R relative to illumination area TAR (illumination light IL) in the scanning direction (Y-axis direction) and also moving wafer W relative to exposure area IA (illumination light IL) in the scanning direction (Y-axis direction) by synchronous drive of reticle stage RST and wafer stage WST1 (or WST2), scanning exposure of one shot area (divided area) on wafer W is performed. Accordingly, a pattern of reticle R is transferred onto the shot area. More specifically, in the present embodiment, a pattern of reticle R is generated on wafer W by illumination system 10 and projection optical system PL, and the pattern is formed on wafer W by exposure of a sensitive layer (resist layer) on wafer W with illumination light IL. In this case, projection unit PU is held by main frame BD, and in the embodiment, main frame BD is substantially horizontally supported by a plurality (e.g. three or four) of support members placed on an installation surface (such as a floor surface) each via a vibration isolating mechanism. Incidentally, the vibration isolating mechanism can be placed between each of the support members and main frame BD. Further, as disclosed in, for example, PCT International Publication No. 2006/038952, main frame BD (projection unit PU) can be supported in a suspended manner by a main frame member (not illustrated) placed above projection unit PU or a reticle base or the like.

Local liquid immersion device 8 includes a liquid supply device 5, a liquid recovery device 6 (none of which are illustrated in FIG. 1, see FIG. 7), and a nozzle unit 32 and the like. As shown in FIG. 1, nozzle unit 32 is supported in a suspended manner by main frame BD that supports projection unit FU and the like, via a support member that is not illustrated, so as to enclose the periphery of the lower end of barrel 40 that holds an optical element closest to the image plane side (wafer W side) that configures projection optical system PL, which is a lens (hereinafter, also referred to as a "tip lens") 191 in this case. Nozzle unit 32 is equipped with a supply opening and a recovery opening of a liquid Lq, a lower surface to which wafer W is placed so as to be opposed and at which the recovery opening is arranged, and a supply flow channel and a recovery flow channel that are respectively connected to a liquid supply pipe 31A and a liquid recovery pipe 31B (none of which are illustrated in FIG. 1, see FIG. 2). One end of a supply pipe (not illustrated) is connected to liquid supply pipe 31A, while the other end of the supply pipe is connected to liquid supply device 5, and one end of a recovery pipe (not illustrated) is connected to liquid recovery pipe 31B, while the other end of the recovery pipe is connected to liquid recovery device 6.

In the present embodiment, main controller 20 controls liquid supply device 5 (see FIG. 7) to supply the liquid to the space between tip lens 191 and wafer W and also controls liquid recovery device 6 (see FIG. 7) to recover the liquid from the space between tip lens 191 and wafer W. On this operation, main controller 20 controls the quantity of the supplied liquid and the quantity of the recovered liquid in order to hold a constant quantity of liquid Lq (see FIG. 1) while constantly replacing the liquid in the space between tip lens 191 and wafer W. In the embodiment, as the liquid described above, a pure water (with a refractive index n≈1.44) that transmits the ArF excimer laser light (the light with a wavelength of 193 nm) is to be used.

Figure 2:
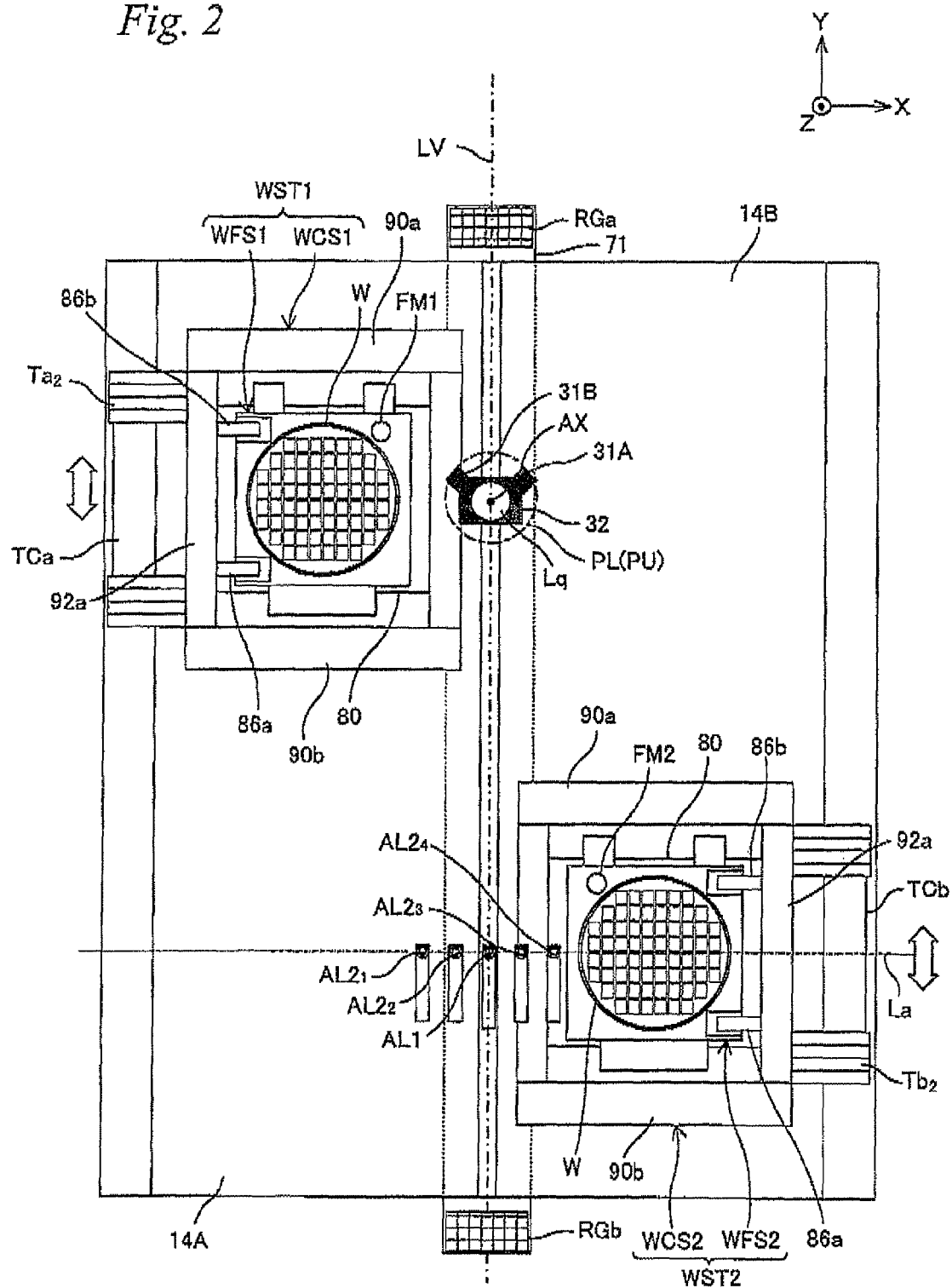
FIG. 2 is a plan view of the exposure apparatus of FIG. 1.

Measurement station 300 is equipped with an alignment device 99 arranged at main frame BD. Alignment device 99 includes five alignment systems AL1 and $AL2_1$ to $AL2_4$ shown in FIG. 2, as disclosed in, for example, U.S. Patent Application Publication No. 2008/0088843 and the like. To be more specific, as shown in FIG. 2, a primary alignment system AL1 is placed in a state where its detection center is located at a position a predetermined distance apart on the −Y side from optical axis AX, on a straight line (hereinafter, referred to as a reference axis) LV that passes through the center of projection unit PU (which is optical axis AX of projection optical system PL, and in the present embodiment, which also coincides with the center of exposure area IA described previously) and is parallel to the Y-axis. On one side and the other side in the X-axis direction with primary alignment system AL1 in between, secondary alignment systems $AL2_1$ and $AL2_2$, and $AL2_3$ and $AL2_4$, whose detection centers are substantially symmetrically placed with respect to reference axis LV, are arranged respectively. More specifically, the detection centers of the five alignment systems AL1 and $AL2_1$ to $AL2_4$ are placed along a straight line (hereinafter, referred to as a reference axis) La that vertically intersects reference axis LV at the detection center of primary alignment system AL1 and is parallel to the X-axis. Note that a configuration including the five alignment systems AL1 and $AL2_1$ to $AL2_4$ and a holding device (slider) that holds these alignment systems is shown as alignment device 99 in FIG. 1. As disclosed in, for example, U.S. Patent Application Publication No. 2009/0233234 and the like, secondary alignment systems $AL2_1$ to $AL2_4$ are fixed to the lower surface of main frame BD via the movable slider (see FIG. 1), and the relative positions of the detection areas of the secondary alignment systems are adjustable at least in the X-axis direction with a drive mechanism that is not illustrated.

In the present embodiment, as each of alignment systems AL1 and $AL2_1$ to $AL2_4$, for example, an FIA (Field Image Alignment) system by an image processing method is used. The configurations of alignment systems AL1 and $AL2_1$ to AL2$_4$ are disclosed in detail in, for example, PCT International Publication No. 2008/056735 and the like. The imaging signal from each of alignment systems AL1 and AL2$_1$ to AL2$_4$ is supplied to main controller 20 (see FIG. 7) via a signal processing system that is not illustrated.

Note that exposure apparatus 100 has a first loading position where a carriage operation of a wafer is performed with respect to wafer stage WST1 and a second loading position where a carriage operation of a wafer is performed with respect to wafer stage WST2, although the loading positions are not illustrated. In the case of the present embodiment, the first loading position is arranged on the surface plate 14A side and the second loading position is arranged on the surface plate 14B side.

As shown in FIG. 1, stage device 50 is equipped with the pair of base boards 12A and 12S (in FIG. 1, base board 12B hides behind base board 12A in the depth of the page surface), a pair of surface plates 14A and 14B (in FIG. 1, surface plate 14B hides behind surface plate 14A in the depth of the page surface) placed respectively above base boards 12A and 12S, the two wafer stages WST1 and WST2 that move on a guide surface parallel to the XY plane that is set by the upper surfaces of the pair of surface plates 14A and 14B, tube carriers TCa and TCb (tube carrier TCb is not illustrated in FIG. 1, see the drawings such as FIGS. 2 and 3A) that are respectively connected to wafer stages WST1 and WST2 via piping/wiring systems (hereinafter, referred to as tubes for the sake of convenience) Ta$_2$ and Tb$_2$ (not illustrated in FIG. 1, see FIGS. 2 and 3A), a measurement system that measures positional information of wafer stages WST1 and WST2, and the like. The electric power for various types of sensors and actuators such as motors, the coolant for temperature adjustment to the actuators, the pressurized air for air bearings, and the like are supplied from the outside to wafer stages WST1 and WST2 via tubes Ta$_2$ and Tb$_2$, respectively. Note that, in the description below, the electric power, the coolant for temperature adjustment, the pressurized air and the like are also referred to as the power usage collectively. In the case where a vacuum suction force is necessary, the force for vacuum (negative pressure) is also included in the power usage.

Figure 3A:
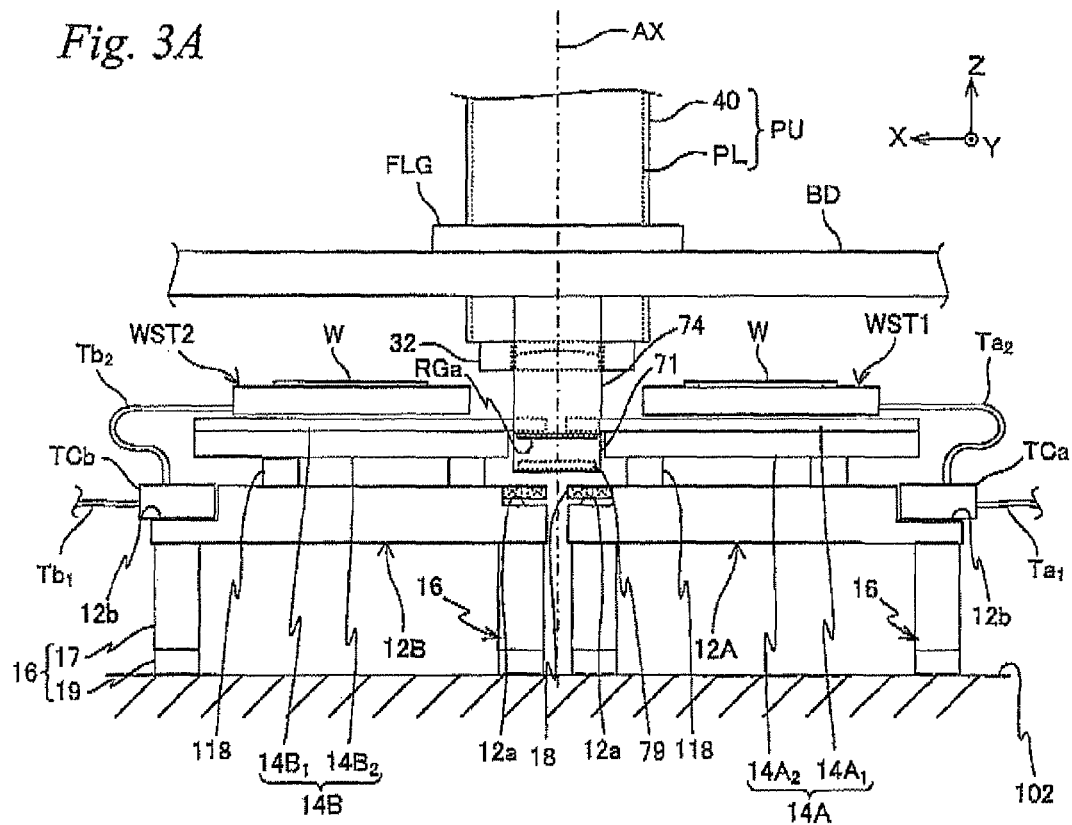
FIG. 3A is a side view of the exposure apparatus of FIG. 1 when viewed from the +Y side.

As can be seen from the drawings such as FIGS. 1 and 3A, base boards 12A and 12B are similarly configured, while being symmetric with respect to the Y-axis (reference axis LV). Consequently, in the description below, base board 12A is representatively described, and the description related to base board 12B is made only when such description is especially needed.

Base boards 12A and 12B are each made up of a member having a roughly tabular outer shape, and as shown in FIG. 3A, are placed in a bilaterally-symmetric placement with respect to reference axis LV with a very narrow gap therebetween in the X-axis direction, substantially horizontally (parallel to the XY plane) above a floor surface 102.

Each of base boards 12A and 12B is substantially horizontally supported by a plurality, e.g., four of support sections 16 on floor surface 102. Each of support sections 16 includes an extendible/contractible mount member 17 and a hover member 19 that supports mount member 17. Mount member 17 includes an air mount into which a gas can be supplied. The length of mount member 17 in the Z-axis direction can be adjusted according to a quantity of the gas filled in the air mount. Hover member 19 has an air hover that is similar to an air hover equipped in a hover mechanism to be described later on.

Figure 36:
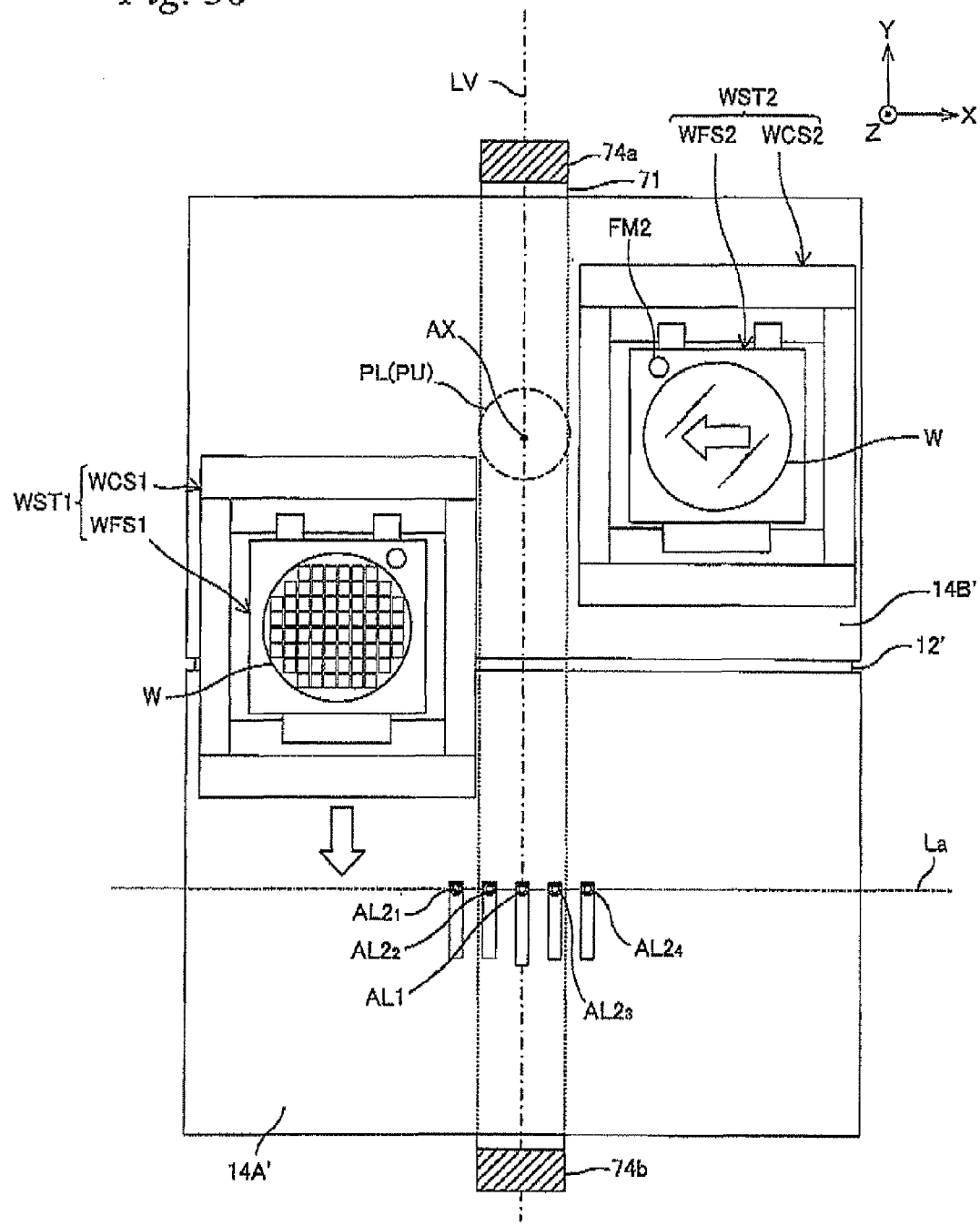
FIG. 36 is a view showing a state where a wafer stage located in the exposure station is replaced from wafer stage WST1 to wafer stage WST2 in the exposure apparatus of the fourth embodiment.

At both ends in the X-axis direction of the upper surface of base board 12A, stepped sections 12a and 12b each extending in a direction parallel to the Y-axis are formed, as shown in FIG. 3A. Stepped section 12b on the −X side is slightly lower (the level difference from the upper surface of the base board is greater) than stepped section 12a on the +X side. On stepped section 12a of base board 12A, as shown in FIGS. 3A and 36, a coil unit 18 including a plurality of coils is fixed in a state forming substantially the same surface as the other sections of base board 12A. Coil unit 18 includes the plurality of coils placed in a matrix shape with the XY two-dimensional directions serving as a row direction and a column direction. The magnitude and direction of the electric current supplied to each of the plurality of coils that configure coil unit 18 are controlled by main controller 20 (see FIG. 7).

As shown in FIG. 2, surface plates 14A and 14B are each made up of a rectangular plate-shaped member whose longitudinal direction is in the Y-axis direction in a planar view (when viewed from above) and are respectively placed on base board 12A and 12B. Surface plate 14A and surface plate 14B are placed with a very narrow gap therebetween in the X-axis direction, symmetric with respect to reference axis LV. By finishing the upper surface (the +Z side surface) of each of surface plates 14A and 14B such that the upper surface has a very high flatness degree, it is possible to make the upper surfaces function as the guide surface with respect to the Z-axis direction used when each of wafer stages WST1 and WST2 moves following the XY plane. Alternatively, a configuration can be employed in which a force in the Z-axis direction is made to act on wafer stages WST1 and WST2 by planar motors, which are described later on, to magnetically levitate wafer stages WST1 and WST2 above surface plates 14A and 14B. In the case of the present embodiment, the configuration that uses the planar motors is employed and static gas bearings are not used, and therefore, the flatness degree of the upper surfaces of surface plates 14A and 14B does not have to be so high as in the above description.

As shown in FIG. 3A, surface plates 14A and 14B are horizontally supported on base boards 12A and 12B, respectively, via a plurality of levitation/elevating mechanisms 118. The configuration and the like of levitation/elevating mechanisms 118 are described later on.

Surface plates 14A and 14B respectively have first sections 14A$_1$ and 14B$_1$ each having a relatively thin plate shape on the upper surface of which the guide surface is formed, and second sections 14A$_2$ and 14B$_2$ each having a relatively thick plate shape and being short in the X-axis direction that are integrally fixed to the lower surfaces of first sections 14A$_1$ and 14B$_1$, respectively. The end on the +X side of first section 14A$_1$ of surface plate 14A slightly overhangs, to the +X side, the end surface on the +X side of second section 14A$_2$, and the end on the −X side of first section 14B$_1$ of surface plate 148 slightly overhangs, to the −X side, the end surface on the −X side of second section 14B$_2$. However, the configuration is not limited to the above-described one, and a configuration can be employed in which the overhangs are not arranged.

Inside each of first sections 14A$_1$ and 14B$_1$, a coil unit (the illustration is omitted) is housed that includes a plurality of coils placed in a matrix shape with the XY two-dimensional directions serving as a row direction and a column direction. The magnitude and direction of the electric current supplied to each of the plurality of coils that configure each of the coil units are controlled by main controller 20 (see FIG. 7).

Figure 4A:
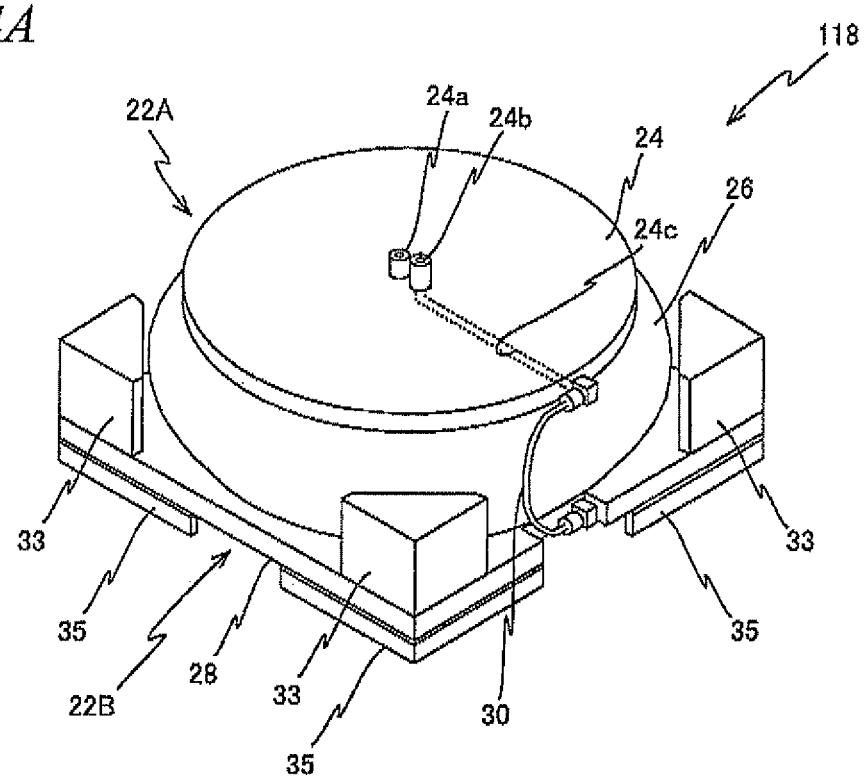
FIGS. 4A and 4B are perspective views showing a levitation/elevating mechanism.
Figure 4B:
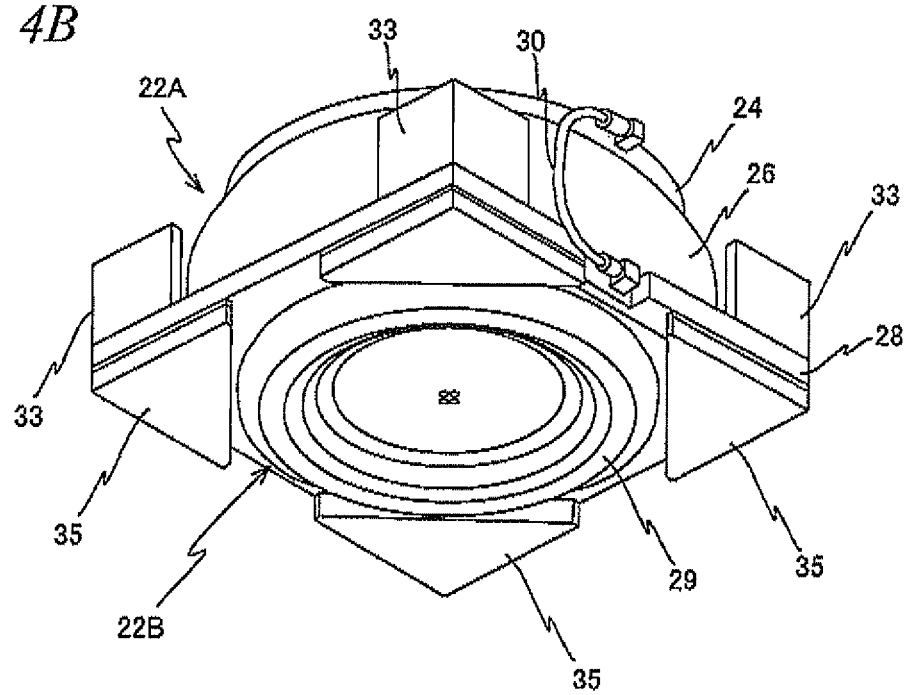

Now, the configuration and the like of levitation/elevating mechanism 118 are described. As shown in FIG. 4A, levitation/elevating mechanism 118 includes an air spring mechanism 22A and a hover mechanism 22B. Air spring mechanism 22A has a discoidal plate-shaped member 24 and an air amount 26 arranged on the lower side of plated-shaped member 24, and the upper surface of plate-shaped member 24 is fixed to the lower surface of surface plate 14A or 148 (see FIG. 3A). A gas can be supplied to air mount 26 via a first gas supplying port 24a arranged at plate-shaped member 24, and the width in the Z-axis direction (width in the height direction) can be adjusted according to the quantity of the gas filled in air amount 26.

As shown in FIG. 48, hover mechanism 22B includes a base 28 that supports air amount 26 from the lower side, and an air hover 29 arranged on the lower surface (the surface on the −Z side) of base 28. To air hover 29, a pressurized gas can be supplied via a second gas supplying port 24b arranged at plate-shaped member 24 and a duct 24c formed in plate-shaped member 24 shown in FIG. 4A, and a piping 30 that couples duct 24c and base 28, and when the pressurized gas is blown out from air hover 29 to the upper surface of base board 12A or 12B, a predetermined interval is formed between air hover 29 and base board 12A or 12B by the blowout force.

Further, to each of four corner portions on the lower surface of base 28, a hover contact prevention member 35 having a triangle shape in a planar view (when viewed from the −Z direction) is fixed. The width (height) in the height direction (Z-axis direction) of this hover contact prevention member 35 is set greater than the width (height) in the height direction (Z-axis direction) of air hover 29. Accordingly, even in the case where the pressurized gas is not blown out from air hover 29, the lower surface of air hover 29 and the upper surface of base board 12A or 12B are maintained in a noncontact state.

Further, at each of four corner portions on the upper surface of base 28, a column member 33 is arranged (in FIGS. 4A and 4D, the column member located in the depth is not illustrated). Column member 33 is a member that supports the empty weight of surface plate 14A or 14B, instead of air mount 26, by coming in contact with the lower surface of surface plate 14A and 14B when the gas inside air amount 26 is decreased.

Levitation/elevating mechanisms 118 configured as described above make transition between four states as below.

A first state is a state where air mount 26 is filled with the gas and the pressurized gas is not supplied to air hover 29. In this first state, hover contact prevention members 35 are in contact with the upper surface of base board 12A or 12B (hereinafter, this state is referred to as a "landing state"), while column members 33 are not in contact with the lower surface of surface plate 14A or 14B (hereinafter, this state is referred to as an "ascending state").

Further, a second state is a state where the gas inside air amount 26 is decreased and the pressurized gas is not supplied to air hover 29. In this second state, hover contact prevention members 35 are in the landing state described above, while column members 33 are in a state in contact with surface plate 14A or 14B (hereinafter, this state is referred to as a "descending state").

Further, a third state is a state where the gas inside air amount 26 is decreased and the pressurized gas is supplied to air hover 29. In this third state, hover contact prevention members 35 are noncontact with base board 12A or 12B (hereinafter, this state is referred to as a "levitating state"), while column members 33 are in the descending state described above.

Further, a fourth state is a state where air mount 26 is filled with the gas and the pressurized gas is supplied to air hover 29. In this fourth state, air spring mechanism 22A is in the ascending state described above and hover mechanism 22B is in the levitating state described above.

Note that during the operation of the exposure apparatus (such as during exposure), levitation/elevating mechanisms 118 are maintained in the fourth state.

In the embodiment, in the fourth state described above, surface plates 14A and 14B are supported by levitation (supported in a noncontact manner) above base boards 12A and 12B by the plurality of levitation/elevating mechanisms 118 described above, and function as so-called son movement of wafer stages WST1 and WST2. Furthermore, surface plate driving systems 60A and 60B (not illustrated in the drawings such as FIGS. 1 and 3A, see FIG. 7) configured of, for example, voice coil motors or the like that drive surface plates 14A and 14B in directions of three degrees of freedom (X, Y, θz) within the XY plane are arranged.

Positional information of surface plates 14A and 14B in the directions of three degrees of freedom is obtained (measured) independently from each other by a surface plate position measuring system 69A and a surface plate position measuring system 69B (see FIG. 7), respectively, which each include, for example, an encoder system. The output of each of surface plate position measuring systems 69A and 69B is supplied to main controller 20 (see FIG. 7). Main controller 20 controls surface plate driving systems 60A and 60B, using (based on) the outputs of surface plate position measuring systems 69A and 69B to control the respective positions of surface plates 14A and 14B in the directions of three degrees of freedom within the XY plane, as needed. Main controller 20 drives surface plates 14A and 14B via surface plate driving systems 60A and 60B using (based on) the outputs of surface plate position measuring systems 69A and 69B to return surface plates 14A and 14B to the reference position of the surface plates such that the movement distance of surface plates 14A and 14B from the reference position falls within a predetermined range, when surface plates 14A and 14B function as the countermasses to be described later on. More specifically, surface plate driving systems 60A and 603 are used for the purpose similar to that of trim motors.

While the configuration of surface plate position measuring systems 69A and 69B is not especially limited, an encoder system can be used in which, for example, encoder heads, which obtain (measure) positional information of the respective surface plates 14A and 14B in the directions of three degrees of freedom within the XY plane by irradiating measurement beams on scales (e.g. two-dimensional gratings) placed on the lower surfaces of second sections $14A_2$ and $14B_2$ respectively and using reflected light (diffraction light from the two-dimensional gratings) obtained by the irradiation, are placed at base boards 12A and 12B (or the encoder heads are placed at second sections $14A_2$ and $14B_2$ and the scales are placed at base boards 12A and 12B, respectively). Incidentally, it is also possible to obtain (measure) the positional information of surface plates 14A and 14B by, for example, an optical interferometer system or a measurement system that is a combination of an optical interferometer system and an encoder system.

One of the wafer stages, wafer stage WST1 is equipped with a fine movement stage (which is also referred to as a table) WFS1 that holds wafer W and a coarse movement stage WCS1 having a rectangular frame shape that encloses the periphery of fine movement stage WFS1, as shown in FIG. 2. The other of the wafer stages, wafer stage WST2 is equipped with a fine movement stage WFS2 that holds wafer W and a coarse movement stage WCS2 having a rectangular frame shape that encloses the periphery of fine movement stage WFS2, as shown in FIG. 2. As is obvious from FIG. 2, wafer stage WST2 has completely the same configuration including the drive system, the position measuring system and the like, as wafer stage WST1 except that wafer stage WST2 is placed in a state laterally reversed with respect to wafer stage WST1. Consequently, in the description below, wafer stage WST1 is representatively focused on and described, and wafer stage WST2 is described only in the case where such description is especially needed.

Figure 5A:
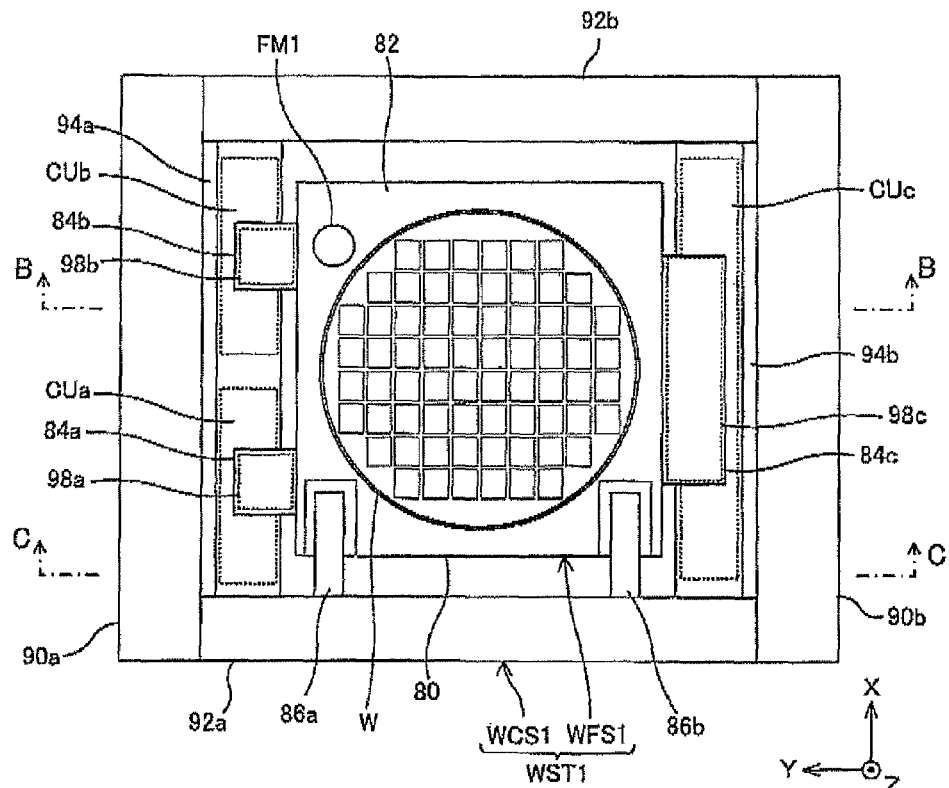
FIG. 5A is a plan view of a wafer stage WST1 which the exposure apparatus is equipped with, FIG. 5B is an end view of the cross section taken along the line B-B of FIG. 5A.

As shown in FIG. 5A, coarse movement stage WCS1 has a pair of coarse movement slider sections 90$a$ and 90$b$ which are placed parallel to each other, spaced apart in the Y-axis direction, and each of which is made up of a rectangular parallelepiped member whose longitudinal direction is in the X-axis direction, and a pair of coupling members 92$a$ and 92$b$ each of which is made up of a rectangular parallelepiped member whose longitudinal direction is in the Y-axis direction, and which couple the pair of coarse movement slider sections 90$a$ and 90$b$ with one ends and the other ends thereof in the Y-axis direction. More specifically, coarse movement stage WCS1 is formed into a rectangular frame shape with a rectangular opening section, in its center portion, that penetrates in the Z-axis direction.

Figure 5B:
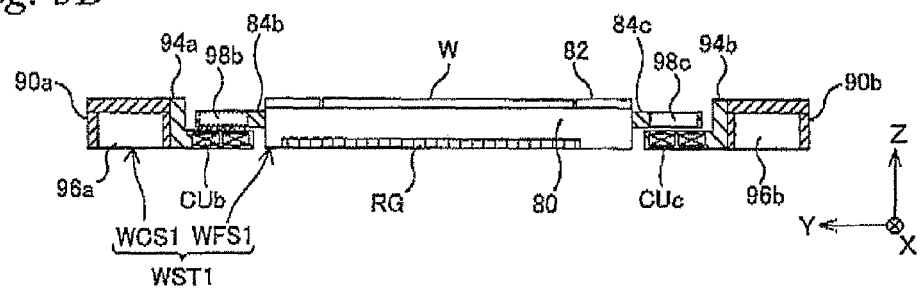
FIG. 5C is an end view of the cross section taken along the line C-C of FIG. 5A.
Figure 5C:
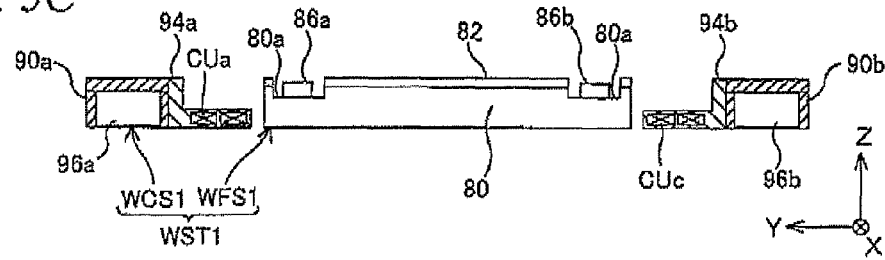

Inside (on the bottom portions of) coarse movement slider sections 90$a$ and 90$b$, as shown in FIGS. 5B and 5C, magnetic units 96$a$ and 96$b$ are housed respectively. Magnetic units 96$a$ and 96$b$ correspond to the coil units housed inside first sections 14A$_1$ and 14B$_1$ of surface plates 14A and 14B, respectively, and are each made of up a plurality of permanent magnets placed in a matrix shape with the XY two-dimensional directions serving as a row direction and a column direction. Magnetic units 96$a$ and 96$b$ configure, together with the coil units of surface plates 14A and 14B, a coarse movement stage driving system 62A (see FIG. 7) that is made up of a planar motor by the electromagnetic force (Lorentz force) drive method that is capable of generating drive forces in the directions of six degrees of freedom to coarse movement stage WCS1, which is disclosed in, for example, U.S. Patent Application Publication No. 2003/0085676 and the like. Further, similar thereto, magnetic units, which coarse movement stage WCS2 (see FIG. 2) of wafer stage WST2 has, and the coil units of surface plates 14A and 14B configure a coarse movement stage driving system 62B (see FIG. 7) made up of a planar motor. In this case, since a force in the Z-axis direction acts on coarse movement stage WCS1 (or WCS2), the coarse movement stage is magnetically levitated above surface plates 14A and 14B. Therefore, it is not necessary to use static gas bearings for which relatively high machining accuracy is required, and thus it becomes unnecessary to increase the flatness degree of the upper surfaces of surface plates 14A and 14B.

Incidentally, while coarse movement stages WCS1 and WCS2 of the present embodiment have the configuration in which only coarse movement slider sections 90$a$ and 90$b$ have the magnetic units of the planar motors, this is not intended to be limiting, and the magnetic unit can be placed also at coupling members 92$a$ and 92$b$. Further, the actuators to drive coarse movement stages WCS1 and WCS2 are not limited to the planar motors by the electromagnetic force (Lorentz force) drive method, but for example, planar motors by a variable magnetoresistance drive method or the like can be used. Further, the drive directions of coarse movement stages WCS1 and WCS2 are not limited to the directions of six degrees of freedom, but can be, for example, only directions of three degrees of freedom (X, Y, θz) within the XY plane. In this case, coarse movement stages WCS1 and WCS2 should be levitated above surface plates 14A and 14B, for example, using static gas bearings (e.g. air bearings). Further, in the present embodiment, while the planar motor of a moving magnet type is used as each of coarse movement stage driving systems 62A and 62B, this is not intended to be limiting, and a planar motor of a moving coil type in which the magnetic unit is placed at the surface plate and the coil unit is placed at the coarse movement stage can also be used.

On the side surface on the −Y side of coarse movement slider section 90$a$ and on the side surface on the +Y side of coarse movement slider section 90$b$, guide members 94$a$ and 94$b$ that function as a guide used when fine movement stage WFS1 is finely driven are respectively fixed. As shown, in FIG. 5B, guide member 94$a$ is made up of a member having an L-like sectional shape arranged extending in the X-axis direction and its lower surface is placed flush with the lower surface of coarse movement slider section 90$a$. Guide member 94$b$ is configured and placed similar to guide member 94$a$, although guide member 94$b$ is bilaterally symmetric to guide member 94$a$.

Inside (on the bottom surface of) guide member 94$a$, a pair of coil units CUa and CUb, each of which includes a plurality of coils placed in a matrix shape with the XY two-dimensional directions serving as a row direction and a column direction, are housed at a predetermined distance in the X-axis direction (see FIG. 5A). Meanwhile, inside (on the bottom portion of) guide member 94$b$, one coil unit CUc, which includes a plurality of coils placed in a matrix shape with the XY two-dimensional directions serving as a row direction and a column direction, is housed (see FIG. 5A). The magnitude and direction of the electric current supplied to each of the coils that configure coil units CUa to CUc are controlled by main controller 20 (see FIG. 7).

Coupling members 92$a$ and 92$b$ are formed to be hollow, and piping members, wiring members and the like, which are not illustrated, used to supply the power usage to fine movement stage WFS1 are housed inside. Inside coupling members 92$a$ and/or 92$b$, various types of optical members (e.g. an aerial image measuring instrument, an uneven illuminance measuring instrument, an illuminance monitor, a wavefront aberration measuring instrument, and the like) can be housed.

In this case, when wafer stage WST1 is driven with acceleration/deceleration in the Y-axis direction on surface plate 14A, by the planar motor that configures coarse movement stage driving system 62A (e.g. when wafer stage WST1 moves between exposure station 200 and measurement station 300), surface plate 14A is driven in a direction opposite to wafer stage WST1 according to the so-called law of action and reaction (the law of conservation of momentum) owing to the action of a reaction force by the drive of wafer stage WST1. Further, it is also possible to make a state where the law of action and reaction described above does not hold, by generating a drive force in the Y-axis direction with surface plate driving system 60A.

Further, when wafer stage WST 2 is driven in the Y-axis direction on surface plate 14B, surface plate 14B is also driven in a direction opposite to wafer stage WST2 according to the so-called law of action and reaction (the law of conservation of momentum) owing to the action of a reaction force of a drive force of wafer stage WST2. More specifically, surface plates 14A and 14B function as the countermasses and the momentum of a system composed of wafer stages WST1 and WST2 and surface plates 14A and 14B as a whole is conserved and movement of the center of gravity does not occur. Consequently, any inconveniences do not arise such as the uneven loading acting on surface plates 14A and 14B owing to the movement of wafer stages WST1 and WST2 in the Y-axis direction. Incidentally, regarding wafer stage WST2 as well, it is possible to make a state where the law of action and reaction described above does not hold, by generating a drive force in the Y-axis direction with surface plate driving system 60B.

Further, by the action of a reaction force of a drive force in the X-axis direction of wafer stages WST1 and WST2, surface plates 14A and 14B function as the countermasses.

As shown in FIGS. 5A and 5B, fine movement stage WFS1 is equipped with a main section 80 made up of a member having a rectangular shape in a planar view, a pair of fine movement slider sections 84a and 84b fixed to the side surface on the +Y side of main section 80, and a fine movement slider section 84c fixed to the side surface on the −Y side of main section 80.

Main section 80 is formed by a material with a relatively small coefficient of thermal expansion, e.g., ceramics, glass or the like, and is supported by coarse movement stage WCS1 in a noncontact manner in a state where the bottom surface of the main section is located flush with the bottom surface of coarse movement stage WCS1. Main section 80 can be hollowed for reduction in weight. Incidentally, the bottom surface of main section 80 does not necessarily have to be flush with the bottom surface of coarse movement stage WCS1.

In the center of the upper surface of main section 80, a wafer holder (not illustrated) that holds wafer W by vacuum adsorption or the like is placed. In the embodiment, the wafer holder by a so-called pin chuck method is used in which a plurality of support sections (pin members) that support wafer W are formed, for example, within an annular protruding section (rim section), and the wafer holder, whose one surface (front surface) serves as a wafer mounting surface, has a two-dimensional grating RG to be described later and the like arranged on the other surface (back surface) side. Incidentally, the wafer holder can be formed integrally with fine movement stage WFS1 (main section 80), or can be fixed to main section 80 so as to be detachable via, for example, a holding mechanism such as an electrostatic chuck mechanism or a clamp mechanism. In this case, grating RG is to be arranged on the back surface side of main section 80. Further, the wafer holder can be fixed to main section 80 by an adhesive agent or the like. On the upper surface of main section 80, as shown in FIG. 5A, a plate (liquid-repellent plate) 82, in the center of which a circular opening that is slightly larger than wafer W (wafer holder) is formed and which has a rectangular outer shape (contour) that corresponds to main section 80, is attached on the outer side of the wafer holder (mounting area of wafer W). The liquid-repellent treatment against liquid Lq is applied to the surface of plate 82 (the liquid-repellent surface is formed). In the embodiment, the surface of plate 82 includes a base material made up of metal, ceramics, glass or the like, and a film of liquid-repellent material formed on the surface of the base material. The liquid-repellent material includes, for example, PFA (Tetra fluoro ethylene-perfluoro alkylvinyl ether copolymer), PTFE (Poly tetra fluoro ethylene), Teflon (registered trademark) or the like. Incidentally, the material that forms the film can be an acrylic-type resin or a silicon-series resin. Further, the entire plate 82 can be formed with at least one of the PFA, PTFE, Teflon (registered trademark), acrylic-type resin and silicon-series resin. In the present embodiment, the contact angle of the upper surface of plate 82 with respect to liquid Lq is, for example, more than or equal to 90 degrees. On the surface of coupling member 92b described previously as well, the similar liquid-repellent treatment is applied.

Plate 82 is fixed to the upper surface of main section 80 such that the entire surface (or a part of the surface) of plate 82 is flush with the surface of wafer W. Further, the surfaces of plate 82 and wafer W are located substantially flush with the surface of coupling member 92b described previously. Further, in the vicinity of a corner on the +X side located on the +Y side of plate 82, a circular opening is formed, and a measurement plate FM1 is placed in the opening without any gap therebetween in a state substantially flush with the surface of wafer W. On the upper surface of measurement plate FM1, the pair of first fiducial marks to be respectively detected by the pair of reticle alignment systems $RA_1$ and $RA_2$ (see FIGS. 1 and 7) described earlier and a second fiducial mark to be detected by primary alignment system AL1 (none of the marks are illustrated) are formed. In fine movement stage WFS2 of wafer stage WST2, as shown in FIG. 2, in the vicinity of a corner on the −X side located on the +Y side of plate 82, a measurement plate FM2 that is similar to measurement plate FM1 is fixed in a state substantially flush with the surface of wafer W. Incidentally, instead of attaching plate 82 to fine movement stage WFS1 (main section 80), it is also possible, for example, that the wafer holder is formed integrally with fine movement stage WFS1 and the liquid-repellent treatment is applied to the peripheral area, which encloses the wafer holder (the same area as plate 82 (which may include the surface of the measurement plate)), of the upper surface of fine movement stage WFS1 and the liquid repellent surface is formed.

In the center portion of the lower surface of main section 80 of fine movement stage WFS1, as shown in FIG. 5B, a plate having a predetermined thin plate shape, which is large to the extent of covering the wafer holder (mounting area of wafer W) and measurement plate FM1 (or measurement plate FM2 in fine movement stage WFS2), is placed in a state where its lower surface is located substantially flush with the other section (the peripheral section) (the lower surface of the plate does not protrude below the peripheral section). On one surface (the upper surface (or the lower surface)) of the plate, two-dimensional grating (hereinafter, simply referred to as grating) RG is formed. Grating RG includes a reflective diffraction grating (X diffraction grating) whose periodic direction is in the X-axis direction and a reflective diffraction grating (Y diffraction grating) whose periodic direction is in the Y-axis direction. The plate is formed by, for example, glass, and grating RG is created by graving the graduations of the diffraction gratings at a pitch, for example, between 138 nm to 4 μm, e.g. at a pitch of 1 μm. Incidentally, grating RG can also cover the entire lower surface of main section 80. Further, the type of the diffraction grating used for grating RG is not limited to the one on which grooves or the like are mechanically formed, but for example, a diffraction grating that is created by exposing interference fringes on a photosensitive resin can also be employed. Incidentally, the configuration of the plate having a thin plate shape is not necessarily limited to the above-described one.

As shown in FIG. 5A, the pair of fine movement slider sections 84a and 84b are each a plate-shaped member having a roughly square shape in a planar view, and are placed apart at a predetermined distance in the X-axis direction, on the side surface on the +Y side of main section 80. Fine movement slider section 84c is a plate-shaped member having a rectangular shape elongated in the X-axis direction in a planar view, and is fixed to the side surface on the −Y side of main section 80 in a state where one end and the other end in its longitudinal direction are located on straight lines parallel to the Y-axis that are substantially collinear with the centers of fine movement slider sections 84a and 84b.

The pair of fine movement slider sections 84a and 84b are respectively supported by guide member 94a described earlier, and fine movement slider section 84c is supported by guide member 94b. More specifically, fine movement stage WFS is supported at three noncollinear positions with respect to coarse movement stage WCS.

Inside fine movement slider sections 84a to 84c, magnetic units 98a, 98b and 98c, which are each made up of a plurality of permanent magnets (and yokes that are not illustrated) placed in a matrix shape with the XY two-dimensional directions serving as a row direction and a column direction, are housed, respectively, so as to correspond to coil units CUa to CUc that guide sections 94a and 94b of coarse movement stage WCS1 have. Magnetic unit 98a together with coil unit CUa, magnetic unit 98b together with coil unit CUb, and magnetic unit 98c together with coil unit CUc respectively configure three planar motors by the electromagnetic force (Lorentz force) drive method that are capable of generating drive forces in the X-axis, Y-axis and Z-axis directions, as disclosed in, for example, U.S. Patent Application Publication No, 2003/0085676 and the like, and these three planar motors configure a fine movement stage driving system 64A (see FIG. 7) that drives fine movement stage WFS1 in directions of six degrees of freedom (X, Y, Z, ex, θy and θz).

In wafer stage WST2 as well, three planar motors composed of coil units that coarse movement stage WCS2 has and magnetic units that fine movement stage WFS2 has are configured likewise, and these three planar motors configure a fine movement stage driving system 64S (see FIG. 7) that drives fine movement stage WFS2 in directions of six degrees of freedom (X, Y, Z, θx, θy and θz).

Fine movement stage WFS1 is movable in the X-axis direction, with a longer stroke compared with the directions of the other five degrees of freedom, along guide members 94a and 94b arranged extending in the X-axis direction. The same applies to fine movement stage WFS2.

With the configuration as described above, fine movement stage WFS1 is movable in the directions of six degrees of freedom with respect to coarse movement stage WCS1. Further, on this operation, the law of action and reaction (the law of conservation of momentum) that is similar to the previously described one holds owing to the action of a reaction force by drive of fine movement stage WFS1. More specifically, coarse movement stage WCS1 functions as the countermass of fine movement stage WFS1, and coarse movement stage WCS1 is driven in a direction opposite to fine movement stage WFS1. Fine movement stage WFS2 and coarse movement stage WCS2 has the similar relation.

Note that, in the embodiment, when broadly driving fine movement stage WFS1 (or WFS2) with acceleration/deceleration in the X-axis direction (e.g. in the cases such as when a stepping operation between shot areas is performed during exposure), main controller 20, along with driving fine movement stage WFS1 (or WSF2) in the X-axis direction by the planar motors that configure fine movement stage driving system 64A (or 64B), gives the initial velocity, which drives coarse movement stage WCS1 (or WCS2) in the same direction as with fine movement stage WFS1 (or WFS2), to coarse movement stage WCS1 (or WCS2), via coarse movement stage driving system 62A (or 62B) (drives coarse movement stage WCS1 (or WCS2) in the same direction as with fine movement stage WFS1 (or WFS2)). This causes coarse movement stage WCS1 (or WCS2) to function as the so-called countermass and also can decrease a movement distance of coarse movement stage WCS1 (or WCS2) in the opposite direction that accompanies the movement of fine movement stage WFCS1 (or WFS2) in the X-axis direction (that is caused by a reaction force of the drive force). Especially, in the case where fine movement stage WFS1 (or WFS2) performs an operation including the step movement in the X-axis direction, or more specifically, fine movement stage WFS1 (or WFS2) performs an operation of alternately repeating the acceleration and the deceleration in the X-axis direction, the stroke in the X-axis direction needed for the movement of coarse movement stage WCS1 (or WCS2) can be the shortest. On this operation, main controller 20 should give coarse movement stage WCS1 (or WCS2) the initial velocity with which the center of gravity of the entire system of wafer stage WST1 (or WST2) that includes the fine movement stage and the coarse movement stage performs constant velocity motion in the X-axis direction. With this operation, coarse movement stage WCS1 (or WCS2) performs a back-and-forth motion within a predetermined range with the position of fine movement stage WFS1 (or WFS2) serving as a reference. Consequently, as the movement stroke of coarse movement stage WCS1 (or WCS2) the X-axis direction, the distance that is obtained by adding some margin to the predetermined range should be prepared. Such details are disclosed in, for example, U.S. Patent Application Publication No. 2008/0143994 and the like.

Further, as described earlier, since fine movement stage WFS1 is supported at the three noncollinear positions by coarse movement stage WCS1, main controller 20 can tilt fine movement stage WFS1 (i.e. wafer W) at an arbitrary angle (rotational amount) in the θx direction and/or the θy direction with respect to the XY plane by, for example, appropriately controlling a drive force (thrust) in the Z-axis direction that is made to act on each of fine movement slider sections 84a to 84c. Further, main controller 20 can make the center portion of fine movement stage WFS1 bend in the +Z direction (into a convex shape), for example, by making a drive force in the +θx direction (a counterclockwise direction on the page surface of FIG. 5B) on each of fine movement slider sections 84a and 84b and also making a drive force in the −θx direction (a clockwise direction on the page surface of FIG. 5B) on fine movement slider section 84c. Further, main controller 20 can also make the center portion of fine movement stage WFS1 bend in the +Z direction (into a convex shape), for example, by making drive forces in the −θy direction and the +θy direction (a counterclockwise direction and a clockwise direction when viewed from the +Y side, respectively) on fine movement slider sections 84a and 84b, respectively. Main controller 20 can also perform the similar operations with respect to fine movement stage WFS2.

Incidentally, in the embodiment, as fine movement stage driving systems 64A and 64B, the planar motors of a moving magnet type are used, but this is not intended to be limiting, and planar motors of a moving coil type in which the coil units are placed at the fine movement slider sections of the fine movement stages and the magnetic units are placed at the guide members of the coarse movement stages can also be used.

Between coupling member 92a of coarse movement stage WCS1 and main section 80 of fine movement stage WFS1, as shown in FIG. 5A, a pair of tubes 86a and 86b used to transmit the power usage, which is supplied from the outside to coupling member 92a, to fine movement stage WFS1 are installed. Incidentally, although the illustration is omitted in the drawings including FIG. 5A, actually, the pair of tubes 86a and 86b are each made up of a plurality of tubes. One ends of tubes 86a and 86b are connected to the side surface on the +X side of coupling member 92a and the other ends are connected to the inside of main section 80, respectively via a pair of recessed sections 80a (see FIG. 5C) with a predetermined depth each of which is formed from the end surface on the −X side toward the +X direction with a predetermined length, on the upper surface of main section 80. As shown in FIG. 5C, tubes 86a and 86b are configured not to protrude above the upper surface of fine movement stage WFS1. Between coupling member 92a of coarse movement stage WCS2 and main section 80 of fine movement stage WFS2 as well, as shown in FIG. 2, a pair of tubes 86a and 86b used to transmit the power usage, which is supplied from the outside to coupling member 92a, to fine movement stage WFS2 are installed.

In the present embodiment, as each of fine movement stage driving systems 64A and 64B, the three planar motors of a moving magnet type are used, and therefore, the power usage other than the electric power is transmitted between the coarse movement stage and the fine movement stage via tubes 86a and 86b. Incidentally, transmission of the power usage between the coarse movement stage and the fine movement stage can be performed in a noncontact manner by employing the configuration and the method as disclosed in, for example, PCT International Publication No. 2004/100237, instead of tubes 86a and 86b.

As shown in FIG. 2, one of the tube carriers, tube carrier TCa is connected to the piping member and the wiring member inside coupling member 92a of coarse movement stage WCS1 via tube $Ta_2$. As shown in FIG. 3A, tube carrier TCa is placed on stepped section 12b formed at the end on the −X side of base board 12A. Tube carrier TCa is driven in the Y-axis direction following wafer stage WST1, by an actuator such as a liner motor, on stepped section 12b.

As shown in FIG. 3A, the other of the tube carriers, tube carrier TCb is placed on stepped section 12b formed at the end on the +X side of base board 12B, and is connected to the piping member and the wiring member inside coupling member 92a of coarse movement stage WCS2 via tube $Tb_2$ (see FIG. 2). Tube carrier TCb is driven in the Y-axis direction following wafer stage WST2, by an actuator such as a liner motor, on stepped section 12b.

As shown in FIG. 3A, one ends of tubes $Ta_1$ and $Tb_1$, are connected to tube carriers TCa and TCb respectively, while the other ends of tubes $Ta_1$, and $Tb_1$ are connected to a power usage supplying device externally installed that is not illustrated (e.g. an electric power supply, a gas tank, a compressor, a vacuum pump or the like). The power usage supplied from the power usage supplying device to tube carrier TCa via tube $Ta_1$ is supplied to fine movement stage WFS1 via tube $Ta_2$, the piping member and the wiring member, which are not illustrated, housed in coupling member 92a of coarse movement stage WCS1, and tubes 86a and 86b. Similarly, the power usage supplied from the power usage supplying device to tube carrier TCb via tube $Tb_1$ is supplied to fine movement stage WFS2 via tube $Tb_2$, the piping member and the wiring member, which are not illustrated, housed in coupling member 92a of coarse movement stage WCS2, and tubes 86a and 86b.

Next, a measurement system that measures positional information of wafer stages WST1 and WST2 is described. Exposure apparatus 100 has a fine movement stage position measuring system 70 (see FIG. 7) to measure positional information of fine movement stages WFS1 and WFS2 and coarse movement stage position measuring systems 68A and 68B (see FIG. 7) to measure positional information of coarse movement stages WCS1 and WCS2 respectively.

Figure 3B:
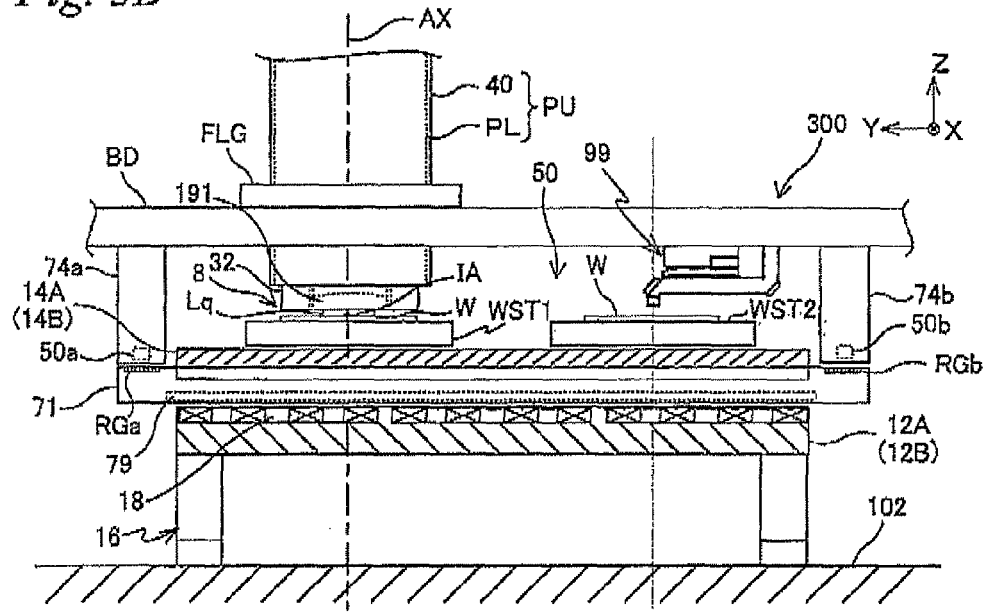
FIG. 3B is a side view (partial cross sectional view) of the exposure apparatus of FIG. 1 when viewed from the −X side.

Fine movement stage position measuring system 70 has a measurement bar 71 shown in FIG. 1. Measurement bar 71 is placed below first sections $14A_1$ and $14B_1$ that the pair of surface plates 14A and 146 respectively have, as shown in FIGS. 3A and 3B. As shown in FIGS. 3A and 3B, measurement bar 71 is made up of, for example, a beam-like member having a rectangular sectional shape with the Y-axis direction serving as its longitudinal direction. Inside (on the bottom portion of) measurement bar 71, a magnetic unit 79 including a plurality of magnets is placed. Magnetic unit 79 configures, together with coil unit 18 described earlier, a measurement bar driving system 65 (see FIG. 7) made up of a planar motor by the electromagnetic force (Lorentz force) drive method that is capable of driving measurement bar 71 in the directions of six degrees of freedom.

Measurement bar 71 is supported by levitation (supported in a noncontact manner) above base boards 12A and 12B, by a drive force in the +Z direction generated by the planar motor that configures measurement bar driving system 65. Measurement bar 71 is placed between surface plates 14A and 14B. Further, a predetermined clearance is formed between measurement bar 71, and each of surface plates 14A and 14B and base boards 12A and 12B, and measurement bar 71 and each of surface plates 14A and 14B and base boards 12A and 12B are in a state mechanically noncontact with each other. Measurement bar 71 is formed by a material with a relatively low coefficient of thermal expansion (e.g. invar, ceramics, or the like).

In this case, as the planar motor that configures measurement bar driving system 65 supports measurement bar 71 by levitation, measurement bar 71 falls owing to its own weight when measurement bar driving system 65 (planar motor) does not generate a drive force. In order to prevent such situation from arising, in the present embodiment, a pair of lock mechanisms (not illustrated) are arranged that integrate a pair of suspended support members 74a and 74b to be described later on and measurement bar 71, or more specifically, fix measurement bar 71 to the pair of suspended support members 74a and 74b. The lock and the release of the lock by the pair of lock mechanisms are performed by main controller 20. Incidentally, in the case where the lock mechanisms arranged at both support members 74a and 74b can manually be operated, the manual lock mechanisms can be used.

On each of the upper surface of the end on the +Y side and the upper surface of the end on the −Y side of measurement bar 72, a recessed section having a rectangular shape in a planar view is formed, and into the recessed section, a thin plate-shaped plate is fitted, on which a two-dimensional grating RGa or RGb (hereinafter, simply referred to as a grating RGa or RGb) is formed that includes, on its surface, a reflective diffraction grating (X diffraction grating) whose periodic direction is in the X-axis direction and a reflective diffraction grating (Y diffraction grating) whose periodic direction is in the Y-axis direction (see FIGS. 2 and 3A). The plate is formed by, for example, glass and gratings RGa and RGb have the diffraction gratings of the pitch similar to that of grating RG described earlier and are formed in a similar manner.

In this case, as shown in FIG. 3B, on the lower surface of main frame BD, the pair of suspended support members 74a and 74b whose longitudinal directions are in the Z-axis direction are fixed. The pair of suspended support members 74a and 74b are each made up of, for example, a columnar member, and their one ends (upper ends) are fixed to main frame BD and the other ends (lower ends) are respectively opposed, via a predetermined clearance, to gratings RGa and RGb placed at measurement bar 71. Inside the lower ends of the pair of suspended support members 74a and 74b, a pair of head units 50a and 50b are respectively housed, each of which includes a diffraction interference type encoder head having a configuration in which a light source, a photodetection system (including a photodetector) and various types of optical systems are unitized, which is similar to the encoder head disclosed in, for example, PCT International Publication No. 2007/083758 (the corresponding U.S. Patent Application Publication No. 2007/0288121) and the like.

The pair of head units 50*a* and 50*b* each have a one-dimensional encoder head for X-axis direction measurement (hereinafter, shortly referred to as an X head) and a one-dimensional encoder head for Y-axis direction measurement (hereinafter, shortly referred to as a Y head) (none of which are illustrated).

The X head and the Y head belonging to head unit 50*a* irradiate grating RGa with measurement beams and respectively receive diffraction light from the X diffraction grating and the Y diffraction grating of grating RGa, thereby respectively measuring positional information in the X-axis direction and the Y-axis direction of measurement bar 71 (grating RGa) with the measurement center of head unit 50*a* serving as a reference.

Similarly, the X head and the Y head belonging to head unit 50*b* irradiate grating RGb with measurement beams and respectively receive diffraction light from the X diffraction grating and the Y diffraction grating of grating RGb, thereby respectively measuring positional information in the X-axis direction and the Y-axis direction of measurement bar 71 (grating RGb) with the measurement center of head unit 50*b* serving as a reference.

In this case, since head units 50*a* and 50*b* are fixed to the inside of suspended support members 74*a* and 74*b* that have the constant positional relation with main frame BD that supports projection unit PU (projection optical system PL), the measurement centers of head units 50*a* and 50*b* have the fixed positional relation with main frame BD and projection optical system PL. Consequently, the positional information in the X-axis direction and the positional information in the Y-axis direction of measurement bar 71 with the measurement centers of head units 50*a* and 50*b* serving as references are respectively equivalent to positional information in the X-axis direction and positional information in the Y-axis direction of measurement bar 71 with (a reference point on) main frame BD serving as a reference.

More specifically, a pair of the Y heads respectively belonging to head units 50*a* and 50*b* configure a pair of Y linear encoders that measure the position of measurement bar 71 in the Y-axis direction with (the reference point on) main frame BD serving as a reference, and a pair of the X heads respectively belonging to head units 50*a* and 50*b* configure a pair of X linear encoders that measure the position of measurement bar 71 in the X-axis direction with (the reference point on) main frame BD serving as a reference.

The measurement values of the pair of the X heads (X linear encoders) and the pair of the Y heads (Y linear encoders) are supplied to main controller 20 (see FIG. 7), and main controller 20 respectively computes the relative position of measurement bar 71 in the Y-axis direction with respect to (the reference point on) main frame BD based on the average value of the measurement values of the pair of the Y linear encoders, and the relative position of measurement bar 71 in the X-axis direction with respect to (the reference point on) main frame BD based on the average value of the measurement values of the pair of the X linear encoders. Further, main controller 20 computes the position in the θz direction (rotational amount around the Z-axis) of measurement bar 71 based on the difference between the measurement values of the pair of the X linear encoders.

Further, head units 50*a* and 50*b* each have a Z head (the illustration is omitted) that is a displacement sensor by an optical method similar to an optical pickup that is used in a CD drive device or the like. To be more specific, head unit 50*a* has two Z heads placed apart in the X-axis direction and head unit 50*b* has one Z head. That is, the three Z heads are placed at three noncollinear positions. The three Z heads configure a surface position measuring system that irradiates the surface of the plate on which gratings RGa and RGb of measurement bar 71 are formed (or the formation surface of the reflective diffraction gratings) with measurement beams parallel to the Z-axis and receives reflected light reflected by the surface of the plate (or the formation surface of the reflective diffraction gratings), thereby measuring the surface position (the position in the Z-axis direction) of measurement bar 71 at the respective irradiation points, with (the measurement reference surfaces) of head units 50*a* and 50*b* serving as references. Based on the measurement values of the three Z heads, main controller 20 computes the position in the Z-axis direction and the rotational amount in the θx and θy directions of measurement bar 71 with (the measurement reference surface of) main frame BD serving as a reference. Incidentally, as far as the Z heads are placed at the three noncollinear positions, the placement is not limited to the above described one, and for example, the three Z heads can be placed in one of the head units. Incidentally, the surface position information of measurement bar 71 can also be measured by, for example, an optical interferometer system that includes an optical interferometer. In this case, the pipe (fluctuation preventing pipe) used to isolate the measurement beam irradiated from the optical interferometer from surrounding atmosphere, e.g., air can be fixed to suspended support members 74*a* and 74*b*. Further, the number of the respective X, Y and Z encoder heads are not limited to the above-described one, but for example, the number of the encoder heads can be increased and the encoder heads can selectively be used.

In exposure apparatus 100 of the embodiment, the plurality of the encoder heads (X linear encoders, Y linear encoders) described above and the Z heads (surface position measuring system) which head units 50*a* and 50*b* have, configure a measurement bar position measuring system 67 (see FIG. 7) that measures the relative position of measurement bar 71 in the directions of six degrees of freedom with respect to main frame BD. Based on the measurement values of measurement bar position measuring system 67, main controller 20 constantly measures the relative position of measurement bar 71 with respect to main frame BD, and controls measurement bar driving system 65 to control the position of measurement bar 71 such that the relative position between measurement bar 71 and main frame BD does not vary (i.e. such that measurement bar 71 and main frame BD are in a state similar to being integrally configured).

Figure 6:
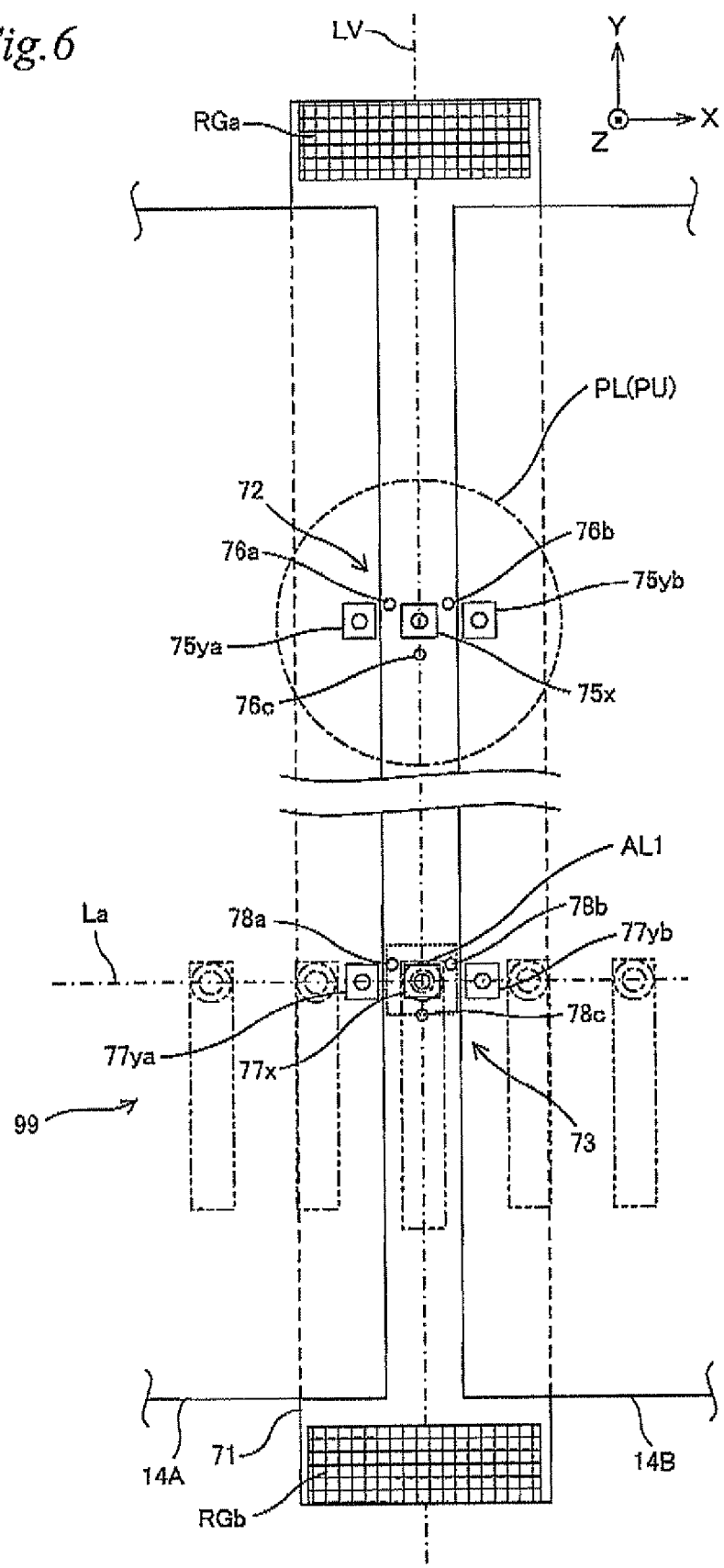
FIG. 6 is a view showing a configuration of a fine movement stage position measuring system.

At measurement bar 71, as shown in FIG. 6, a first measurement head group 72 used when measuring positional information of the fine movement stage (WFS1 or WFS2) located below projection unit PU and a second measurement head group 73 used when measuring positional information of the fine movement stage (WFS1 or WFS2) located below alignment device 99 are arranged. Incidentally, alignment systems AL1 and $AL2_1$ to $AL2_4$ are shown in virtual lines (two-dot chain lines) in FIG. 6 in order to make the drawing easy to understand. Further, in FIG. 6, the reference signs of alignment systems $AL2_1$ to $AL2_4$ are omitted.

As shown in FIG. 6, first measurement head group 72 is placed below projection unit PU and includes a one-dimensional encoder head for X-axis direction measurement (hereinafter, shortly referred to as an X head or an encoder head) 75*x*, a pair of one-dimensional encoder heads for Y-axis direction measurement (hereinafter, shortly referred to as Y heads or encoder heads) 75*ya* and 75*yb*, and three Z heads 76*a*, 76*b* and 76*c*.

X head 75*x*, Y heads 75*ya* and 75*yb* and the three Z heads 76*a* to 76*c* are placed in a state where their positions do not vary, inside measurement bar 71. X head 75*x* is placed on reference axis LV, and Y heads 75ya and 75yb are placed at the same distance away from X head 75x, on the −X side and the +X side, respectively. In the present embodiment, as each of the three encoder heads 75x, 75ya and 75yb, a diffraction interference type head having a configuration in which a light source, a photodetection system (including a photodetector) and various types of optical systems are unitized is used, which is similar to the encoder head disclosed in, for example, PCT International Publication No. 2007/083758 (the corresponding U.S. Patent Application Publication No. 2007/0288121) and the like.

When wafer stage WST1 (or WST2) is located directly under projection optical system PL (see FIG. 1), X head 75x and Y heads 75ya and 75yb each irradiate a measurement beam on grating RG (see FIG. 5B) placed on the lower surface of fine movement stage WFS1 (or WFS2), via a gap between surface plate 14A and surface plate 14B or a light-transmitting section (e.g. an opening) formed at first section 14A$_1$ of surface plate 14A and first section 14B$_L$ of surface plate 14B. Further, X head 75x and Y heads 75ya and 75yb each receive diffraction light from grating RG, thereby obtaining positional information within the XY plane (also including rotational information in the θz direction) of fine movement stage WFS1 (or WFS2). More specifically, an X liner encoder 51 (see FIG. 7) is configured of X head 75x that measures the position of fine movement stage WFS1 (or WFS2) in the X-axis direction using the X diffraction grating that grating RG has. And, a pair of Y liner encoders 52 and 53 (see FIG. 7) are configured of the pair of Y heads 75ya and 75yb that measure the position of fine movement stage WFS1 (or WFS2) in the Y-axis direction using the Y diffraction grating of grating RG. The measurement value of each of X head 75x and Y heads 75ya and 75yb is supplied to main controller 20 (see FIG. 7), and main controller 20 measures (computes) the position of fine movement stage WFS1 (or WFS2) in the X-axis direction using (based on) the measurement value of X head 75x, and the position of fine movement stage WFS1 (or WFS2) in the Y-axis direction based on the average value of the measurement values of the pair of Y head 75ya and 75yb. Further, main controller 20 measures (computes) the position in the θz direction (rotational amount around the Z-axis) of fine movement stage WFS1 (or WFS2) using the measurement value of each of the pair of X linear encoders 52 and 53.

In this case, an irradiation point (detection point), on grating RG, of the measurement beam irradiated from X head 75x coincides with the exposure position that is the center of exposure area IA (see FIG. 1) on wafer W. Further, a midpoint of a pair of irradiation points (detection points), on grating RG, of the measurement beams respectively irradiated from the pair of X heads 75ya and 75yb coincides with the irradiation point (detection point), on grating RG, of the measurement beam irradiated from X head 75x. Main controller 20 computes positional information of fine movement stage WFS1 (or WFS2) in the Y-axis direction based on the average of the measurement values of the two Y heads 75ya and 75yb. Therefore, the positional information of fine movement stage WFS1 (or WFS2) in the Y-axis direction is substantially measured at the exposure position that is the center of irradiation area (exposure area) IA of illumination light IL irradiated on wafer W. More specifically, the measurement center of X head 75x and the substantial measurement center of the two Y heads 75ya and 75yb coincide with the exposure position. Consequently, by using X linear encoder 51 and Y linear encoders 52 and 53, main controller 20 can perform measurement of the positional information within the XY plane (including the rotational information in the θz direction) of fine movement stage WFS1 (or WFS2) directly under (on the back side of) the exposure position at all times.

As each of Z heads 76a to 76c, for example, a head of a displacement sensor by an optical method similar to an optical pickup used in a CD drive device or the like is used. The three Z heads 76a to 76c are placed at the positions corresponding to the respective vertices of an isosceles triangle (or an equilateral triangle) Z heads 76a to 76c each irradiate the lower surface of fine movement stage WFS1 (or WFS2) with a measurement beam parallel to the Z-axis from below, and receive reflected light reflected by the surface of the plate on which grating RG is formed (or the formation surface of the reflective diffraction grating). Accordingly, Z heads 76a to 76c configure a surface position measuring system 54 (see FIG. 7) that measures the surface position (position in the Z-axis direction) of fine movement stage WFS1 (or WFS2) at the respective irradiation points. The measurement value of each of the three Z heads 76a to 76c is supplied to main controller 20 (see FIG. 7).

The center of gravity of the isosceles triangle (or the equilateral triangle) whose vertices are at the three irradiation points on grating RG of the measurement beams respectively irradiated from the three Z heads 76a to 76c coincides with the exposure position that is the center of exposure area IA (see FIG. 1) on wafer W. Consequently, based on the average value of the measurement values of the three Z heads 76a to 76c, main controller 20 can acquire positional information in the Z-axis direction (surface position information) of fine movement stage WFS1 (or WFS2) directly under the exposure position at all times. Further, main controller 20 measures (computes) the rotational amount in the ex direction and the θy direction, in addition to the position in the Z-axis direction, of fine movement stage WFS1 (or WFS2) using (based on) the measurement values of the three Z heads 76a to 76c.

Figure 7:
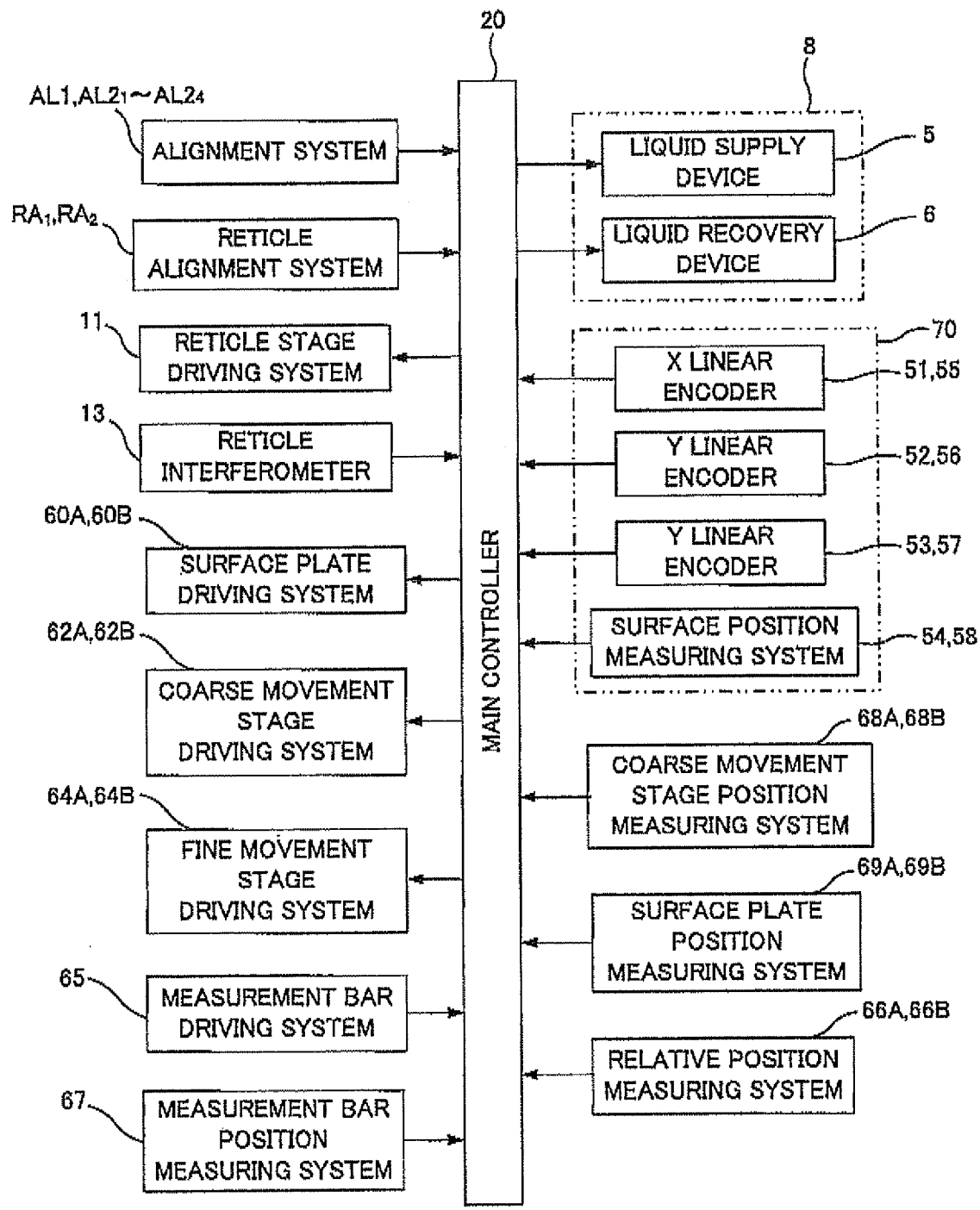

Second measurement head group 73 has an X head 77x that configures an X liner encoder 55 (see FIG. 7), a pair of Y heads 77ya and 77yb that configure a pair of Y linear encoders 56 and 57 (see FIG. 7), and three Z heads 78a, 78b and 78c that configure a surface position measuring system 58 (see FIG. 7). The respective positional relations of the pair of Y heads 77ya and 77yb and the three Z heads 78a to 78c with X head 77x serving as a reference are similar to the respective positional relations described above of the pair of Y heads 75ya and 75yb and the three Z heads 76a to 76c with X head 75x serving as a reference. An irradiation point (detection point), on grating RG, of the measurement beam irradiated from X head 77x coincides with the detection center of primary alignment system AL1. More specifically, the measurement center of X head 77x and the substantial measurement center of the two Y heads 77ya and 77yb coincide with the detection center of primary alignment system AL1. Consequently, main controller 20 can perform measurement of positional information within the XY plane and surface position information of fine movement stage WFS2 (or WFS1) at the detection center of primary alignment system AL1 at all times.

When wafer stage WST1 moves between exposure station 200 and measurement station 300 on surface plate 14A, coarse movement stage position measuring system 68A (see FIG. 7) measures positional information of coarse movement stage WCS1 (wafer stage WST1). The configuration of coarse movement stage position measuring system 68A is not limited in particular, and includes an encoder system or an optical interferometer system (it is also possible to combine the optical interferometer system and the encoder system). In the case where coarse movement stage position measuring system 68A includes the encoder system, for example, a configuration can be employed in which the positional information of coarse movement stage WCS1 is measured by irradiating a scale (e.g. two-dimensional grating) fixed (or formed) on the upper surface of coarse movement stage WCS1 with measurement beams from a plurality of encoder heads fixed to main frame BD in a suspended state along the movement course of wafer stage WST1 and receiving the diffraction light of the measurement beams. In the case where coarse movement stage measuring system 68A includes the optical interferometer system, a configuration can be employed in which the positional information of wafer stage WST1 is measured by irradiating the side surface of coarse movement stage WCS1 with measurement beams from an x optical interferometer and a Y optical interferometer that have a measurement axis parallel to the X-axis and a measurement axis parallel to the Y-axis respectively and receiving the reflected light of the measurement beans.

Coarse movement stage position measuring system 68B (see FIG. 7) has the configuration similar to coarse movement stage position measuring system 68A, and measures positional information of coarse movement stage WCS2 (wafer stage WST2). Main controller 20 respectively controls the positions of coarse movement stages WCS1 and WCS2 (wafer stages WST1 and WST2) by individually controlling coarse movement stage driving systems 62A and 62B, based on the measurement values of coarse movement stage position measuring systems 68A and 68B.

Further, exposure apparatus 100 is also equipped with a relative position measuring system 66A and a relative position measuring system 66B (see FIG. 7) that measure the relative position between coarse movement stage WCS1 and fine movement stage WFS1 and the relative position between coarse movement stage WCS2 and fine movement stage WFS2, respectively. While the configuration of relative position measuring systems 66A and 66B is not limited in particular, relative position measuring systems 66A and 66B can each be configured of, for example, a gap sensor including a capacitance sensor. In this case, the gap sensor can be configured of, for example, a probe section fixed to coarse movement stage WCS1 (or WCS2) and a target section fixed to fine movement stage WFS1 (or WFS2). Incidentally, the configuration of the relative position measuring system is not limited thereto, but for example, the relative position measuring system can be configured using, for example, a liner encoder system, an optical interferometer system or the like.

FIG. 7 shows a block diagram that shows input/output relations of main controller 20 that is configured of a control system of exposure apparatus 100 as the central component and performs overall control of the respective components. Main controller 20 includes a workstation (or a microcomputer) and the like, and performs overall control of the respective components of exposure apparatus 100 such as local liquid immersion device 8, surface plate driving systems 60A and 60B, coarse movement stage driving systems 62A and 62B, and fine movement stage driving systems 64A and 64B.

In exposure apparatus 100 configured as described above, exposure on wafers in a predetermined number of lots or to a predetermined number of wafers is performed by alternately using wafer stages WST1 and WST2. More specifically, in parallel with performing the exposure operation on a wafer held by one of wafer stages WST1 and WST2, main controller 20 performs wafer exchange and at least a part of wafer alignment of a wafer held on the other of wafer stages WST1 and WST2, and thereby the parallel processing operation described above is performed using wafer stages WST1 and WST2 alternately, in a manner similar to a conventional exposure apparatus of a twin-wafer-stage type. However, on delivery of the liquid in the liquid immersion area between the two wafer stages WST1 and WST2, for example, in a state where both wafer stages WST1 and WST2 have moved to the scrum position, wafer stage WST1 and wafer stage WST2 go into a scrum state of being in proximity or in contact in the X-axis direction. Simultaneously with this state, fine movement stage WFS1 and coarse movement stage WCS1 go into a scrum state, and coarse movement stage WCS2 and fine movement stage WFS2 go into a scrum state, which causes the upper surfaces of fine movement stage WFS1, coupling member 92b of coarse movement stage WCS1, coupling member 92b of coarse movement stage WCS2 and fine movement stage WFS2 to form a fully flat surface that is apparently integrated. Except for such a point, the operation similar to the conventional liquid immersion exposure apparatus of a twin-wafer-stage type is performed, and accordingly the detailed description is omitted herein. Note that in the case where wafer stage WST1 and wafer stage WST2 are driven while the above-described three scrum states are kept, it is preferable that a gap (clearance) between wafer stage WST1 and wafer stage WST2, a gap (clearance) between fine movement stage WFS1 and coarse movement stage WCS1 and a gap (clearance) between coarse movement stage WCS2 and fine movement stage WFS2 are set such that leakage of liquid Lq is prevented or restrained. In this case, the proximity includes the case where the gap (clearance) between the two members in the scrum state is zero, or more specifically, the case where both the members are in contact.

Next, the procedure to follow when carrying wafer stages WST1 and WST2 and the like to the outside of exposure apparatus 100 (the outside of a chamber that houses the exposure apparatus main body) in order to perform maintenance of wafer stages WST1 and WST2 and the like of exposure apparatus 100 is described.

Figure 8:
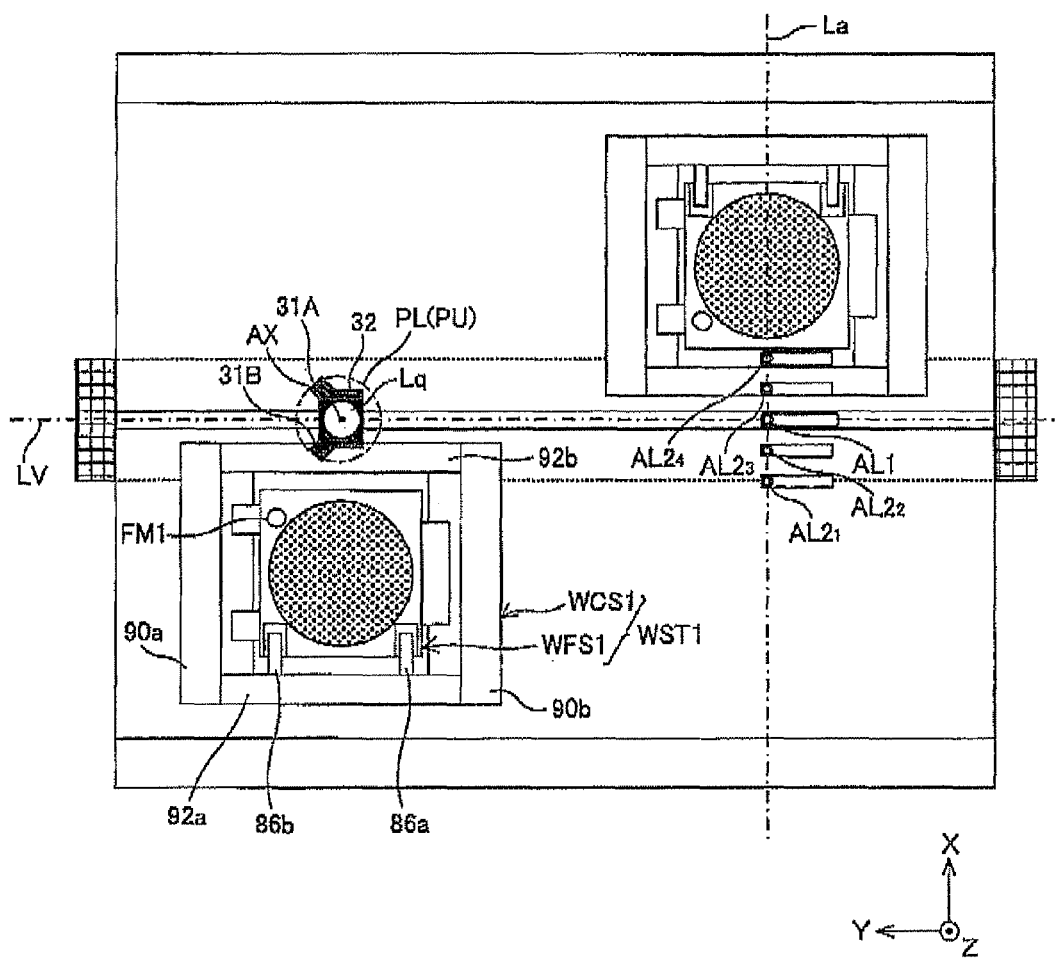
FIG. 8 is a view (No. 1) used to explain the procedure to follow when the wafer stage and the like are carried to the outside of the exposure apparatus.
Figure 9:
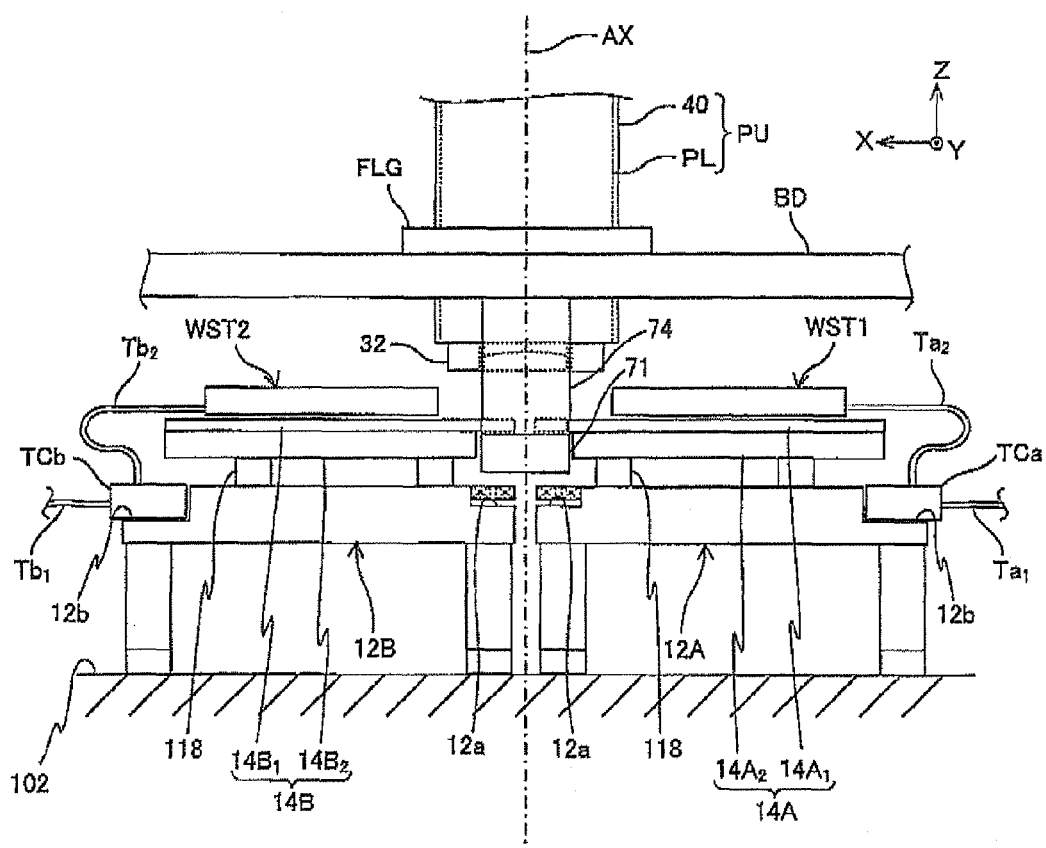
FIG. 9 is a view (No. 2) used to explain the procedure to follow when the wafer stage and the like are carried to the outside of the exposure apparatus.
Figure 10:
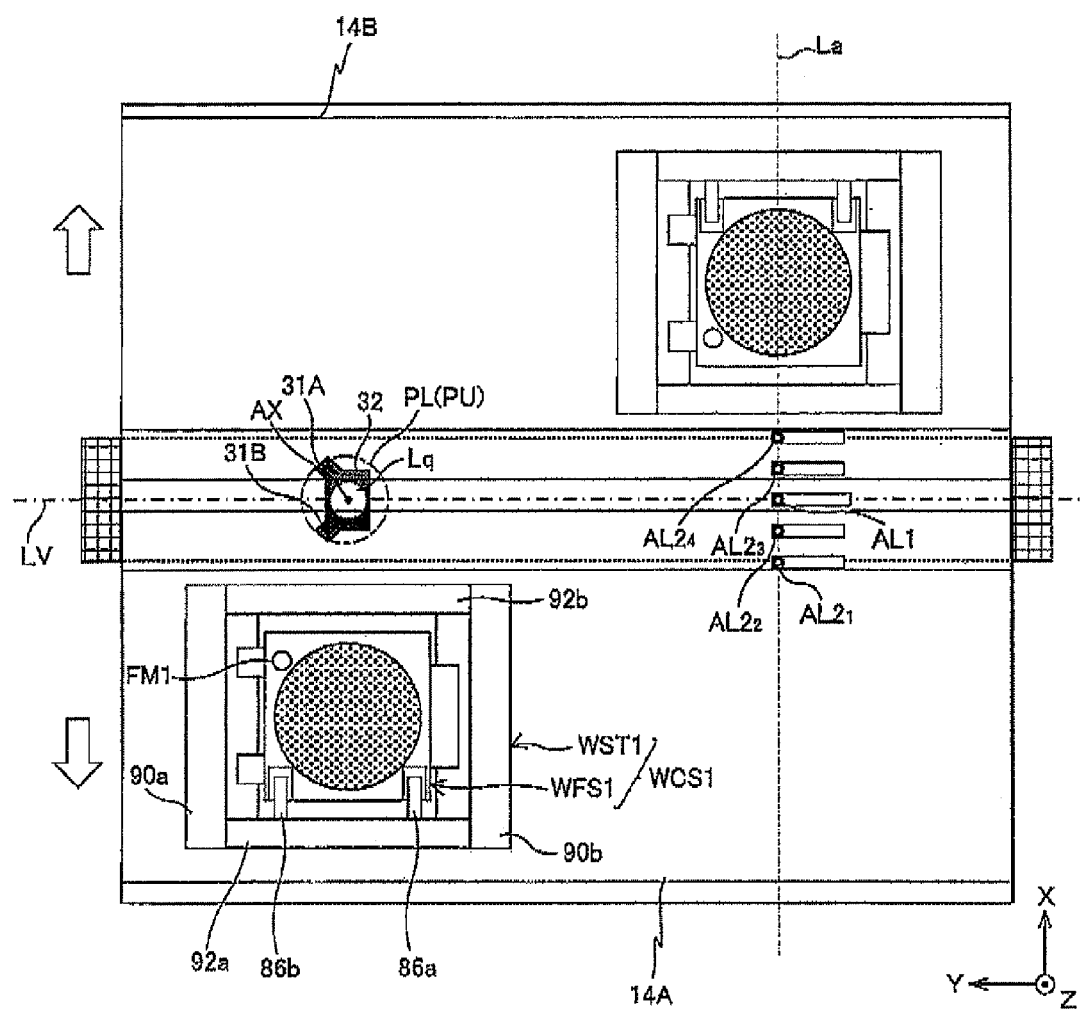
FIG. 10 is a view (No. 3) used to explain the procedure to follow when the wafer stage and the like are carried to the outside of the exposure apparatus.

As a premise, exposure apparatus 100 is to be in a state of shutdown. FIG. 8 shows a plan view of exposure apparatus 100 in such a state with partial omission. And, FIG. 9 shows a side view (a view when viewed from the +Y direction) of FIG. 8.

First of all, a worker gives the instruction to main controller 20 to integrate the pair of suspended support members 74a and 74b and measurement bar 71 using the lock mechanisms that are not illustrated.

Figure 11:
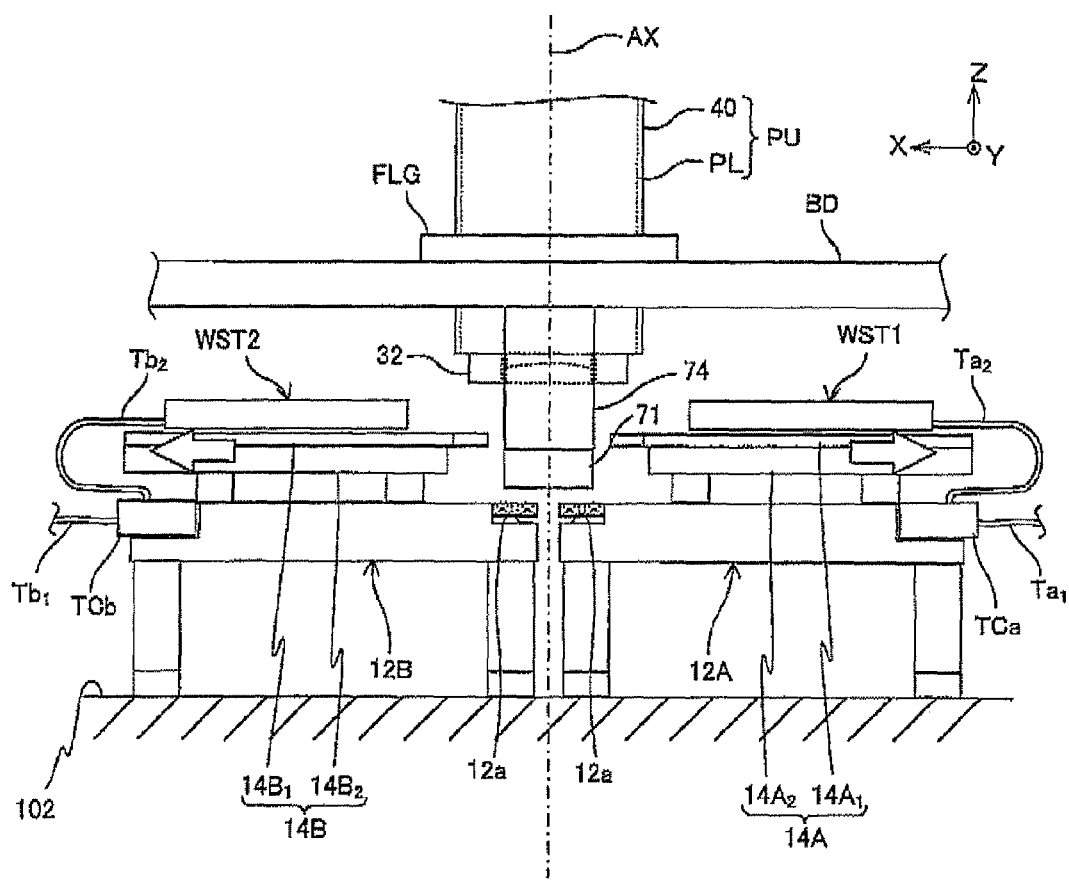
FIG. 11 is a view (No. 4) used to explain the procedure to follow when the wafer stage and the like are carried to the outside of the exposure apparatus.

Next, the worker respectively moves surface plate 14A and surface plate 14S in directions in which the surface plates move apart from each other in the X-axis direction. More specifically, the worker gives the command to main controller 20 to move surface plate 14A in the −X direction and surface plate 14B in the +X direction, respectively, by a predetermined distance. Accordingly, main controller 20 drives surface plates 14A and 14B in directions in which the surface plates move apart from each other in the X-axis direction, as indicated by outlined arrows in FIG. 10, via surface plate driving systems 60A and 60B. FIG. 11 shows a side view (a view when viewed from the +Y direction) of FIG. 10. As shown in FIG. 11, first sections $14A_1$ and $14B_1$ of surface plates 14A and 14B are withdrawn from an area above measurement bar 71 to the outside, and after the withdrawal, the state of levitation/elevating mechanisms 118 that support surface plates 14A and 14B respectively, is switched from the fourth state to the first state (moves into "the landing state" where hover contact prevention members 35 are in contact with the upper surface of base board 12A or 12B).

Figure 12:
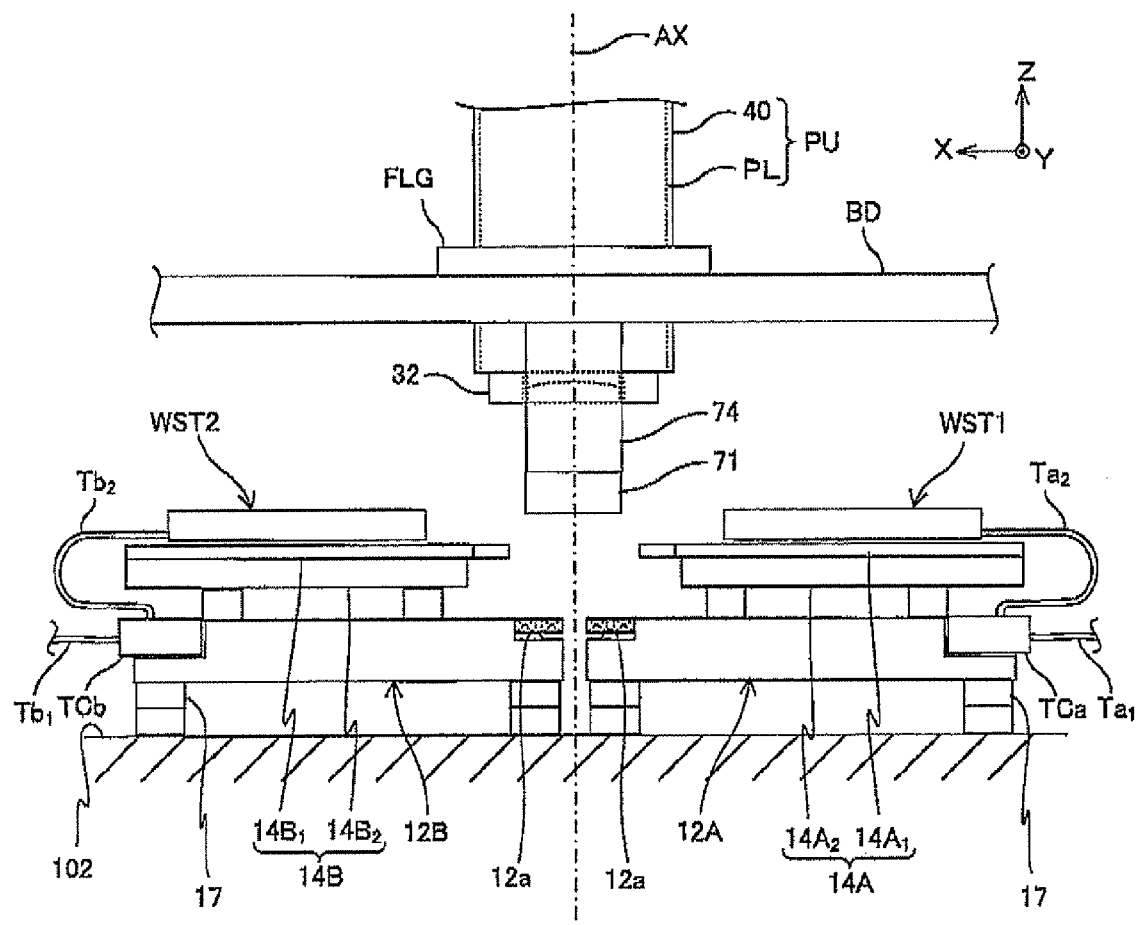
FIG. 12 is a view (No. 5) used to explain the procedure to follow when the wafer stage and the like are carried to the outside of the exposure apparatus.
Figure 13:
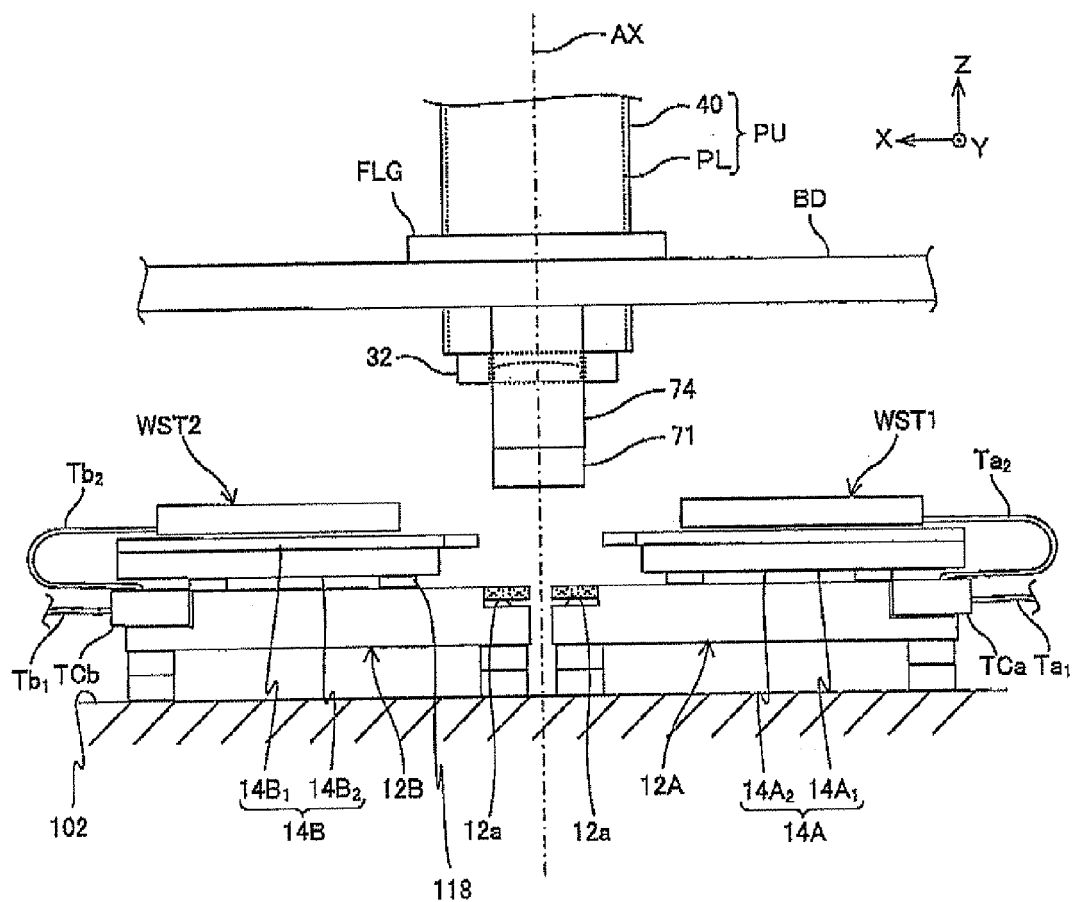
FIG. 13 is a view (No. 6) used to explain the procedure to follow when the wafer stage and the like are carried to the outside of the exposure apparatus.

Next, the worker gives the command to main controller 20 to contract mount members 17 that respectively configure the four support sections 16 that support each of base boards 12A and 12B, and air mounts 26 of the four levitation/elevating mechanisms 118 that support each of surface plates 14A and 14B. Accordingly, main controller 20 exhausts the gas filled in the air mount equipped in each of mount members 17 to the outside, each of mount members 17 contracts, and base boards 12A and 12B that respectively hold surface plates 14A and 14B are lowered, as shown in FIG. 12. Subsequently, main controller 20 switches the state of each of levitation/elevating mechanisms 118 from the first state to the second state, and as shown in FIG. 13, surface plates 14A and 14B that respectively support wafer stages WST1 and WST2 are further lowered from the position shown in FIG. 12. In the state shown in FIG. 13, the uppermost surfaces of wafer stages WST1 and WST2 are located lower than the lower end surface of measurement bar 71.

Figure 14:
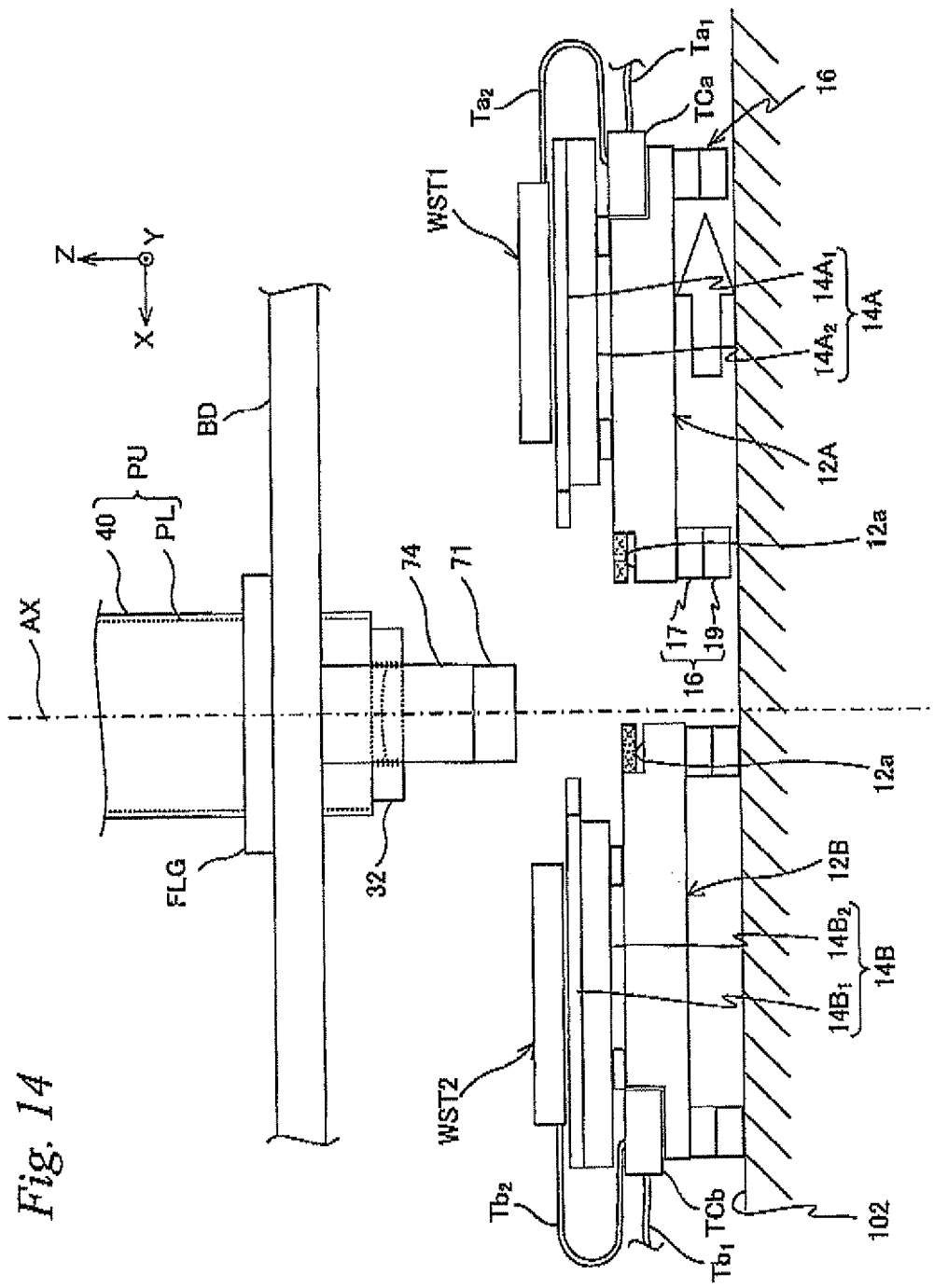
FIG. 14 is a view (No. 7) used to explain the procedure to follow when the wafer stage and the like are carried to the outside of the exposure apparatus.
Figure 15:
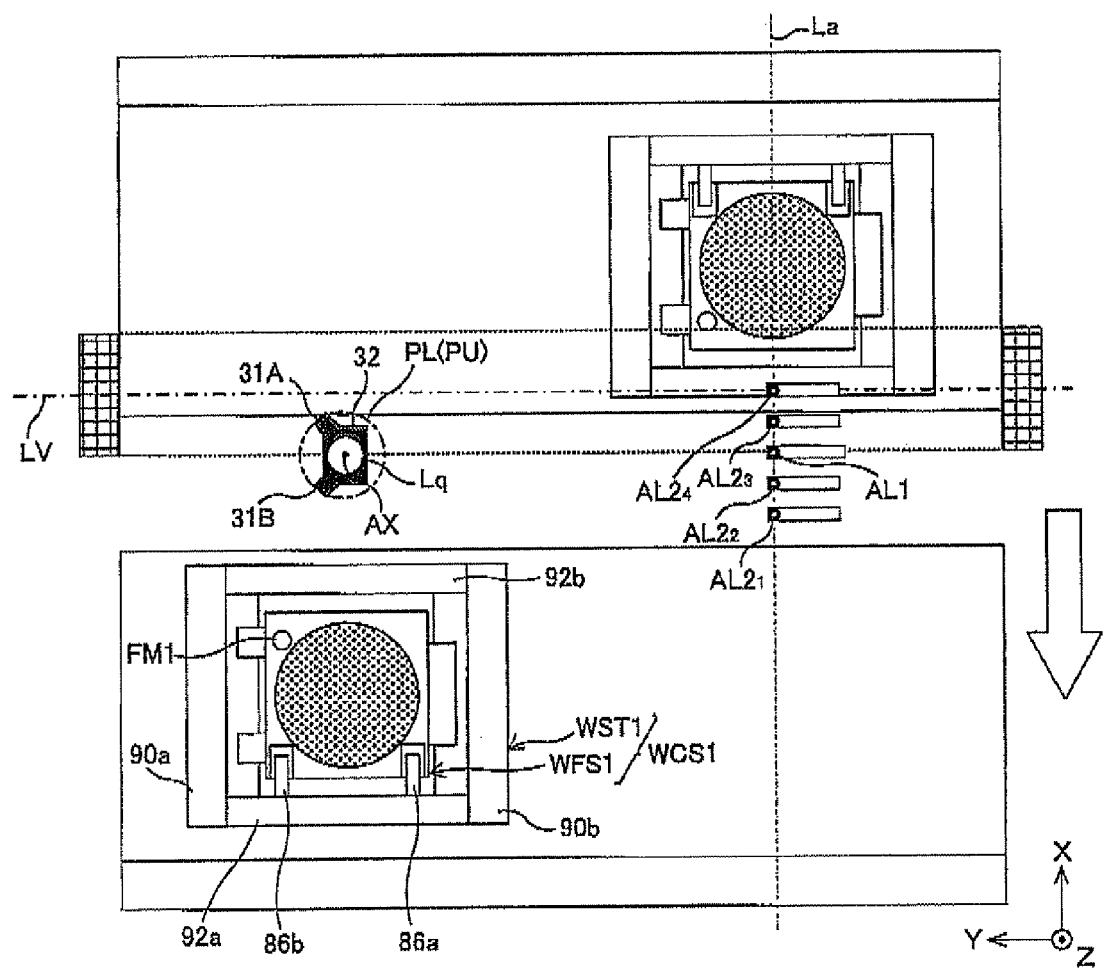
FIG. 15 is a view (No. 8) used to explain the procedure to follow when the wafer stage and the like are carried to the outside of the exposure apparatus.

Next, the worker makes the pressurized gas be blown out from the air hovers that hover members 19 of the four support sections 16, which support base board 12A, respectively have. Accordingly, as shown in FIG. 14, the four support sections 16 that support base board 12A are levitated from floor surface 102. In this state, the worker moves the −X side components of stage device 50 (including the four support sections 16, base board 12A, surface plate 14A and wafer stage WST1 and tube carrier TCa and the like) integrally in the −X direction, as shown in an outlined arrow in FIG. 14, and carries the −X side components to the outside of exposure apparatus. FIG. 15 shows a plan view corresponding to FIG. 14. Incidentally, instead of the configuration in which hover members 19 are arranged to move base board 12A, surface plate 14A and the like, for example, in the X direction, a configuration in which a contact type rolling mechanism or the like is arranged can also be employed. In such a case, particles caused by the exhausted air from hover members 19 can be prevented from being generated.

After the carriage of the −X side components of stage device 50 to the outside of the apparatus, the worker carries the +X side components of stage device 50 (including the four support sections 16, base board 12B, surface plate 14B and wafer stage WST2 and tube carrier TCb and the like) to the outside of the exposure apparatus in a similar manner to the above-described manner.

The worker carries the −X side components and the +X side components of stage device 50 into the exposure apparatus, in the procedure reverse to the above-described procedure.

As described above, in exposure apparatus 100 of the embodiment, surface plate 14A and surface plate 145 are moved away from measurement bar 71 in a direction parallel to the Z-axis (Z-axis direction) by moving surface plate 14A and surface plate 145 in directions in which the surface plates move apart from each other, and in the state after such movement, moving surface plate 14A and surface plate 145 in the −Z direction orthogonal to the XY plane. Then, after the movement away from the measurement bar, by moving surface plate 14A and surface plate 145 in a predetermined direction within the XY plane, e.g. in the −X direction, together with base boards 12A and 12B that support the surface plates, surface plate 14A and surface plate 145 can be pulled out to the outside of the exposure apparatus. This facilitates, for example, the maintenance and the like of the surface plates, the components (such as the wafer stages) mounted on the surface plates, and the like.

Further, according to exposure apparatus 100 of the embodiment, at least a part of encoder heads 75x, 75ya and 75yb, which irradiate the measurement beams on the measurement surfaces of fine movement stages WFS1 and WFS2 parallel to the XY plane and receive light from gratings RG placed on the measurement surfaces, is placed at measurement bar 71 that is placed on the side (−Z side) opposite to projection optical system PL with respect to the guide surface (the upper surfaces of surface plates 14A and 14B) used on movement of fine movement stages WFS1 and WFS2 (wafer stages WST1 and WST2). Further, during the exposure operation and during the wafer alignment (mainly, during the measurement of the alignment marks), first measurement head group 72 and second measurement head group 73 fixed to measurement bar 71 are respectively used in the measurement of the positional information (the positional information within the XY plane and the surface position information) of fine movement stage WFS1 (or WFS2) that holds wafer W. And, encoder heads 75x, 75ya and 75yb and Z heads 76a to 76c that configure first measurement head group 72, and encoder heads 77x, 77ya and 77yb and Z heads 78a to 78c that configure second measurement head group 73 can respectively irradiate grating RG placed on the bottom surface of fine movement stage WFS1 (or WFS2) with measurement beams from directly below at the shortest distance. Therefore, measurement error of encoder heads 75x, 75ya, 75yb and the like caused by temperature fluctuation of the surrounding atmosphere of wafer stage WST1 or WST2, e.g., air fluctuation is reduced, and high-precision measurement of the positional information of fine movement stages WFS1 and WFS2 can be performed. Consequently, even if the size of fine movement stages WFS1 and WFS2 is increased, the positional information of fine movement stages WFS1 and WFS2 is measured with high precision by fine movement stage position measuring system 70, and based on the measurement information, i.e., the positional information of fine movement stages WFS1 and WFS2 that has been measured with high precision, main controller 20 controls the positions of fine movement stages WFS1 and WFS2 with high precision.

Further, first measurement head group 72 measures the positional information within the XY plane and the surface position information of fine movement stage WFS1 (or WFS2) at the point that substantially coincides with the exposure position that is the center of exposure area IA on wafer W, and second measurement head group 73 measures the positional information within the XY plane and the surface position information of fine movement stage WFS2 (or WFS1) at the point that substantially coincides with the center of the detection area of primary alignment system AL1. Consequently, occurrence of the so-called Abbe error caused by the positional error within the XY plane between the measurement point and the exposure position is restrained, and also in this regard, high-precision measurement of the positional information of fine movement stage WFS1 or WFS2 can be performed.

Further, based on the measurement values of measurement bar position measuring system 67, the position in the directions of six degrees of freedom of measurement bar 71 that has first measurement head group 72 and second measurement head group 73 is constantly controlled by main controller 20 via measurement bar driving system 65 such that the relative position with respect to main frame BD does not vary. Consequently, main controller 20 can accurately perform position control of wafer stage WST1 (or WST2) with the optical axis of projection optical system PL held by barrel 40 serving as a reference, via at least one of fine movement stage driving system 64A and coarse movement stage driving system 62A (or at least one of fine movement stage driving system 64B and coarse movement stage driving system 62B), based on the positional information measured by first measurement head group 72. Further, main controller 20 can accurately perform position control of wafer stage WST1 (or WST2) with the detection center of primary alignment system AL1 serving as a reference, via at least one of fine movement stage driving system 64A and coarse movement stage driving system 62A (or at least one of fine movement stage driving system 64B and coarse movement stage driving system 62B), based on the positional information measured by second measurement head group 73. Further, since measurement bar 71 is in a mechanically noncontact state with surface plates 14A and 14B, base board 12 and the like, measurement bar 71 and hence first measurement head group 72 and second measurement head group 73 are not affected by reaction forces of drive forces of wafer stages WST1 and WST2, although surface plates 14A and 14B have the stators that configure the planar motors. Further, since measurement bar 71 is placed below surface plates 14A and 14B so as to mechanically be separated from main frame BD, the measurement accuracy of the positional information of fine movement stage WFS1 (or WFS2) by fine movement stage position measuring system 70 is not degraded owing to deformation (e.g. twist) of measurement bar 71 caused by inner stress (including thermal stress) and transmission of vibration from main frame BD to measurement bar 71, and the like, which is different from the case where main frame BD and measurement bar 71 are integrated.

Further, in wafer stages WST1 and WST2 in the present embodiment, since coarse movement stage WCS1 (or WCS2) is placed on the periphery of fine movement stage WFS1 (or WFS2), wafer stages WST1 and WST2 can be reduced in size in the height direction (Z-axis direction), compared with a wafer stage that has a coarse/fine movement configuration in which a fine movement stage is mounted on a coarse movement stage. Therefore, the distance in the Z-axis direction between the point of action of the thrust of the planar motors that configure coarse movement stage driving systems 62A and 62B (i.e. the point between the bottom surface of coarse movement stage WCS1 (WCS2) and the upper surfaces of surface plates 14A and 14B) and the center of gravity of wafer stages WST1 and WST2 can be decreased, and accordingly, the pitching moment (or the rolling moment) generated when wafer stages WST1 and WTS2 are driven can be reduced. Consequently, the operations of wafer stages WST1 and WST2 become stable.

Further, in exposure apparatus 100 of the present embodiment, the surface plate that sets the guide surface used when wafer stages WST1 and WST2 move along the XY plane is configured of the two surface plates 14A and 14B so as to correspond to the two wafer stages WST1 and WST2. These two surface plates 14A and 14B independently function as the countermasses when wafer stages WST1 and WST2 are driven by the planar motors (coarse movement stage driving systems 62A and 62B), and therefore, for example, even when wafer stage WST1 and wafer stage WST2 are respectively driven in directions opposite to each other in the Y-axis direction on surface plates 14A and 14B, surface plates 14A and 14B can individually cancel the reaction forces respectively acting on the surface plates.

Incidentally, in the embodiment above, while the case has been described where both the −X side components of stage device 50 that includes surface plate 14A and the +X side components of stage device 50 that includes surface plate 14B carried to the outside of the exposure apparatus, this is not intended to be limiting. Since it is relatively easy to move base boards 12A and 12B by making base boards 12A and 12B levitated by hover members 19 of support sections 16, only either of the −X side components and the +X side components of stage device 50 can be carried to the outside of the exposure apparatus. Further, the −X side components and the +X side components of stage device 50 can be carried out to different directions. Further, it is also possible that a configuration in which base boards 12A and 12B are fixed on the floor surface is employed, and at least one of surface plates 14A and 14B is carried out to the outside of the exposure apparatus.

Further, in the embodiment above, while the guide surface used when wafer stages WST1 and WST2 is formed by the upper surfaces of the two surface plates 14A and 14B, this is not intended to be limiting. For example, the guide surface used on movement of wafer stages WST1 and WST2 can be formed by the upper surface of a surface plate that can be separated into a first section and a second, section via a border line by moving at least one of the first and second sections in a predetermined direction within the XY plane. In this case, after the surface plate is separated into the first and second sections, at least one of the first and second sections is relatively moved with respect to measurement bar 71 in the Z-axis direction, thereby being moved away from measurement bar 71. Then, after the movement away from measurement bar 71, at least one of the first and second sections are moved in a predetermined direction within the XY plane, which makes it possible to pull out the first and second sections of the surface plate to the outside. This facilitates, for example, the maintenance and the like of the surface plate, the components mounted on the surface plate, and the like.

Further, in the embodiment above, while the case has been described where surface plates 14A and 14B are respectively and individually supported by base boards 12A and 12B, this is not intended to be limiting, and surface plates 14A and 14B can be supported by a single base member so as to be movable within the XY plane. In this case as well, it is also possible that the base member is separable into two sections that individually support surface plate 14A (a first section) and surface plate 14B (a second section).

Further, in the embodiment above, while the case has been described where main controller 20 controls the position of measurement bar 71 based on the measurement values of measurement bar position measuring system 67 such that the relative position with respect to projection optical system PL does not vary, this is not intended to be limiting. For example, main controller 20 can control the positions of fine movement stages WFS1 and WFS2 by driving coarse movement stage driving systems 62A and 62B and/or fine movement stage driving systems 64A and 64B based on positional information measured by measurement bar position measuring system 67 and positional information measured by fine movement stage position measuring system 70 (e.g. by correcting the measurement value of fine movement stage position measuring system 70 using the measurement value of measurement bar position measuring system 67), without controlling the position of measurement bar 71.

Further, in the embodiment above, although surface plates 14A and 14B and base boards 12A and 12B are moved in the −Z direction with respect to measurement bar 71 when surface plates 14A and 14B and the like are carried to the outside of the exposure apparatus, this is not intended to be limiting. For example, a configuration can be employed in which measurement bar 71 is movable in the +Z direction with respect to surface plates 14A and 14B and base boards 12A and 12B, or a configuration can be employed in which surface plates 14A and 14B, base boards 12A and 12B and the like are movable in the −Z direction and also measurement bar 71 is movable in the +Z direction.

Incidentally, in the embodiment above, while the case has been described where the positional relation between main frame BD and measurement bar 71 is maintained constant by measuring the position of measurement bar 71 (the relative position with respect to main frame BD, or variation in the position with respect to a reference position) and finely adjusting the position of measurement bar 71 with an actuator or the like, this is not intended to be limiting. For example, measurement bar 71 is not supported by levitation but fixed to suspended support members 74a and 74b, and measurement bar 71 and main frame BD are integrated, and thereby the positional relation between measurement bar 71 and main frame BD can be maintained constant.

Further, the position of the border line that separates the surface plate or the base member into a plurality of sections is not limited to the position as in the embodiment above. While the border line is set as the line that includes reference axis LV and intersects optical axis AX in the embodiment above, the border line can be set at another position, for example, in the case where, if the boundary is located in the exposure station, the thrust of the planar motor at the portion where the boundary is located weakens.

Further, while the exposure apparatus of the embodiment above has the two surface plates corresponding to the two wafer stages, the number of the surface plates is not limited thereto, and one surface plate or three or more surface plates can be employed. Further, the number of the wafer stages is not limited to two, but one wafer stage or three or more wafer stages can be employed, and a measurement stage, for example, which has an aerial image measuring instrument, an uneven illuminance measuring instrument, an illuminance monitor, a wavefront aberration measuring instrument and the like, can be placed on the surface plate, which is disclosed in, for example, U.S. Patent Application Publication No. 2007/0201010.

Further, the mid portion (which can be arranged at a plurality of positions) in the longitudinal direction of measurement bar 71 can be supported on the base board by an empty-weight canceller as disclosed in, for example, U.S. Patent Application Publication No, 2007/0201010.

Further, the motor to drive surface plates 14A and 14B on base board 12 is not limited to the planar motor by the electromagnetic force (Lorentz force) drive method, but for example, can be a planar motor (or a linear motor) by a variable magnetoresistance drive method. Further, the motor is not limited to the planar motor, but can be a voice coil motor that includes a mover fixed to the side surface of the surface plate and a stator fixed to the base board. Further, the surface plates can be supported on the base board via the empty-weight canceller as disclosed in, for example, U.S. Patent Application Publication No. 2007/0201010 and the like. Further, the drive directions of the surface plates are not limited to the directions of three degrees of freedom, but for example, can be the directions of six degrees of freedom, only the Y-axis direction, or only the XY two-axial directions. In this case, the surface plates can be levitated above the base board by static gas bearings (e.g. air bearings) or the like. Further, in the case where the movement direction of the surface plates can be only the Y-axis direction, the surface plates can be mounted on, for example, a Y guide member arranged extending in the Y-axis direction so as to be movable in the Y-axis direction.

Further, in the embodiment above, while the grating is placed on the lower surface of the fine movement stage, i.e., the surface that is opposed to the upper surface of the surface plate, this is not intended to be limiting, and the main section of the fine movement stage is made up of a solid member that can transmit light, and the grating can be placed on the upper surface of the main section. In this case, since the distance between the wafer and the grating is closer compared with the embodiment above, the Abbe error, which is caused by the difference in the Z-axis direction between the surface subject to exposure of the wafer that includes the exposure point and the reference surface (the placement surface of the grating) of position measurement of the fine movement stage by encoders 51, 52 and 53, can be reduced. Further, the grating can be formed on the back surface of the wafer holder. In this case, even if the wafer holder expands or the attachment position with respect to the fine movement stage shifts during exposure, the position of the wafer holder (wafer) can be measured according to the expansion or the shift.

Further, in the embodiment above, while the case has been described as an example where the encoder system is equipped with the X head and the pair of Y heads, this is not intended to be limiting, and for example, one or two two-dimensional heads) (2D head(s)) whose measurement directions are the two directions that are the X-axis direction and the Y-axis direction can be placed inside the measurement bar. In the case of arranging the two 2D heads, their detection points can be set at the two points that are spaced apart in the X-axis direction at the same distance from the exposure position as the center, on the grating. Further, in the embodiment above, while the number of the heads is one X head and two heads, the number of the heads can further be increased. Moreover, first measurement head group 72 on the exposure station 300 side can further have a plurality of head groups. For example, on each of the sides (the four directions that are the +X, +Y, -X and -Y directions) on the periphery of the head group placed at the position corresponding to the exposure position (a shot area being exposed on wafer W), another head group can be arranged. And, the position of the fine movement stage (wafer W) just before exposure of the shot area can be measured in a so-called read-ahead manner.

Further, a temperature sensor, a pressure sensor, an acceleration sensor for vibration measurement, and the like can be arranged at measurement bar 71. Further, a distortion sensor, a displacement sensor and the like to measure deformation (such as twist) of measurement bar 71 can be arranged. Then, it is also possible to correct the positional information obtained by fine movement stage position detecting system 70 and/or coarse movement stage position detecting systems 68A and 68B, using the values obtained by these sensors.

Further, in the embodiment above, the measurement beams emitted from the encoder heads and the measurement beams emitted from the Z heads are irradiated on the gratings of the fine movement stages via a gap between the two surface plates or the light-transmitting section formed at each of the surface plates. In this case, as the light-transmitting section, holes each of which is slightly larger than a beam diameter of each of the measurement beams are formed at each of surface plates 14A and 14B taking the movement range of surface plate 14A or 14B as the countermass into consideration, and the measurement beams can be made to pass through these multiple opening sections. Further, for example, it is also possible that pencil-type heads are used as the respective encoder heads and the respective Z heads, and opening sections in which these heads are inserted are formed at each of the surface plates.

Further, in the embodiment above, the case has been described where the liquid immersion area (liquid Lq) is constantly maintained below projection optical system PL by delivering the liquid immersion area (liquid Lq) between fine movement stage WFS1 and fine movement stage WFS2 via coupling members 92b that coarse movement stages WCS1 and WCS2 are respectively equipped with. However, this is not intended to be limiting, and it is also possible that the liquid immersion area (liquid Lq) is constantly maintained below projection optical system. PL by moving a shutter member (not illustrated) having a configuration similar to the one disclosed in, for example, the third embodiment of U.S. Patent Application Publication No. 2004/0211920, to below projection optical system PL in exchange of wafer stages WST1 and WST2.

Second Embodiment

Next, a second embodiment of the present invention is described with reference to FIGS. 16 to 24. Herein, the same or similar reference signs are used for the components that are the same as or similar to those in the first embodiment described previously, and the description thereabout is simplified or omitted.

Figure 16:
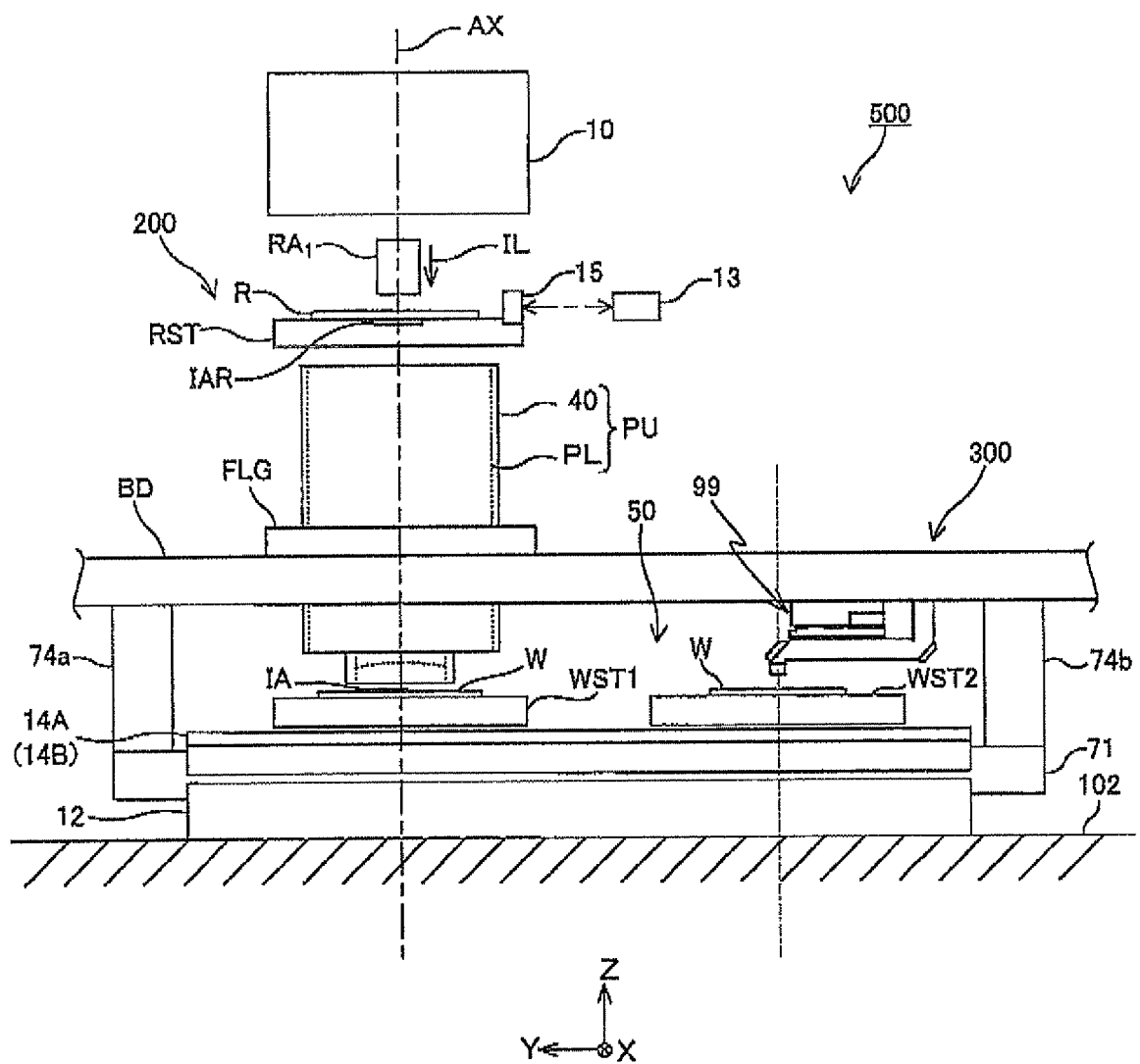
FIG. 16 is a view schematically showing a configuration of an exposure apparatus of a second embodiment.
Figure 17:
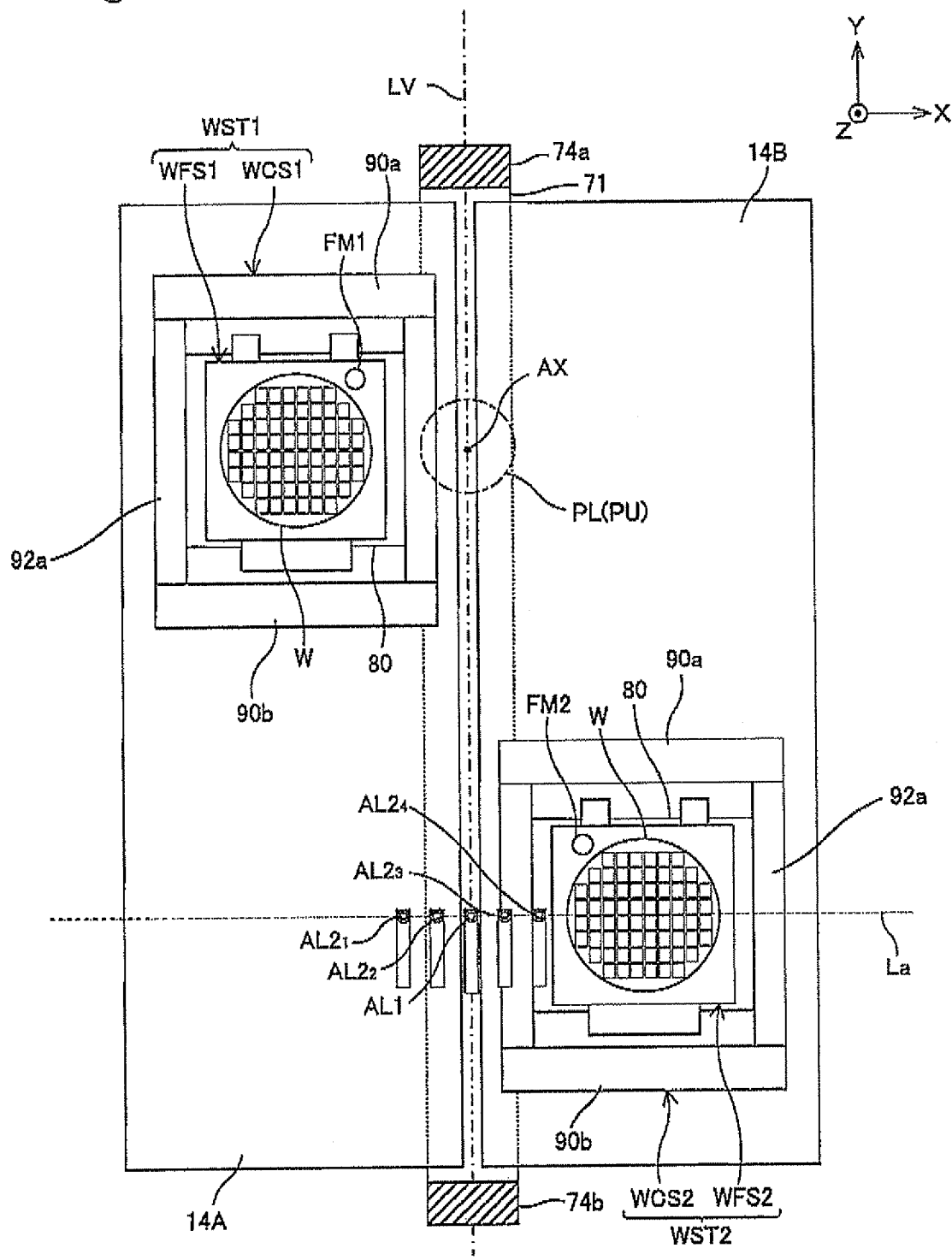
FIG. 17 is a plan view of the exposure apparatus of FIG. 16.
Figure 18:
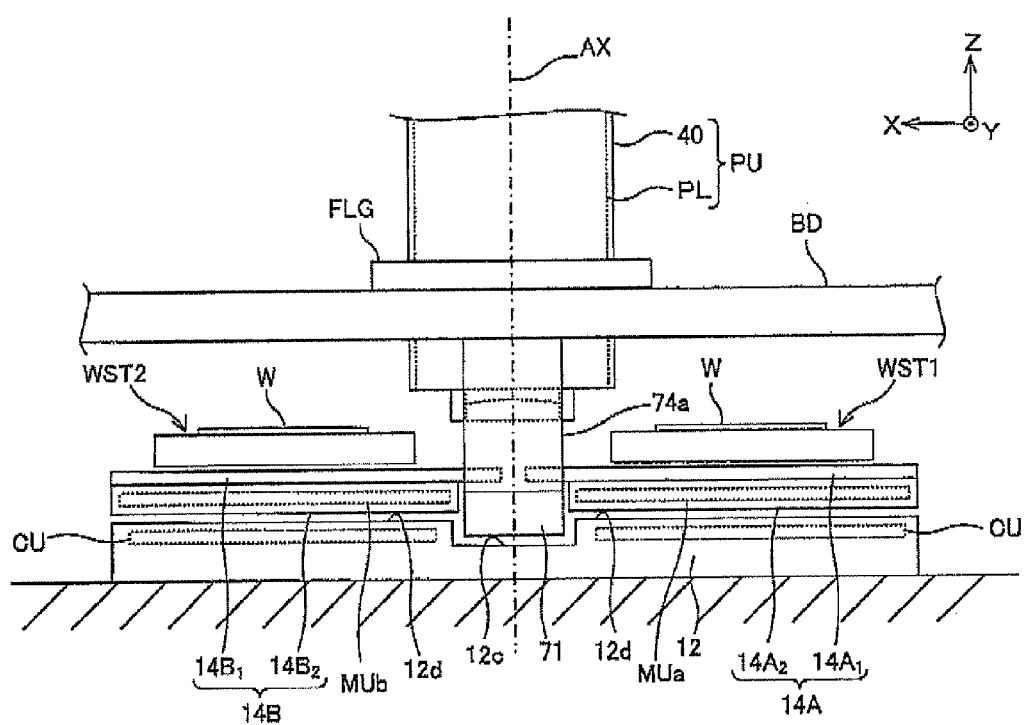
FIG. 18 is a side view of the exposure apparatus of FIG. 16 when viewed from the +Y side.
Figure 19:
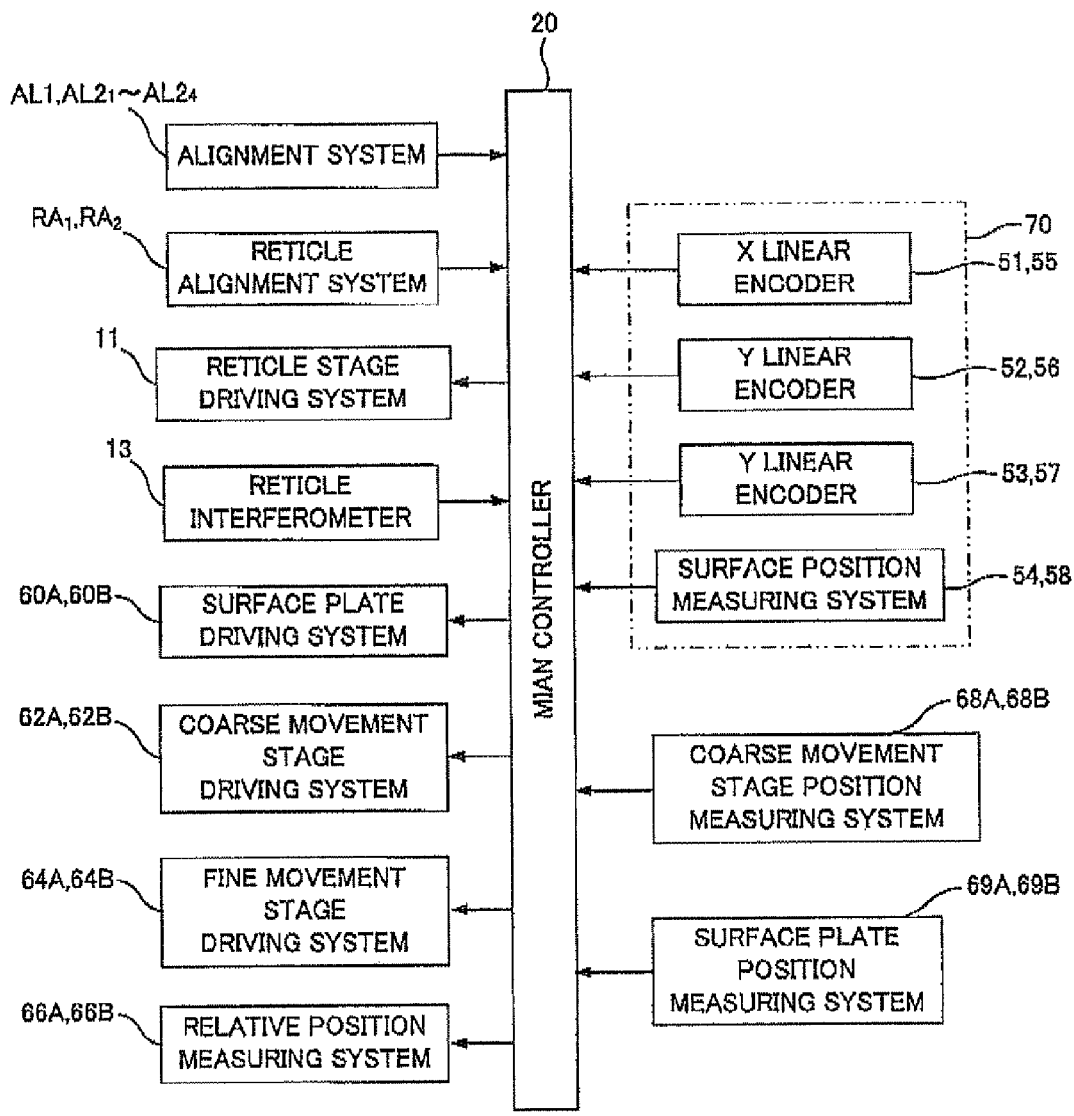

FIG. 16 schematically shows a configuration of an exposure apparatus of the second embodiment, FIG. 17 shows a plan view of the exposure apparatus of FIG. 16, and FIG. 18 shows a side view of the exposure apparatus of FIG. 16 when viewed from the +Y side. And, FIG. 19 shows input/output relations of a main controller which the exposure apparatus of FIG. 16 is equipped with.

An exposure apparatus 500 of the second embodiment is a dry type scanner that performs exposure of wafer W without liquid (water), which is different from exposure apparatus 100 of the first embodiment described earlier. In exposure apparatus 500, a single base board 12 is arranged instead of the two base boards 12A and 12B, and measurement bar 71 is fixed to a pair of suspended support members 74*a* and 74*b* and is integrated with the suspended support members.

Base board 12 is made up of a member having a tabular outer shape, and as shown in FIG. 16, is substantially horizontally (parallel to the XY plane) supported via a vibration isolating mechanism (the illustration is omitted) on floor surface 102. In the center portion in the X-axis direction of the upper surface of base board 12, a recessed section 12*c* (recessed groove) extending in a direction parallel to the Y-axis is formed, as shown in FIG. 18. On the upper surface side of base board 12 (excluding a portion where recessed section 12*c* is formed, in this case), a coil unit CU is housed that includes a plurality of coils placed in a matrix shape with the XY two-dimensional directions serving as a row direction and a column direction.

As shown in FIG. 18, surface plates 14A and 14B are supported on upper surfaces 12*d* of both side portions of recessed section 12*c* of base board 12 via air bearings (or rolling bearings) that are not illustrated.

Inside (on the bottom portion of) second section 14A$_2$ of surface plate 14A, a magnetic unit Ma (see FIG. 18), which is made up of a plurality of permanent magnets (and yokes that are not illustrated) placed in a matrix shape with the XY two-dimensional directions serving as a row direction and a column direction, is housed so as to correspond to coil unit CU housed on the upper surface side of base board 12. Magnetic unit MUa configures, together with coil unit CU of base board 12, surface plate driving system 60A (see FIG. 19) that is made up of a planar motor by the electromagnetic force (Lorentz force) drive method that is disclosed in, for example, U.S. Patent Application Publication No 2003/0085676 and the like. Surface plate driving system 60A generates a drive farce that drives surface plate 14A in directions of three degrees of freedom (X, Y, θz) within the XI plane.

Similarly, inside (on the bottom portion of) second section 14B$_2$ of surface plate 14B, a magnetic unit MUb made up of a plurality of permanent magnets (and yokes that are not illustrated) is housed that configures, together with coil unit CU of base board 12, surface plate driving system 60B (see FIG. 19) made up of a planar motor that drives surface plate 14B in the directions of three degrees of freedom within the XI plane. Incidentally, the placement of the coil unit and the magnetic unit of the planar motor that configures each of surface plate driving systems 60A and 60B can be reverse (a moving coil type that has the magnetic unit on the base board side and the coil unit on the surface plate side) to the above-described case (a moving magnet type).

As shown in FIGS. 16 and 18, measurement bar 71 that configures a part of fine movement stage position measuring system 70 is placed below first sections 14A$_1$ and 14B$_1$ that the pair of surface plates 14A and 14B respectively have. Measurement bar 71 is made up of a beam-like member having a rectangular sectional shape with the Y-axis direction serving as its longitudinal direction, and both ends in the longitudinal direction are fixed to main frame BD in a suspended state via the pair of suspended support members 74*a* and 74*b* respectively. More specifically, main frame BD and measurement bar 71 are integrated. The +Z side half (upper half) of measurement bar 71 is placed between second section 14A$_2$ of surface plate 14A and second section 14B$_2$ of surface plate 14B, and the −Z side half (lower half) is housed inside recessed section 12*c* formed at base board 12. Further, a predetermined clearance is formed between measurement bar 71 and each of surface plates 14A and 14B and base board 12, and measurement bar 71 is in a state mechanically noncontact with the members other than main frame BD. Measurement bar 71 is formed by a material with a relatively low coefficient of thermal expansion (e.g. invar, ceramics, or the like). Incidentally, the shape of measurement bar 71 is not limited in particular. For example, it is also possible that the measurement member has a circular cross section (a cylindrical shape), or a trapezoidal or triangle cross section. Further, the measurement bar does not necessarily have to be formed by a longitudinal member such as a bar-like member or a beam-like member.

The other parts are configured similar to those of exposure apparatus 100 of the first embodiment described earlier.

Next, a parallel processing operation using the two wafer stages WST1 and WST2 in exposure apparatus 500 of the present second embodiment is described with reference to FIGS. 20 to 24.

Figure 20:
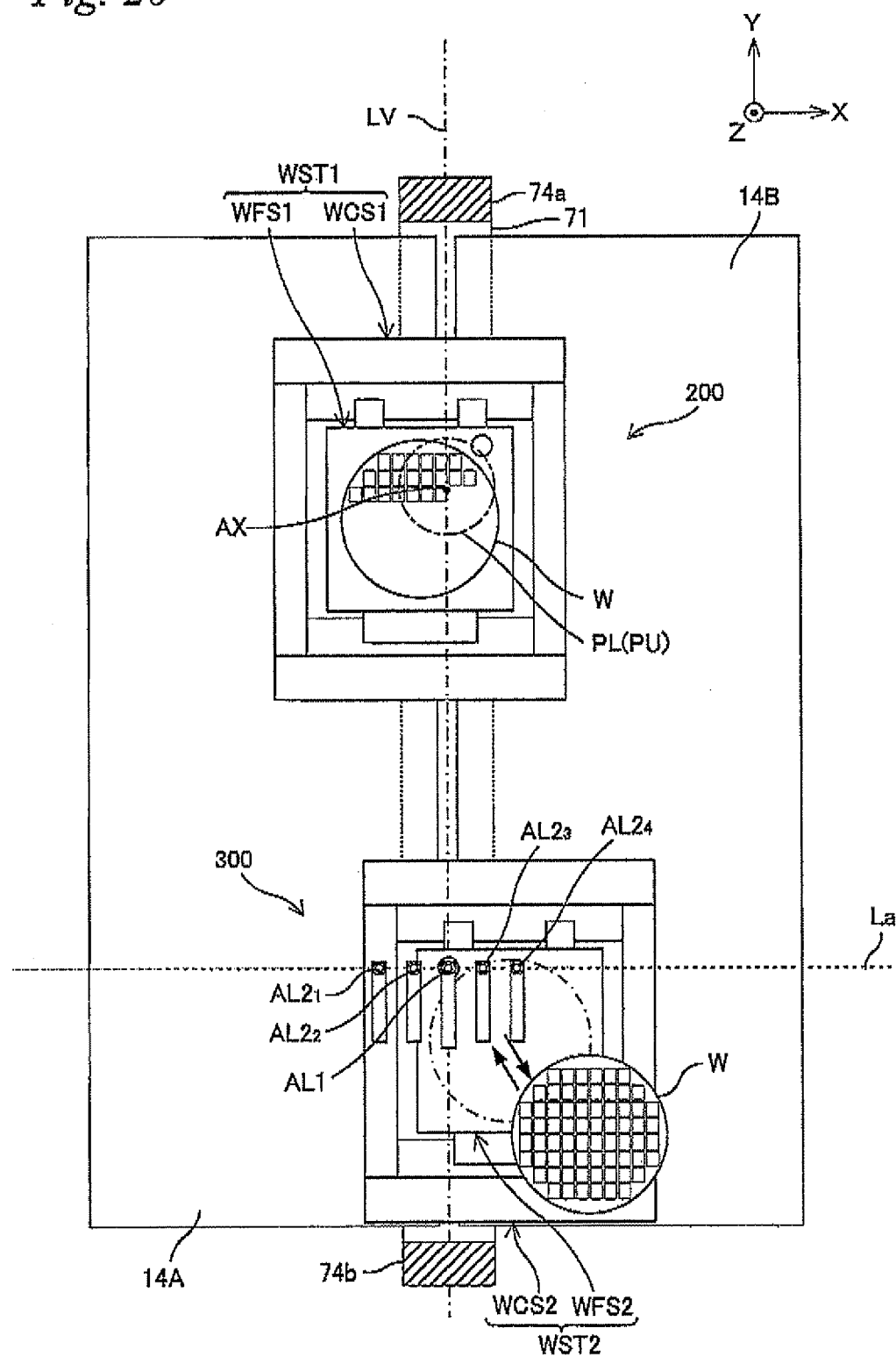
FIG. 20 is a view showing a state where exposure is performed on a wafer mounted on wafer stage WST1 and wafer exchange is performed on a wafer stage WST2 in the exposure apparatus of the second embodiment.

FIG. 20 shows a state where exposure by a step-and-scat method is performed on wafer W mounted on fine movement stage WFS1 of wafer stage WST1 in exposure station 200, and in parallel with this exposure, wafer exchange is performed between a wafer carrier mechanism (not illustrated) and fine movement stage WFS2 of wafer stage WST2 at the second loading position.

Main controller 20 performs the exposure operation by a step-and-scan method by repeating an inter-shot movement (stepping between shots) operation of moving wafer stage WST1 to a scanting starting position (acceleration starting position) for exposure of each shot area on wafer W, based on the results of wafer alignment (e.g. information obtained by converting an arrangement coordinate of each shot area on wafer W obtained by an enhanced Global Alignment (EGA) into a coordinate with the second fiducial mark on measurement plate FM1 serving as a reference) and reticle alignment and the like that have been performed beforehand, and a scanning exposure operation of transferring a pattern formed on reticle R onto each shot area on wafer W by a scanning exposure method. During this step-and-scan operation, surface plates 14A and 14B exert the function as the counter-masses, as described previously, according to movement of wafer stage WST1, for example, in the Y-axis direction during scanning exposure. Further, main controller 20 gives the initial velocity to coarse movement stage WCS1 when driving fine movement stage WFS1 in the X-axis direction for the stepping operation between shots, and thereby coarse movement stage WCS1 functions as a local countermass with respect to fine movement stage WFS1. Consequently, the movement of wafer stage WST1 (coarse movement stage WCS1 and fine movement stage WFS1) does not cause vibration of surface plates 14A and 14B and does not adversely affect wafer stage WST2.

In exposure apparatus 500 of the present second embodiment, during a series of the exposure operations described above, main controller 20 measures the position of fine movement stage WFS1 using first measurement head group 72 of fine movement stage position measuring system 70 and controls the position of fine movement stage WFS1 (wafer W) based on this measurement result.

The wafer exchange is performed by unloading a wafer that has been exposed from fine movement stage WFS2 and loading a new wafer onto fine movement stage WFS2 by the wafer carrier mechanism that is not illustrated, when fine movement stage WFS2 is located at the second loading position. In this case, the second loading position is a position where the wafer exchange is performed on wafer stage WST2, and in the present second embodiment, the second loading position is to be set at the position where fine movement stage WFS2 (wafer stage WST2) is located such that measurement plate FM2 is positioned directly under primary alignment system AU.

During the wafer exchange described above, and after the wafer exchange, while wafer stage WST2 stops at the second loading position, main controller 20 executes reset (resetting of the origin) of second measurement head group 73 of fine movement stage position measuring system 70, or more specifically, encoders 55, 56 and 57 (and surface position measuring system 58), prior to start of wafer alignment (and the other pre-processing measurements) with respect to the new wafer W.

When the wafer exchange (loading of the new wafer W) and the reset of encoders 55, 56 and 57 (and surface position measuring system 58) have been completed, main controller 20 detects the second fiducial mark on measurement plate FM2 using primary alignment system AL1. Then, main controller 20 detects the position of the second fiducial mark with the index center of primary alignment system AL1 serving as a reference, and based on the detection result and the result of position measurement of fine movement stage WFS2 by encoders 55, 56 and 57 at the time of the detection, computes the position coordinate of the second fiducial mark in an orthogonal coordinate system (alignment coordinate system) with reference axis La and reference axis LV serving as coordinate axes.

Figure 21:
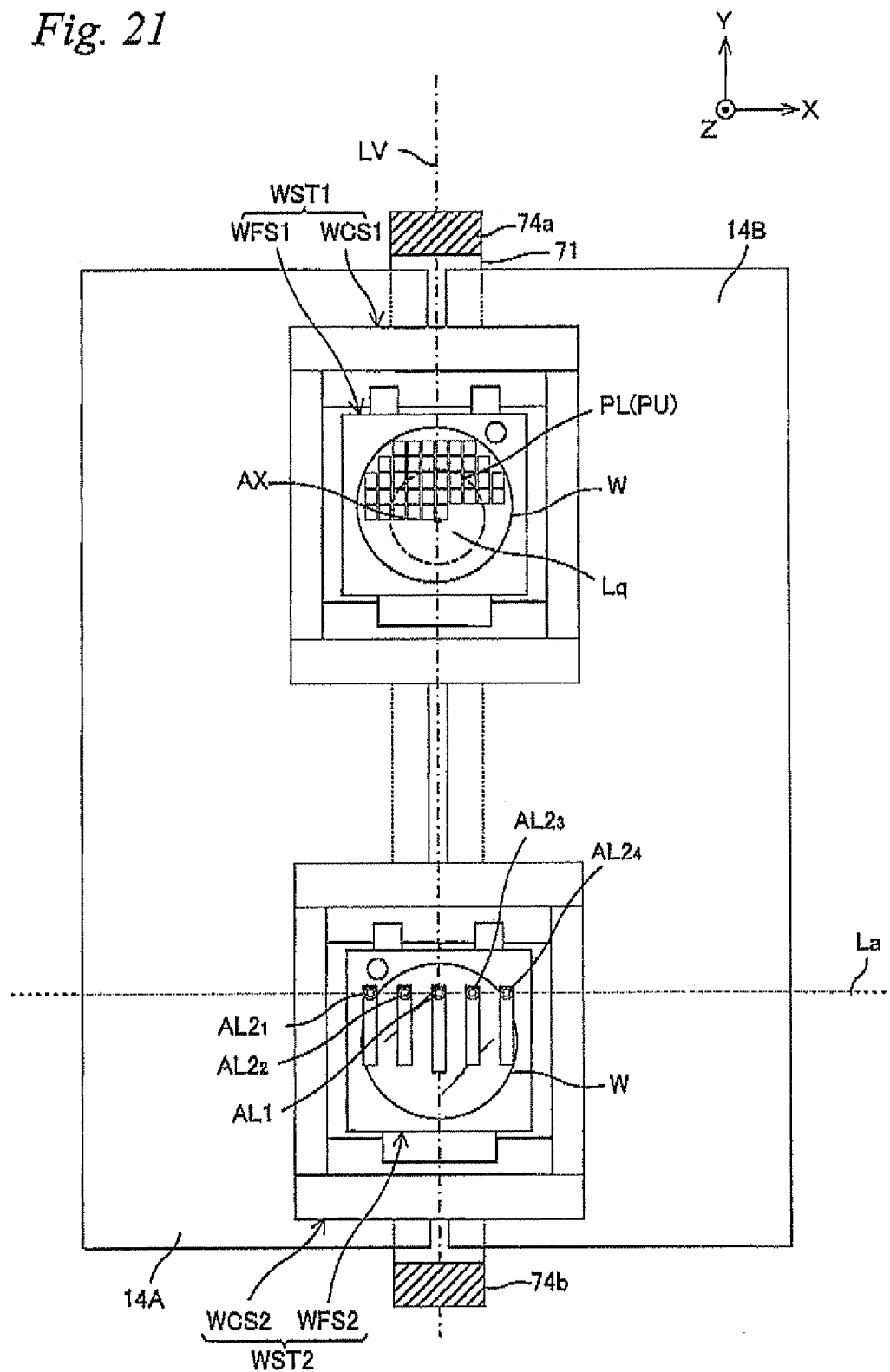
FIG. 21 is a view showing a state where exposure is performed on a wafer mounted on wafer stage WST1 and wafer alignment is performed with respect to a wafer mounted on wafer stage WST2 in the exposure apparatus of the second embodiment.

Next, main controller 20 performs the EGA while measuring the position coordinate of fine movement stage WFS2 (wafer stage WST2) in the alignment coordinate system using encoders 55, 56 and 57 (see FIG. 21). To be more specific, as disclosed in, for example, U.S. Patent Application Publication No. 2008/0088843 and the like, main controller 20 moves wafer stage WST2, or more specifically, coarse movement stage WCS2 that supports fine movement stage WFS2 in, for example, the Y-axis direction, and sets the position of fine movement stage WFS2 at a plurality of positions in the movement course, and at each position setting, detects the position coordinates, in the alignment coordinate system, of alignment marks at alignment shot areas (sample shot areas) using at least one of alignment systems AL1 and $AL2_2$ and $AL2_4$. FIG. 21 shows a state of wafer stage WST2 when the detection of the position coordinates of the alignment marks in the alignment coordinate system is performed.

In this case, in conjunction with the movement operation of wafer stage WST2 in the Y-axis direction described above, alignment systems AL1 and $AL2_2$ to $AL2_4$ respectively detect a plurality of alignment marks (sample marks) disposed along the X-axis direction that are sequentially placed within the detection areas (e.g. corresponding to the irradiation areas of detection light). Therefore, on the measurement of the alignment marks described above, wafer stage WST2 is not driven in the X-axis direction.

Then, based on the position coordinates of the plurality of alignment marks arranged at, the sample shot areas on wafer W and the design position coordinates, main controller 20 executes statistical computation (EGA computation) disclosed in, for example, U.S. Pat. No. 4,780,617 and the like, and computes the position coordinates (arrangement coordinates) of the plurality of shot areas in the alignment coordinate system.

Further, in exposure apparatus 500 of the present second embodiment, since measurement station 300 and exposure station 200 are spaced apart, main controller 20 subtracts the position coordinate of the second fiducial mark that has previously been detected from the position coordinate of each of the shot areas on wafer W that has been obtained as a result of the wafer alignment, thereby obtaining the position coordinates of the plurality of shot areas on wafer W with the position of the second fiducial mark serving as the origin.

Normally, the above-described wafer exchange and wafer alignment sequence is completed earlier than the exposure sequence. Therefore, when the wafer alignment has been completed, main controller 20 drives wafer stage WST2 in the +X direction to move wafer stage WST2 to a predetermined standby position on surface plate 14B. In this case, when wafer stage WST2 is driven in the +X direction, fine movement stage WFS2 goes out of a measurable range of fine movement stage position measuring system 70 (i.e. the respective measurement beams irradiated from second measurement head group 73 move off from grating RG). Therefore, based on the measurement values of fine movement stage position measuring system 70 (encoders 55, 56 and 57) and the measurement values of relative position measuring system 663, main controller 20 obtains the position of coarse movement stage WCS2, and afterward, controls the position of wafer stage WST2 based on the measurement values of coarse movement stage position measuring system 68B. More specifically, position measurement of wafer stage WST2 within the XY plane is switched from the measurement using encoders 55, 56 and 57 to the measurement using coarse movement stage position measuring system 68B. Then, main controller 20 makes wafer stage WST2 wait at the predetermined standby position described above until exposure on wafer W on fine movement stage WFS1 is completed.

Figure 22:
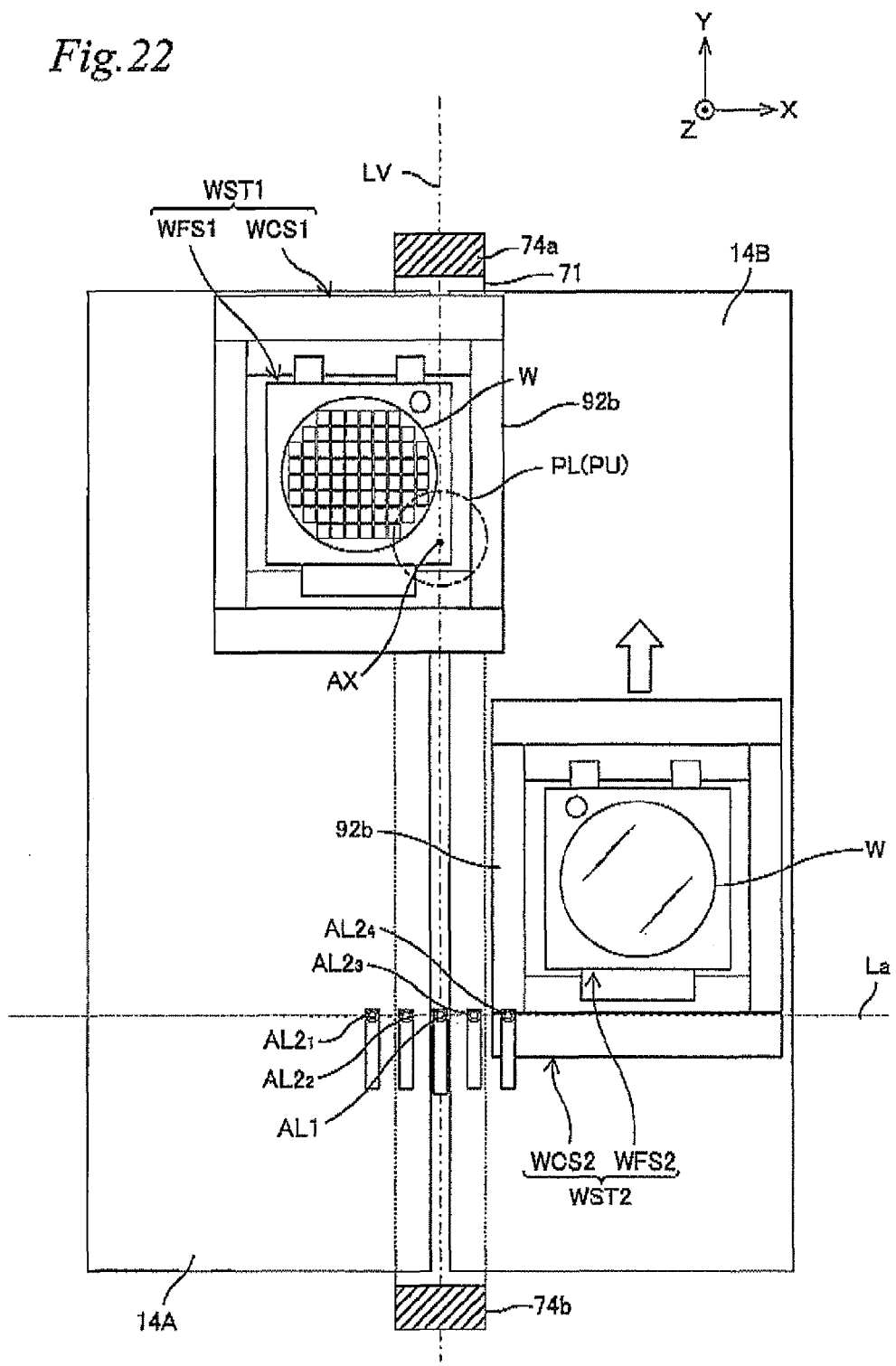
FIG. 22 is a view showing a state where wafer stage WST2 moves toward an exposure station on a guide surface forming member 14B in the exposure apparatus of the second embodiment.

When the exposure on wafer W on fine movement stage WFS1 has been completed, main controller 20 drives wafer stage WST1 in the -X direction to move wafer stage WST1 to the -X side on surface plate 14A, in order to perform replacement of the wafer stage with respect to exposure station 200 (in this case, the replacement from wafer stage WST1 to wafer stage WST2). On this operation, fine movement stage WFS1 goes out of the measurable range of fine Movement stage position measuring system 70 (encoders 51, 52 and 53 and surface position measuring system 54) (i.e. the measurement beams irradiated from first measurement head group 72 move off from grating RG). Therefore, based on the measurement values of fine movement stage position measuring system 70 (encoders 51, 52 and 53) and the measurement values of relative position measuring system 66A, main controller 20 obtains the position of coarse movement stage WCS1, and afterward, controls the position of wafer stage WST1 based on the measurement values of coarse movement stage position measuring system 68A. More specifically, main controller 20 switches position measurement of wafer stage WST1 within the XY plane from the measurement using encoders 51, 52 and 53 to the measurement using coarse movement stage position measuring system 68A. During this operation, main controller 20 measures the position of wafer stage WST2 using coarse movement stage position measuring system 68B, and based on the measurement result, drives wafer stage WST2 in the +Y direction (see an outlined arrow in FIG. 22) on surface plate 14B, as shown in FIG. 22. Owing to the action of a reaction force of this drive force of wafer stage WST2, surface plate 14B functions as the countermass. Further, when wafer stage WST2 moves in the +X direction, surface plate 14A can be made to function as the countermass owing to the action of a reaction force of the drive force.

Figure 23:
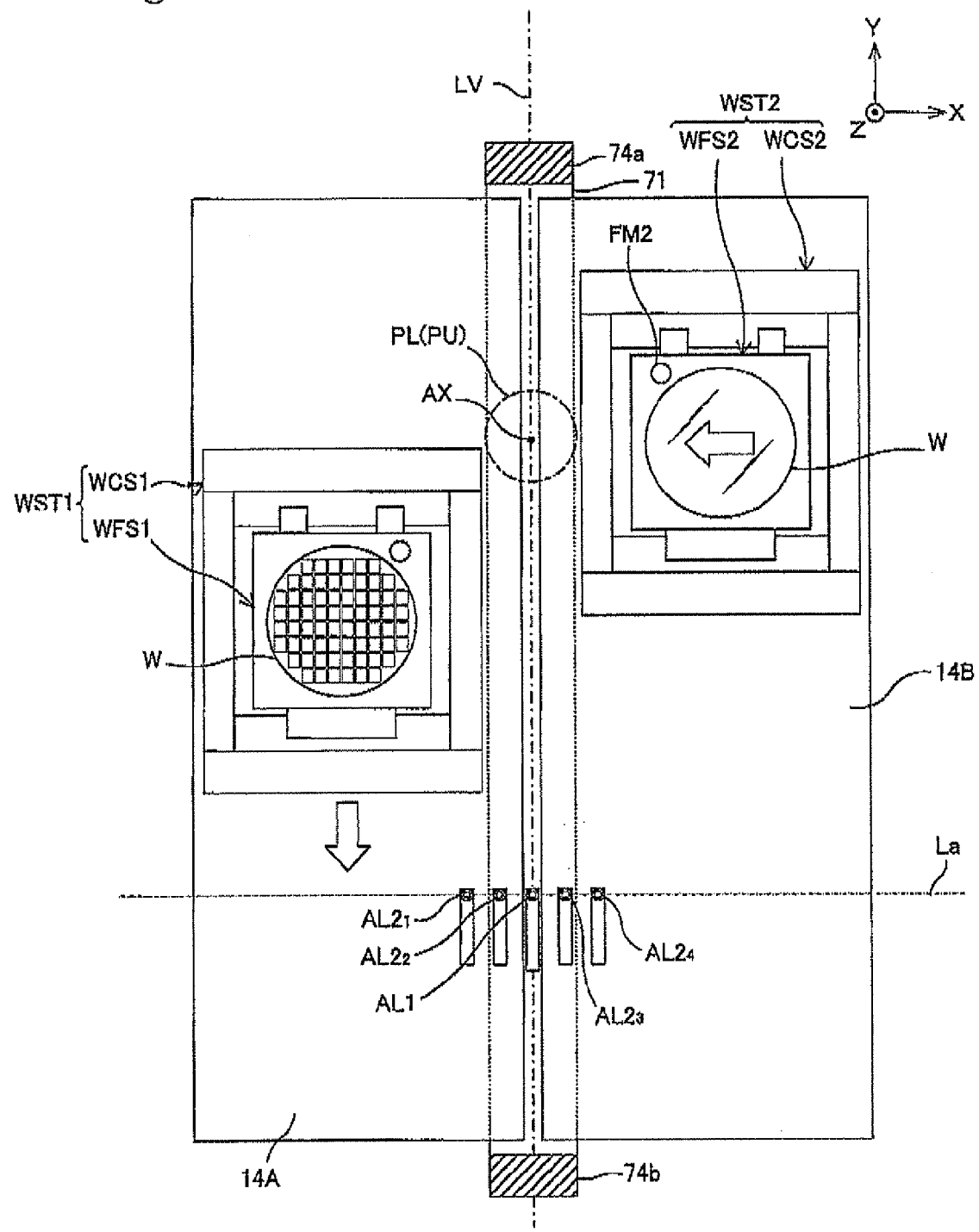
FIG. 23 is a view showing a state where a wafer stage located in the exposure station is replaced from wafer stage WST1 to wafer stage WST2 in the exposure apparatus of the second embodiment

Subsequently, in order to move wafer stage WST1 to the first loading position shown in FIG. 24, main controller 20 moves wafer stage WST1 in the −Y direction and further in the +X direction on surface palate 14A, as shown in FIG. 23, while measuring the position of wafer stage WST1 using coarse movement stage position measuring system 68A. In this case, on the movement of wafer stage WST1 in the −Y direction, surface plate 14A functions as the countermass owing to the action of a reaction force of the drive force.

Figure 24:
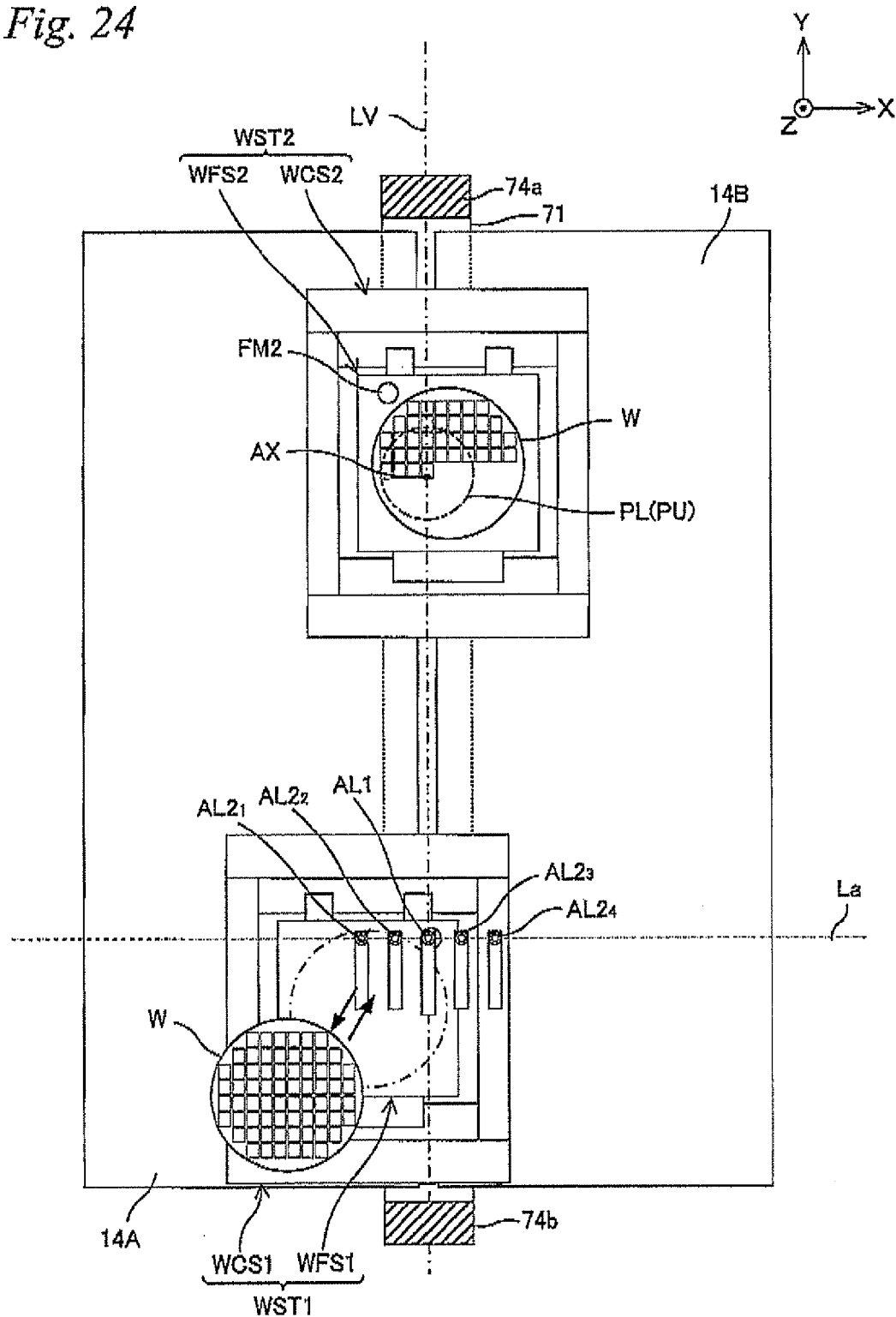
FIG. 24 is a view showing a state where exposure is performed on a wafer mounted on wafer stage WST2 and wafer exchange is performed on wafer stage WST1 in the exposure apparatus of the second embodiment.

After wafer stage WST1 has reached the first loading position shown in FIG. 24, main controller 20 switches position measurement of wafer stage WST1 within the XY plane from the measurement using coarse movement stage position measuring system 68A to the measurement using encoders 55, 56 and 57.

In parallel with the movement of wafer stage WST1 described above, as shown in FIG. 23, main controller 20 drives wafer stage WST2 in the −X direction and sets the position of measurement plate FM2 at a position directly under projection optical system PL. Prior to this operation, main controller 20 has switched position measurement of wafer stage WST2 within the XY plane from the measurement using coarse movement stage position measuring system 68B to the measurement using encoders 51, 52 and 53. Then, the pair of first fiducial marks on measurement plate FM2 are detected using reticle alignment systems $RA_1$ and $RA_2$ via projection optical system PL and the relative position of projected images, on the wafer, of the reticle alignment marks on reticle R that correspond to the first fiducial marks are detected.

Based on the relative positional information detected as above and the positional information of each of the shot areas on wafer W with the second fiducial mark on fine movement stage WFS2 serving as a reference that has been previously obtained, main controller 20 computes the relative positional relation between the projection position of the pattern of reticle R (the projection center of projection optical system PL) and each of the shot areas on wafer W mounted on fine movement stage WFS2. While controlling the position of fine movement stage WFS2 (wafer stage WST2) based on the computation results, main controller 20 transfers the pattern of reticle R onto each shot area on wafer W mounted on fine movement stage WFS2 by a step-and-scan method, which is similar to the case of wafer W mounted on fine movement stage WFS1 described earlier, FIG. 24 shows a state where the pattern of reticle R is transferred onto each shot area on wafer W in this manner.

In parallel with the above-described exposure operation on wafer W on fine movement stage WFS2, main controller 20 performs the wafer exchange between the wafer carrier mechanism (not illustrated) and wafer stage WST1 at the first loading position and mounts a new wafer W on fine movement stage WFS1. In this case, the first loading position is a position where the wafer exchange is performed on wafer stage WST1, and in the embodiment, the first loading position is to be set at the position where fine movement stage WFS1 (wafer stage WST1) is located such that measurement plate FM1 is positioned directly under primary alignment system AL1.

Then, main controller 20 detects the second fiducial mark on measurement plate FM1 using primary alignment system AL1. Note that, prior to the detection of the second fiducial mark, main controller 20 executes reset (resetting of the origin) of second measurement head group 73 of fine movement stage position measuring system 70, or more specifically, encoders 55, 56 and 57 (and surface position measuring system 58), in a state where wafer stage WST1 is located at the first loading position. After that, main controller 20 performs wafer alignment (EGA) using alignment systems AL1 and $AL2_1$ to $AL2_4$, which is similar to the above-described one, with respect to wafer W on fine movement stage WFS1, while controlling the position of wafer stage WST1.

When the wafer alignment (EGA) with respect to wafer W on fine movement stage WFS1 has been completed and also the exposure on wafer W on fine movement stage WFS2 has been completed, main controller 20 drives wafer stage WST1 in the +Y direction on surface plate 14A and drives wafer stage WST2 in the −Y direction on surface plate 14B, respectively, in order to perform replacement of the wafer stage with respect to exposure station 200 (in this case, the replacement from wafer stage WST2 to wafer stage WST1) Measurement of the position of wafer stage WST1 during the drive from measurement station 300 to exposure station 200 is performed in a similar procedure to that of the position measurement of wafer stage WST2 described earlier.

Then, main controller 20 starts exposure on wafer W on wafer stage WST1 in the procedure similar to the previously described procedure. In parallel with this exposure operation, main controller 20 drives wafer stage WST2 toward the second loading position in a manner similar to the previously described manner, exchanges wafer W that has been exposed on wafer stage WST2 with a new wafer W, and executes the wafer alignment with respect to the new wafer W.

After that, main controller 20 repeatedly executes the parallel processing operations using wafer stages WST1 and WST2 described above.

As described above, in exposure apparatus 500 of the present second embodiment, the surface plate that sets the guide surface used when wafer stages WST1 and WST2 move along the XY plane is configured of the two surface plates 14A and 14B so as to correspond to the two wafer stages WST1 and WST2. These two surface plates 14A and 14B independently function as the countermasses when wafer stages WST1 and WST2 are driven by the planar motors (coarse movement stage driving systems 62A and 62B). Therefore, for example, even when wafer stage WST1 and wafer stage, WST2 are respectively driven in directions opposite to each other in the Y-axis direction on surface plates 14A and 14B, surface plates 14A and 14B can individually cancel the reaction forces respectively acting on the surface plates. Further, since the guide surface used on the movement of wafer stages WST1 and WST2 is set by the two surface plates 14A and 14B that are placed side by side via a predetermined clearance therebetween, each surface place is easier to handle and also maintenance of the vicinity of the surface plate is easier to perform, compared with the case where the surface plates are integrated.

Further, since measurement bar 71 that has first measurement head group 72 and second measurement head group 73 is fixed in a suspended state to main frame BD to which barrel 40 is fixed, it becomes possible to perform high-precision position control of wafer stage WST1 (or WST2) with the optical axis of projection optical system PL held by barrel 40 serving as a reference. Further, since measurement bar 71 is in a mechanically noncontact state with the members other than main frame BD (e.g. surface plates 14A and 14B, base board 12, and the like), vibration or the like, which is generated when wafer stages WST1 and WST2 and the like are driven, is not transmitted. Consequently, it becomes possible to perform high-precision measurement of the positional information of wafer stage WST1 (or WST2), by using first measurement head group 72 and second measurement head group 73.

Third Embodiment

Next, a third embodiment of the present invention is described with reference to FIGS. 25A to 26. Herein, the same or similar reference signs are used for the components that are the same as or similar to those in the first and second embodiments described previously, and the description thereabout is simplified or omitted.

Figure 25A:
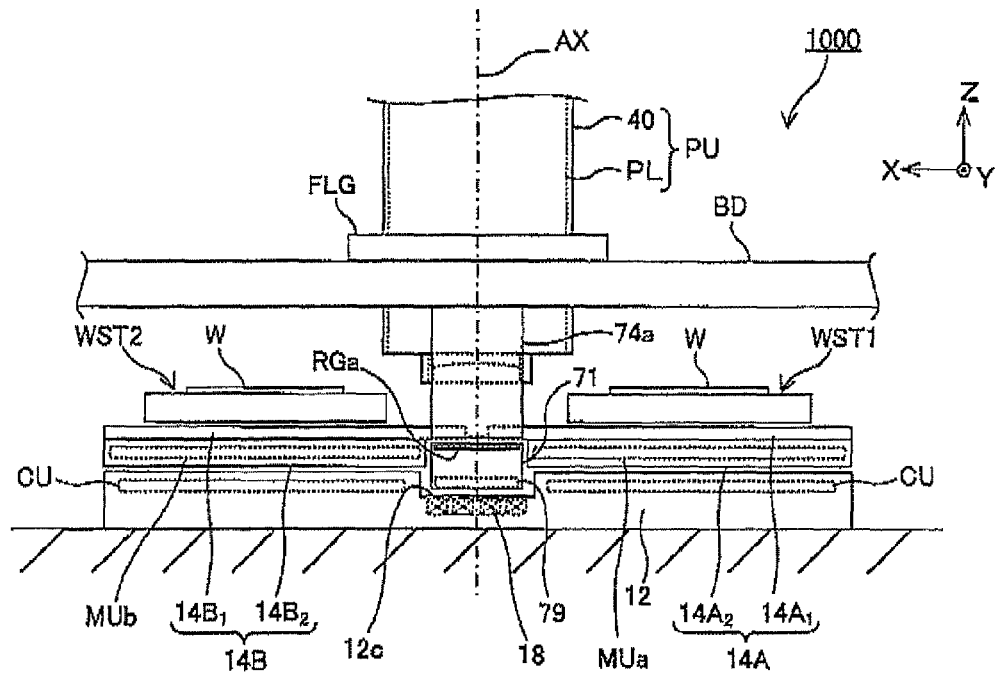
FIG. 25A is a side view of an exposure apparatus of a third embodiment when viewed from the +Y side.
Figure 25B:
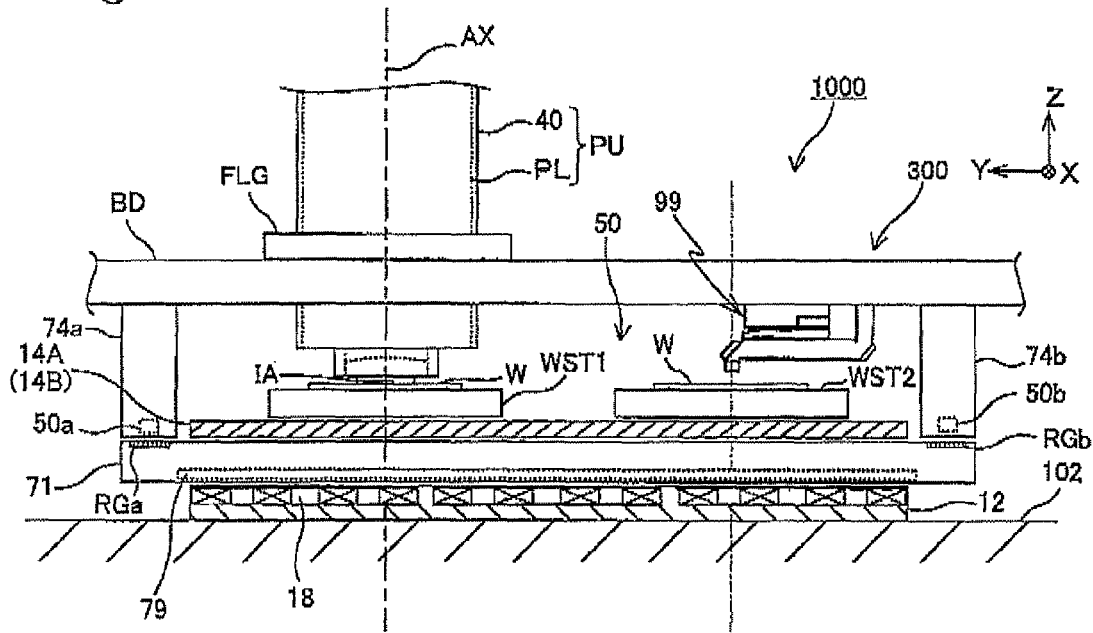
FIG. 25B is a side view (partial cross sectional view) of the exposure apparatus of FIG. 25A when viewed from the −X side.

FIG. 25A shows a side view of an exposure apparatus 1000 of the third embodiment when viewed from the +Y side, and FIG. 25B is a side view (partial cross sectional view) of exposure apparatus 1000 when viewed from the −X side. And, FIG. 26 shows input/output relations of a main controller which exposure apparatus 1000 is equipped with.

Figure 26:
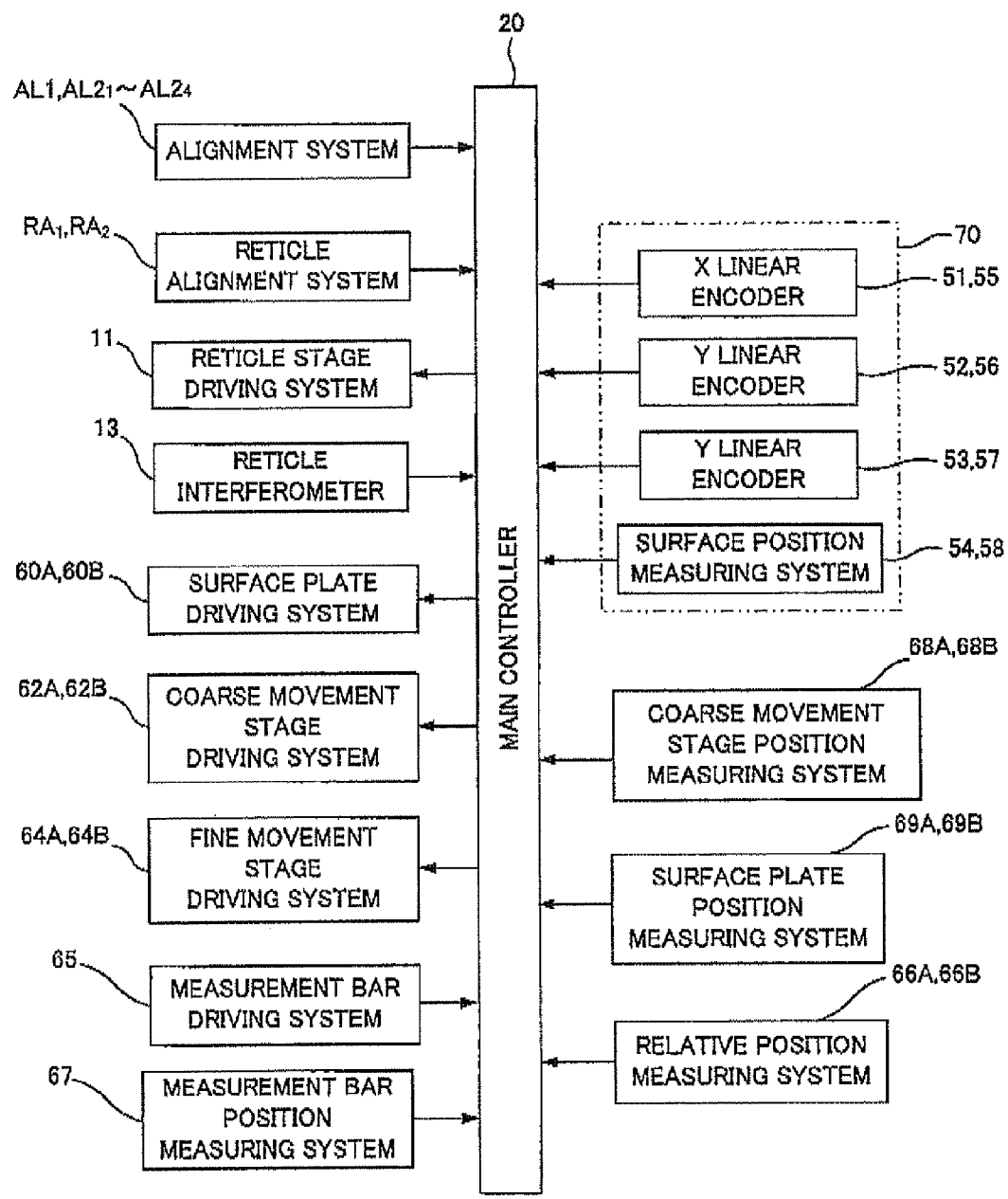

As can be seen when comparing the block diagram used to explain the input/output relations of main controller 20 shown in FIG. 26 and FIG. 19 described earlier, exposure apparatus 1000 is different from exposure apparatus 500 of the second embodiment in that exposure apparatus 1000 is equipped with measurement bar position measuring system 67 and measurement bar driving system 65 that are similar to those in the first embodiment described earlier. Exposure apparatus 1000 is described below, mainly focusing on the different point from exposure apparatus 500.

As shown in FIGS. 25A and 25B, on the lower side of the inner bottom surface of recessed section 12c of base board 12, coil unit 18 is housed that includes a plurality of coils placed in a matrix shape with the XY two-dimensional directions serving as a row direction and a column direction. The magnitude and direction of the electric current supplied to each of the plurality of coils that configure coil unit 18 are controlled by main controller 20 (see FIG. 26).

Further, inside (on the bottom portion of) measurement bar 71 of fine movement stage position measuring system 70, magnetic unit 79 including a plurality of magnets is placed. Magnetic unit 79 and coil unit 18 described above configure measurement bar driving system 65 (see FIG. 26) made up of a planar motor by the electromagnetic force (Lorentz force) drive method that is capable of driving measurement bar 71 in the directions of six degrees of freedom.

Measurement bar 71 is supported by levitation (supported in a noncontact manner) above base board 12, by a drive force in the +Z direction generated by the planar motor that configures measurement bar driving system 65. The +Z side half (upper half) of measurement bar 71 is placed between second section 14A$_2$ of surface plate 14A and second section 14B$_2$ of surface plate 14B, and the −Z side half (lower half) is housed inside recessed section 12c formed at base board 12. Further, a predetermined clearance is formed between measurement bar 71 and each of surface plates 14A and 14B and base board 12, and measurement bar 71 and each of surface plates 14A and 14B and base board 12 are in a state mechanically noncontact with each other.

And now, measurement bar driving system 65 can be configured such that disturbance such as floor vibration is not transmitted to measurement bar 71. In the case of the present third embodiment, since the planar motor can generate the drive force in the Z-axis direction, it is possible to cope with, the disturbance by controlling measurement bar 71 so as to cancel out the disturbance with measurement bar driving system 65. On the contrary, in the case where measurement bar driving system 65 cannot make the force in the Z-axis direction act on measurement bar 71, the disturbance such as vibration can be prevented, for example, by installing the member (coil unit 18 or magnetic unit 79) that is installed on the floor side, of the measurement bar driving system, via a vibration isolating mechanism. However, such configuration is not intended to be limiting.

Similarly to the first embodiment described earlier, in exposure apparatus 1000 of the present third embodiment, into the recessed sections formed on the upper surfaces of both ends of measurement bar 71 in the longitudinal direction, thin plate-shaped plates are respectively fitted, on which two-dimensional grating RGa and RGb (hereinafter, simply referred to as gratings RGa and RGb) are respectively formed (see FIG. 25B).

As shown in FIG. 25B, the lower ends of a pair of suspended support members 74a and 74b whose upper ends are each fixed to the lower surface of main frame BD, are respectively opposed, via a predetermined clearance, to gratings RGa and RGb placed at measurement bar 71. Inside the lower ends of the pair of suspended support members 74a and 74b, a pair of head units 50a and 50b are respectively housed, each of which includes a diffraction interference type encoder head having a configuration in which a light source, a photodetection system (including a photodetector) and various types of optical systems are unitized, which is similar to the encoder head disclosed in, for example, PCT International Publication No. 2007/083758 (the corresponding U.S. Patent Application Publication No. 2007/0288121) and the like. The pair of head units 50a and 50b each include a pair of X heads, a pair of Y heads and one Z head or two Z heads, and are configured similar to the pair of head units 50a and 50b in the first embodiment described earlier.

More specifically, the pair of Y heads respectively belonging to head units 50a and 50b configure a pair of Y linear encoders that measure the position of measurement bar 71 in the Y-axis direction with (the reference point on) main frame BD serving as a reference, and the pair of X heads respectively belonging to head units 50a and 50b configure a pair of X linear encoders that measure the position of measurement bar 71 in the X-axis direction with (the reference point on) main frame BD serving as a reference.

The measurement values of the pair of the X heads (X linear encoders) and the pair of the Y heads (Y linear encoders) are supplied to main controller 20 (see FIG. 26), and main controller 20 respectively computes the relative position of measurement bar 71 in the Y-axis direction with respect to (the reference point on) main frame BD based on the average value of the measurement values of the pair of Y linear encoders, and the relative position of measurement bar 71 in the X-axis direction with respect to (the reference point on) main frame BD based on the average value of the measurement values of the pair of X linear encoders. Further, main controller 20 computes the position in the θz direction (rotational amount around the Z-axis) of measurement bar 71 based on the difference between the measurement values of the pair of the X linear encoders.

Based on the measurement values of the three Z heads in total placed at the three noncollinear positions that are included in head units 50a and 50b, main controller 20 computes the position in the Z-axis direction and the rotational amount in the θx and θy directions of measurement bar 71 with (the measurement reference surface of main frame BD serving as a reference. Incidentally, the surface position information of measurement bar 71 can be measured by, for example, an optical interferometer system that includes an optical interferometer. In such a case, the pipe (fluctuation preventing pipe) used to isolate the measurement beam irradiated from the optical interferometer from surrounding atmosphere, e.g., air can be fixed to suspended support members 74a and 74b.

In exposure apparatus 1000 of the present third embodiment, the plurality of the encoder heads (X linear encoders, Y linear encoders) and the Z heads (surface position measuring system), which head units 50a and 50b have, configure measurement bar position measuring system 67 (see FIG. 26) that measures the relative position of measurement bar 71 in the directions of six degrees of freedom with respect to main frame BD. Based on the measurement values of measurement bar position measuring system 67, main controller 20 constantly measures the relative position of measurement bar 71 with respect to main frame BD, and controls measurement bar driving system 65 to control the position of measurement bar 71 such that the relative position between measurement bar 71 and main frame BD does not vary (i.e. such that measurement bar 71 and main frame BD are in a state similar to being integrally configured).

The configuration of the other parts of exposure apparatus 1000 is similar to that of exposure apparatus 500 of the second embodiment described earlier. According to exposure apparatus 1000 of the present third embodiment configured as described above, main controller 20 constantly controls the position in the directions of six degrees of freedom of measurement bar 71 that has first measurement head group 72 and second measurement head group 73, via measurement bar driving system 65, based on the measurement value of measurement bar position measuring system 67 such that the relative position with respect to main frame BD does not vary. Consequently, exposure apparatus 1000 of the present third embodiment brings about the operations and effects equivalent to exposure 500 of the second embodiment described earlier. In addition, since measurement bar 71 is placed below surface plates 14A and 14B so at to mechanically be separated from main frame BD, the measurement accuracy of the positional information of fine movement stage WFS1 (or WFS2) by fine movement stage position measuring system 70 is not degraded owing to deformation (e.g. twist) of measurement bar 71 caused by inner stress (including thermal stress) and transmission of vibration from main frame BD to measurement bar 71, and the like, which is different from the case where main frame BD and measurement bar 71 are integrated.

Further, in the exposure apparatuses of the first to third embodiments above, the position of the border line that separates the surface plate or the base member into a plurality of sections is not limited to the position as in the embodiments above. While the border line is set as the line that includes reference axis LV and intersects optical axis AX in the embodiments above, the border line can be set at another position, for example, in the case where, if the boundary is located in the exposure station, the thrust of the planar motor at the portion where the boundary is located weakens. Further, while the exposure apparatus in each of the embodiments above has the two surface plates that correspond to the two wafer stages, the number of the surface plates is not limited to two but three or more surface plates can be employed.

Figure 27:
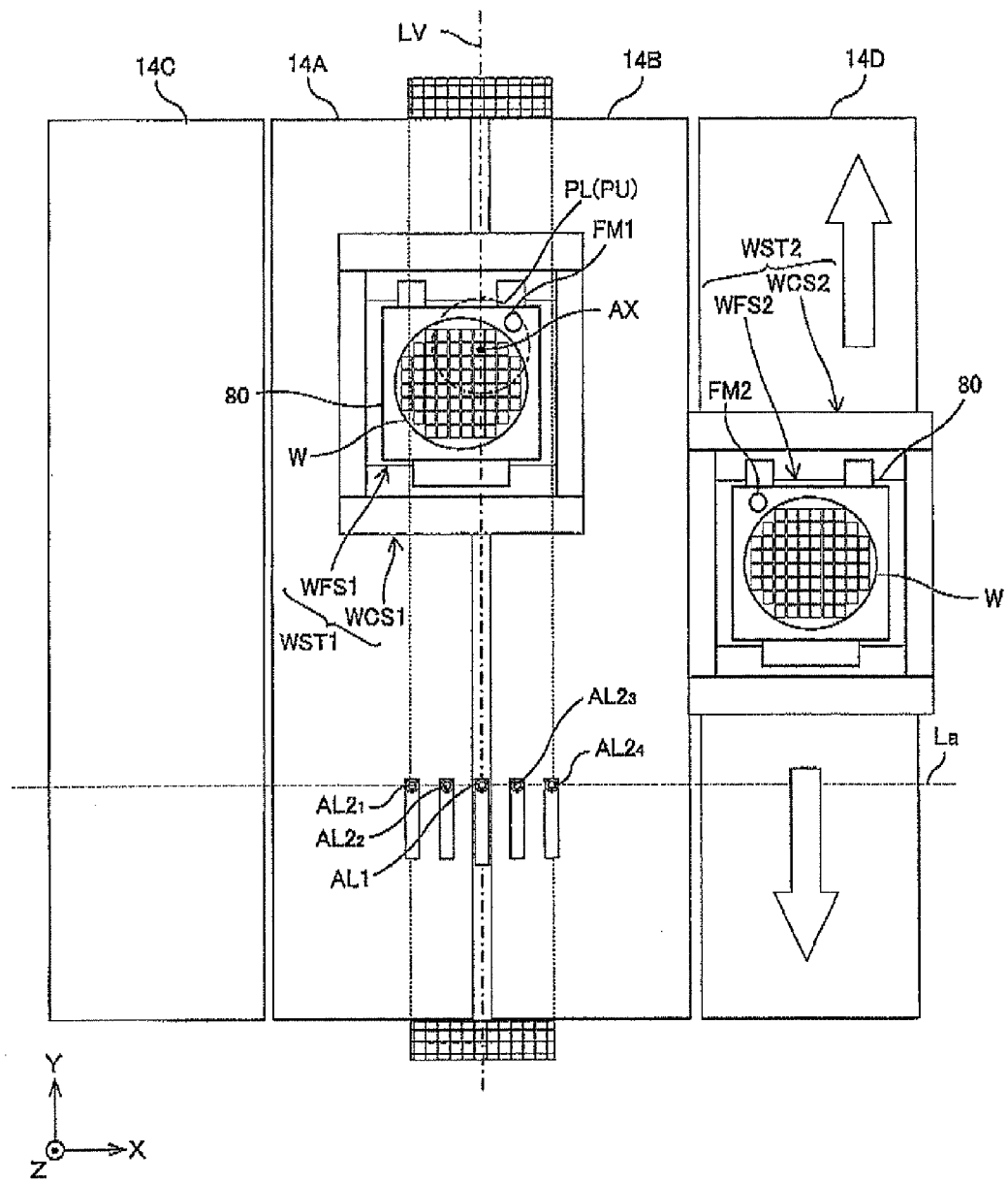
FIG. 27 is a plan view showing an exposure apparatus related to a modified example.

For example, in the case where four surface plates are provided, as shown in FIG. 27, four surface plates 14C, 14A, 14B and 14D can be placed side by side in the X-axis direction via a predetermined clearance between the adjacent surface plates, on a base board that is not illustrated. In a modified example of FIG. 27, the width in the X-axis direction of surface plates 14A and 14B on which exposure station 200 and measurement station 300 are placed is around half, compared with that in the first and second embodiments described earlier, and surface plates 14C and 14D with the substantially same size are placed with surface plates 14A and 14B in between. In this case as well, similar to the case described earlier, each of the four surface plates 14A to 14D is supported above the base board via air bearing (or rolling bearings) that are not illustrated. Further, surface plates 14A to 14D can individually be driven by four surface plates driving systems, respectively, that are configured to the one described earlier. The configuration and the like of the other parts are similar to those in the third embodiment described earlier.

In the example shown in FIG. 27, (the upper surfaces of) surface plates 14A and 14B form (a guide surface corresponding to) an movement area where each of wafer stages WST1 and WST2 moves when exposure on wafer W is performed, and (the upper surfaces of) surface plates 14C and 14D form (a guide surface corresponding to) a withdrawn area that is a movement area where each of wafer stages WST1 and WST2 moves back and forth during a period after the exposure on wafer W is completed until exposure on a next wafer begins. Consequently, in the exposure apparatus related to the modified example shown in FIG. 27, even if at any time during exposure of wafer W held by on of wafer stages WST1 and WST2, the other of wafer stages WST1 and WST2 moves, for example, at the highest speed toward the wafer exchange position or the like, a reaction force of a drive force generated on this movement is absorbed because surface plate 14G or 14D functions as the countermass owing to the action of the reaction force. Consequently, the exposure on a wafer on one of the wafer stages can be started without waiting for the completion of the acceleration/deceleration of the other wafer stage, which makes it possible to improve the throughput. As a matter of course, the reaction force of the drive force of the one wafer stage during scanning exposure on the wafer is absorbed because surface plates 14A and 14B functions as the countermasses owing to the action of the reaction force.

Fourth Embodiment

Next, a fourth embodiment of the present invention is described with reference to FIGS. 28 to 37. Herein, the same or similar reference signs are used for the components that are the same as or similar to those in the first and second embodiments described previously, and the description thereabout is simplified or omitted.

Figure 28:
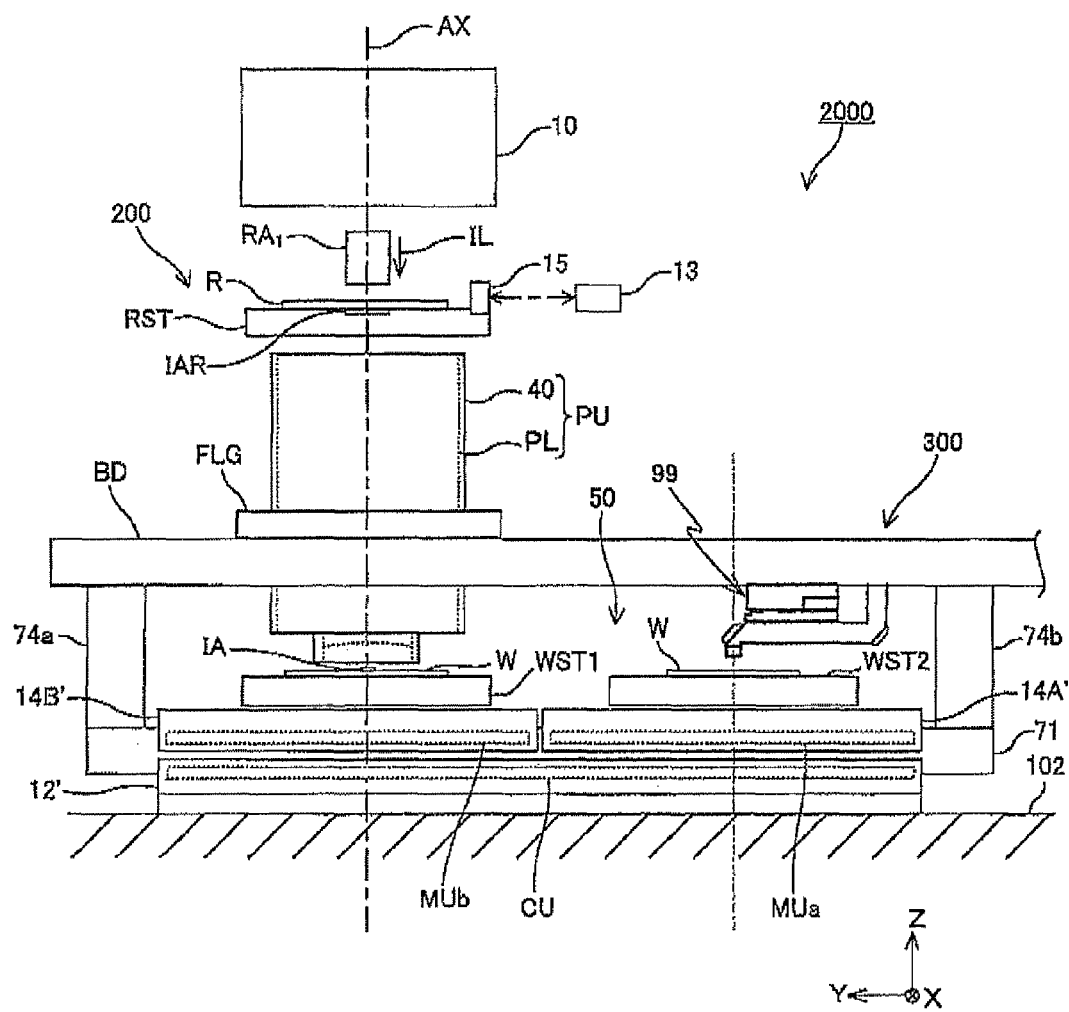
FIG. 28 is a view schematically showing a configuration of an exposure apparatus of a fourth embodiment.
Figure 29:
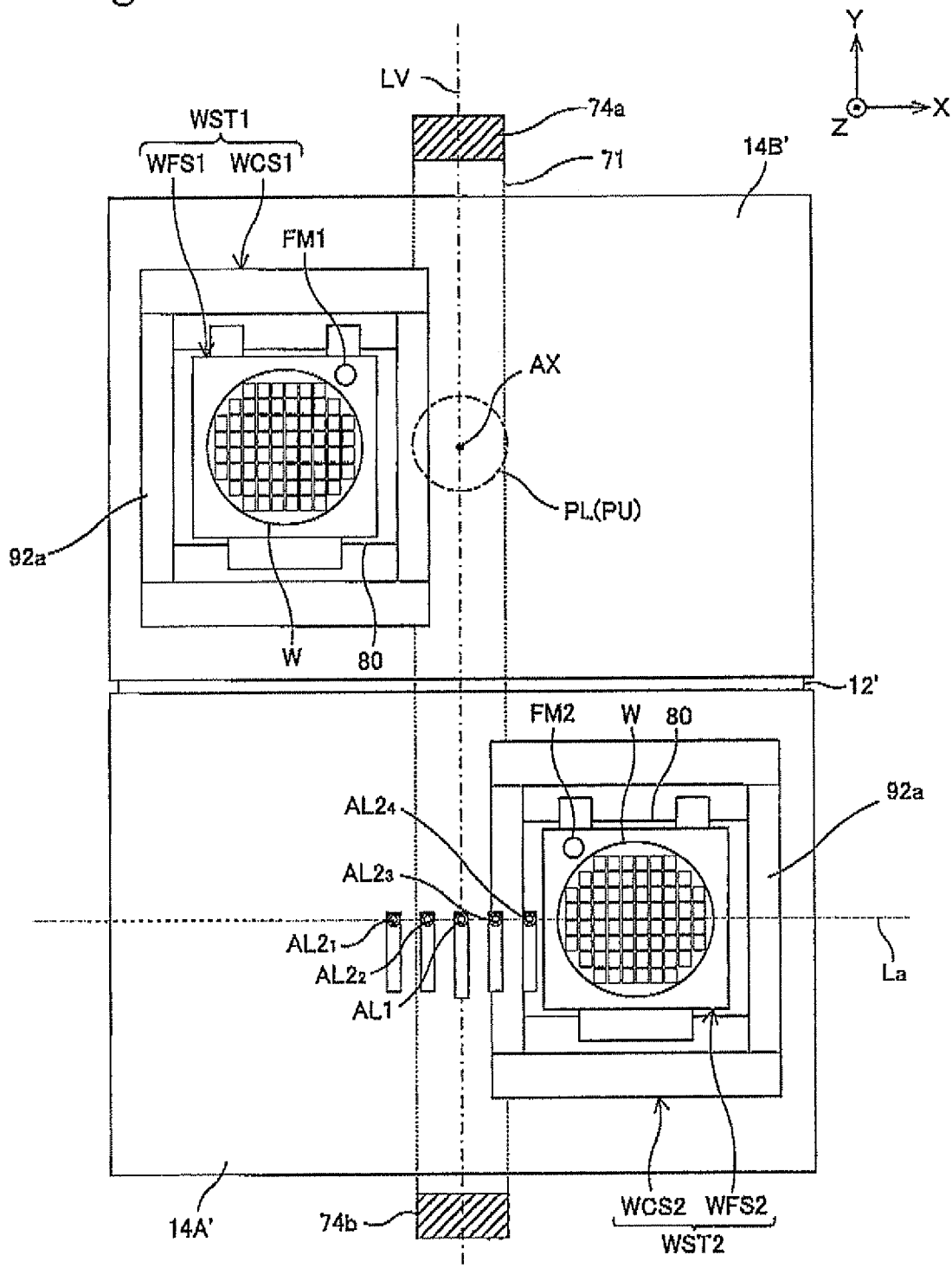
FIG. 29 is a plan view of the exposure apparatus of FIG. 28.
Figure 30:
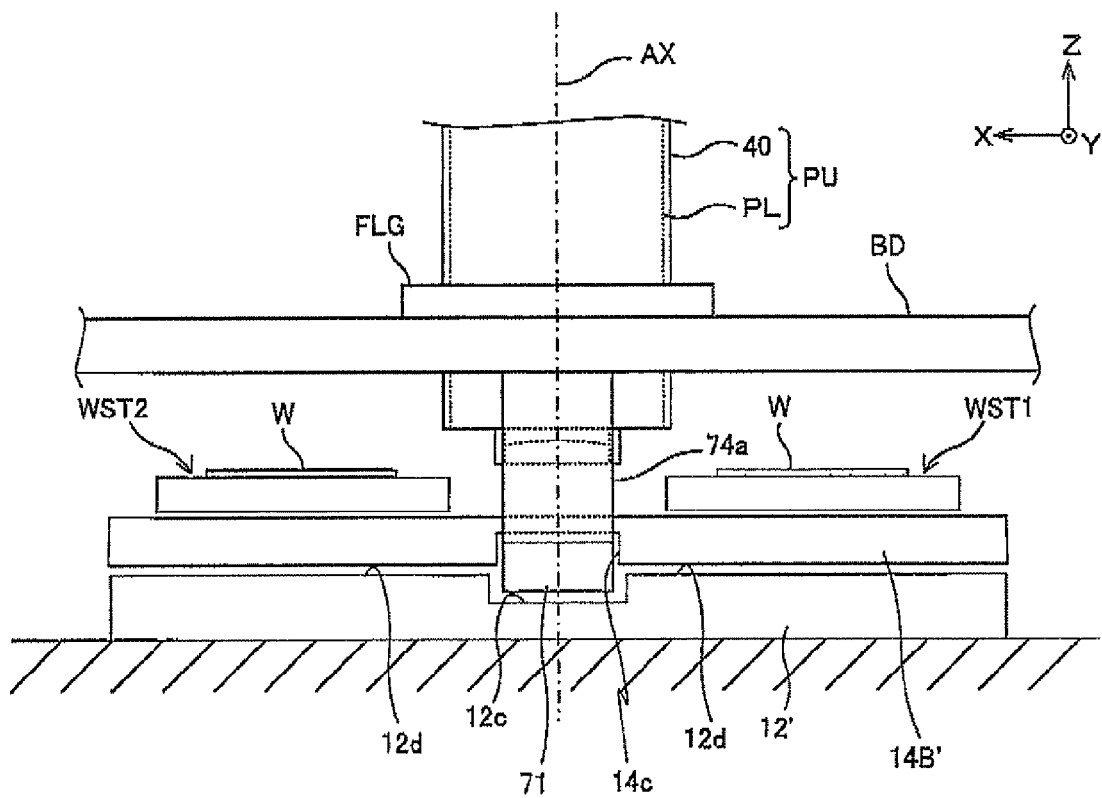
FIG. 30 is a side view of the exposure apparatus of FIG. 28 when viewed from the +Y side.
Figure 31:
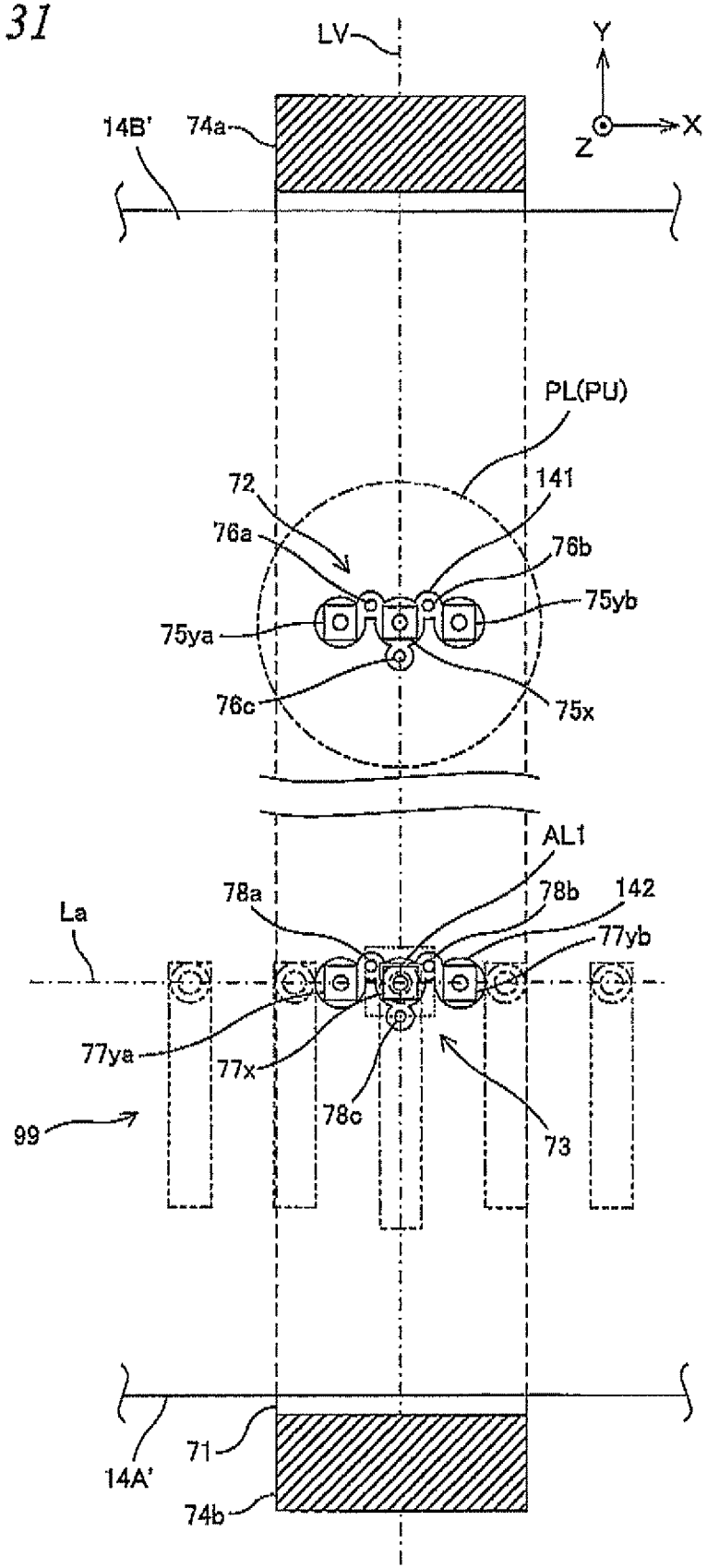
FIG. 31 is a view showing a configuration of a fine movement stage position measuring system.
Figure 32:
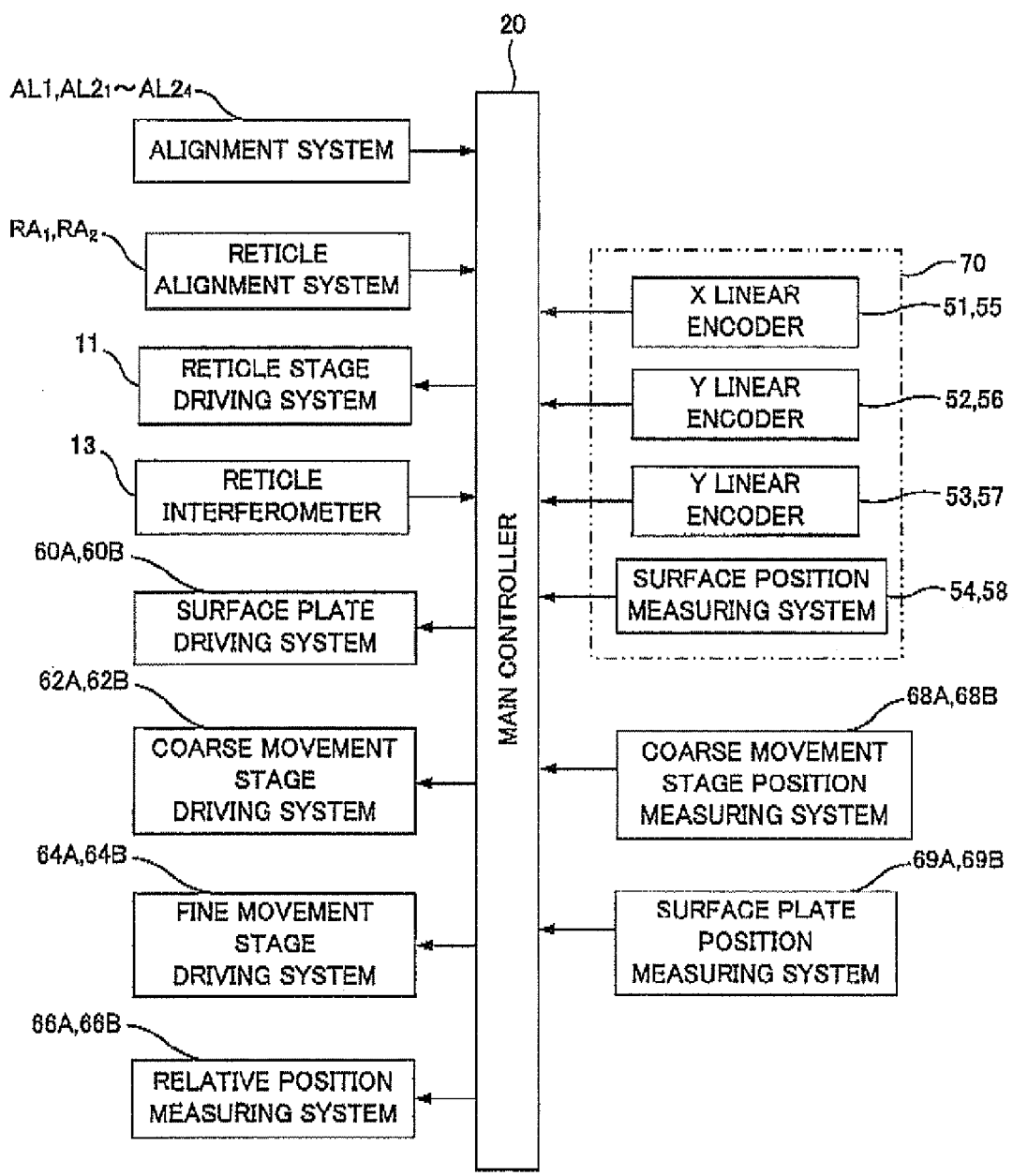

FIG. 28 schematically shows a configuration of an exposure apparatus of the fourth embodiment, FIG. 29 shows a plan view of the exposure apparatus of FIG. 28, and FIG. 30 shows a side view of the exposure apparatus of FIG. 28 when viewed from the +Y side. And, FIG. 31 shows a configuration of a fine movement stage position measuring system which the exposure apparatus of FIG. 28 is equipped with. Further, FIG. 32 shows input/output relations of a main controller which the exposure apparatus of FIG. 28 is equipped with.

An exposure apparatus 2000 of the fourth embodiment is a dry type scanner that performs exposure of wafer W without liquid (water), which is similar to the exposure apparatuses of the second and third embodiments described earlier. In exposure apparatus 2000, a single base board 12' is arranged and measurement bar 71 is fixed to a pair of suspended support members 74a and 74b and is integrated with the suspended support members, similarly to the exposure apparatus of the second embodiment described earlier. In exposure apparatus 2000, however, a pair of surface plates 14A' and 14B' are placed side by side in the Y-axis direction, which is different from the first to third embodiments described earlier.

As shown in FIG. 29, surface plates 14A' and 14B' are each made up of a member with an elongated rectangular shape having the length in the X-axis direction slightly longer than the length in the Y-axis direction in a planar view (when viewed from above), and are placed on the −Y side and the +Y side, with a straight line parallel to the X-axis located substantially in the center between optical axis AX and projection optical system PL and the detection center of primary alignment system. AL1, serving as the boundary. Surface plate 14A' and surface plate 14B' are placed with a very narrow gap therebetween in the Y-axis direction. By finishing the upper surface (the +Z side surface) of each of surface plates 14A' and 14B' such that the upper surface has a very high flatness degree, it is possible to make the upper surface function as a guide surface with respect to the Z-axis direction used when each of wafer stages WST1 and WST2 moves following the XY plane. Alternatively, a configuration can be employed in which wafer stages WST1 and WST2 are magnetically levitated above surface plates 14A' and 14B' by making a force in the Z-axis direction act on wafer stages WST1 and WST2 using planar motors. Similarly to the first embodiment and the like described earlier, in the case of the present fourth embodiment, as shown in FIG. 5B, magnetic units 96a and 96b housed respectively inside (at the bottom portions of) coarse movement slider sections 90a and 90b and the coil units housed inside (in the vicinity of the upper surfaces of) surface plates 14A' and 14B' respectively configure coarse movement stage driving system 62A and coarse movement stage driving system 62B (see FIG. 32) composed of planar motors by the electromagnetic force (Lorentz force) that are capable of generating drive forces in the directions of six degrees of freedom with respect to coarse movement stages WCS1 and WCS2 respectively. Consequently, the flatness degree of the upper surfaces of surface plates 14A' and 14B' does not have to be so high as in the above description.

Incidentally, the size and the shape of surface plate 14A' and surface plate 14B' are not limited to those in the present fourth embodiment.

As representatively shown by surface plate 14B' in FIG. 30, surface plates 14A' and 14B' are supported, via air bearings (or rolling bearings) that are not illustrated, by upper surfaces 12d of both side portions of recessed section 12c of base board 12' that is supported substantially horizontally (parallel to the XY plane) on floor surface 102 via a vibration isolating mechanism (the illustration is omitted).

As shown in FIG. 30, on the bottom surface of surface plate 14B', a recessed section 14c is formed that is opposed to recessed section 12c of base board 12' and extends in a direction parallel to the Y-axis. Note that a recessed section 14c is also formed at surface plate 14A' so as to be opposed to recessed section 12c, although not illustrated.

Inside (in the vicinity of the upper surfaces of) surface plates 14A' and 14B', coil units (the illustration is omitted) each including a plurality of coils that configure a part of coarse movement stage driving systems 62A and 62B, respectively, are housed. The magnitude and direction of the electric current supplied to each of the plurality of coils that configure each of the coil units are controlled by main controller 20 (see FIG. 32).

Inside (on the bottom portion of) surface plate 14A', magnetic unit MUa (see FIG. 28) which is made up of a plurality of permanent magnets (and yokes that are not illustrated) placed in a matrix shape, is housed so as to correspond to coil unit CU housed on the upper surface side of base board 12'. Magnetic unit MUa configures, together with coil unit CU of base board 12', surface plate driving system 60A (see FIG. 32) that is made up of a planar motor by the electromagnetic force (Lorentz force) drive method. Surface plate driving system 60A generates a drive force that drives surface plate 14A' in directions of three degrees of freedom (X, Y, θz) within the XY plane.

Similarly, inside (on the bottom portion of) surface plate 14B', magnetic unit MUb (see FIG. 28) made up of a plurality of permanent magnets (and yokes that are not illustrated) is housed that configures, together with coil unit CU of base board 12', surface plate driving system 60B (see FIG. 32) made up of a planar motor that drives surface plate 14B' in the directions of three degrees of freedom within the XY plane. Incidentally, the placement of the coil unit and the magnetic unit of the planar motor that configures each of surface plate driving systems 60A and 60B can be reverse (a moving coil type that has the magnetic unit on the base board side and the coil unit on the surface plate side) to the above-described case (a moving magnet type).

Now, the case is considered as an example where wafer stage WST1 is located on surface plate 14A' and wafer stage WST2 is located on surface plate 14S'. In this case, for example, when wafer stage WST1 is driven with acceleration/deceleration in the Y-axis direction on surface plate 14A', by the planar motor that configures coarse movement stage driving system 62A, surface plate 14A' is driven in a direction opposite to wafer stage WST1 according to the so-called law of action and reaction (the law of conservation of momentum) owing to the action of a reaction force by the drive of wafer stage WST1. More specifically, surface plate 14A' functions as the countermass, and thereby the momentum of a system composed of wafer stage WST1 and surface plate 14A' is conserved and movement of the center of gravity does not occur. Further, since surface plate 14A' and surface plate 14B' are physically separated, the reaction force of the drive force of wafer stage WST1 acting on surface plate 14W does not affect surface plate 14B' and wafer stage WST2 on surface plate 14B'. Further, it is also possible to make a state where the law of action and reaction described above does not hold, by generating a drive force in the Y-axis direction with surface plate driving system 60A.

Fine movement stage position measuring system 70 related to the present fourth embodiment has measurement bar 71 shown in FIG. 28. As shown in FIG. 30, measurement bar 71 is placed between recessed sections 14c of the pair of surface plates 14W and 14B' and recessed section 12c of base board 12'. The +Z side half (upper half) of measurement bar 71 is placed inside recessed sections 14c of the respective surface plates 14W and 14B', and the −Z side half (lower half) is housed inside recessed section 12c formed at base board 12'. Further, a predetermined clearance is formed between measurement bar 71 and each of surface plates 14A' and 14B' and base board 12', and measurement bar 71 is in a state mechanically noncontact with the members other than main frame BID.

At measurement bar 71, as shown in FIG. 31, first measurement head group 72 used when measuring positional information of the fine movement stage (WFS1 or WFS2) located below projection unit PU and second measurement head group 73 used when measuring positional information of the fine movement stage (WFS1 or WFS2) located below alignment device 99 are arranged. Incidentally, alignment systems AL1 and $AL2_1$ to $AL2_4$ are shown in virtual lines (two-dot chain lines) in FIG. 31 in order to make the drawing easy to understand. Further, in FIG. 31, the reference signs of alignment systems $AL2_1$ to $AL2_4$ are omitted.

As shown in FIG. 31, first measurement head group 72 includes, below projection unit PU, X head 75x, two Y heads 75ya and 75yb, and three Z heads 76a, 76b and 76c, for example, that are placed in the placement similar to that in the first embodiment described earlier. In the case of the present fourth embodiment, a light-transmitting section (e.g. an opening) 141 with a contour that encloses first measurement head group 72 is formed at surface plate 14B', so as to correspond to the respective heads that configure first measurement head group 72.

When wafer stage WST1 (or WST2) is located directly under projection optical system PL (see FIG. 28), X head 75x and Y heads 75ya and 75yb respectively irradiate measurement beams on grating RG placed on the lower surface of fine movement stage WFS1 (or WFS2), via light-transmitting section (e.g. opening) 141 formed at surface plate 14B'. Further, X head 75x and Y heads 75ya and 75yb respectively receive diffraction light from grating RG, thereby obtaining positional information within the XY plane (also including rotational information in the θz direction) of fine movement stage WFS1 (or WFS2). More specifically, X liner encoder 51 (see FIG. 32) is configured of X head 75x, and a pair of Y liner encoders 52 and 53 (see FIG. 32) are configured of the pair of Y heads 75ya and 75yb. The measurement value of each of X head 75x and Y heads 75ya and 75yb is supplied to math controller 20 (see FIG. 32). Main controller 20 measures (computes) the position in the θz direction (rotational amount around the Z-axis) of fine movement stage WFS1 (or WFS2) using the measurement values of each of the pair of Y linear encoders 52 and 53. Main controller 20 can perform the measurement of the positional information (including rotational information in the θz direction) within the XY plane of fine movement stage WFS1 (or WFS2) directly under (on the back side of) the exposure position at all times, by using X linear encoder 51 and Y linear encoders 52 and 53.

Z heads 76a to 76c configure a surface position measuring system 54 (see FIG. 32) that measures the surface position (position in the Z-axis direction) of fine movement stage WFS1 (or WFS2) at the respective irradiation points. The measurement value of each of the three Z heads 76a to 76c is supplied to main controller 20 (see FIG. 32). Based on the average value of the measurement values of the three Z heads 76a to 76c, main controller 20 can acquire positional information in the Z-axis direction (surface position information) of fine movement stage WFS1 (or WFS2) directly under the exposure position at all times. Further, main controller 20 measures (computes) the rotational amount in the θx direction and the θy direction, in addition to the position in the Z-axis direction, of fine movement stage WFS1 (or WFS2) using (based on) the measurement values of the three Z heads 76a to 76c.

Second measurement head group 73 has X head 77x that configures X liner encoder 55 (see FIG. 32), a pair of Y heads 77ya and 77yb that configure a pair of Y linear encoders 56 and 57 (see FIG. 32), and three Z heads 78a, 78b and 78c that configure surface position measuring system 58 (see FIG. 32). A light-transmitting section (e.g. an opening) 142 is formed at surface plate 14A' so as to correspond to the respective head of second measurement head group 73.

Similarly to the first and second embodiments described above, in the present fourth embodiment as well, the respective positional relations of the pair of Y heads 77ya and 77yb and the three Z heads 78a to 78c with X head 77x serving as a reference are similar to the respective positional relations described above of the pair of Y heads 75ya and 75yb and the three Z heads 76a to 76c with X head 75x serving as a reference. An irradiation point (detection point), on grating RG, of the measurement beam irradiated from X head 77x coincides with the detection center of primary alignment system AL1. Consequently, main controller 20 can perform measurement of positional information within the XY plane and surface position information of fine movement stage WFS2 (or WFS1) at the detection center of primary alignment system AL1 at all times.

The other parts are configured similar to those of exposure apparatus 500 of the second embodiment described earlier.

Next, a parallel processing operation using the two wafer stages WST1 and WST2 in exposure apparatus 2000 of the present fourth embodiment is described with reference to FIGS. 33 to 37.

Figure 33:
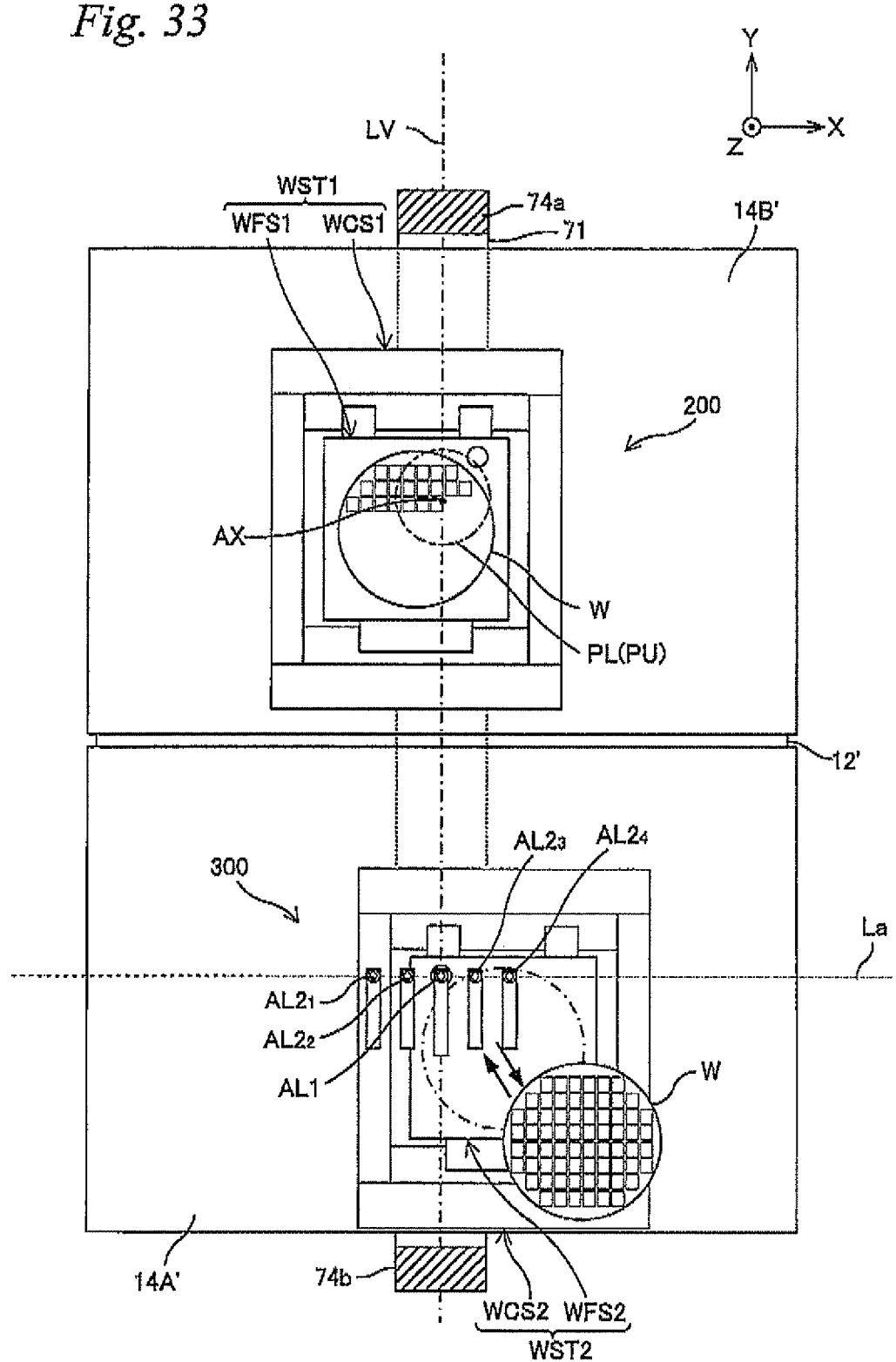
FIG. 33 is a view showing a state where exposure is performed on a wafer mounted on wafer stage WST1 and wafer exchange is performed on a wafer stage WST2 in the exposure apparatus of the fourth embodiment.

FIG. 33 shows a state where exposure by a step-and-scan method 15 performed on wafer W mounted on fine movement stage WFS1 of wafer stage WST1 in exposure station 200, and in parallel with this exposure, wafer exchange is performed between a wafer carrier mechanism (not illustrated) and fine movement stage WFS2 of wafer stage WST2 at the second loading position.

Main controller 20 performs the exposure operation by a step-and-scan method by repeating an inter-shot movement (stepping between shots) operation of moving wafer stage WST1 to a scanning starting position (acceleration starting position) for exposure of each shot area on wafer W, based on the results of wafer alignment (e.g. information obtained by converting an arrangement coordinate of each shot area on wafer W obtained by an Enhanced Global Alignment (EGA) into a coordinate with the second fiducial mark on measurement plate FM1 serving as a reference) and reticle alignment and the like that have been performed beforehand, and a scanning exposure operation of transferring a pattern formed on reticle R onto each shot area on wafer W by a scanning exposure method. During this step-and-scan operation, surface plate 14B' exerts the function as the countermass, as described previously, according to movement of wafer stage WST1, for example, in the Y-axis direction during scanning exposure. Further, main controller 20 gives the initial velocity to coarse movement stage WCS1 when driving fine movement stage WFS1 in the X-axis direction for the stepping operation between shots, and thereby coarse movement stage WCS1 functions as a local countermass with respect to fine movement stage WFS1. Further, surface plate 14A' and surface plate 14B' are mechanically separated, and therefore, even if a reaction force of a drive force of wafer stage WST1 acts on surface plate 148', there is no risk that the reaction force of the drive force of wafer stages WST1 affects surface plate 14A'. Further, there is no risk that the reaction force affects wafer stage WST2 on surface plate 14A'.

In exposure apparatus 2000 of the present fourth embodiment, during a series of the exposure operations described above, main controller 20 measures the position of fine movement stage WFS1 using first measurement head group 72 of fine movement stage position measuring system 70 and controls the position of fine movement stage WFS1 (wafer W) based on this measurement result.

The wafer exchange is performed by unloading a wafer that has been exposed from fine movement stage WFS2 and loading a new wafer onto fine movement stage WFS2 by the wafer carrier mechanism that is not illustrated, when fine movement stage WFS2 is located at the second loading position. In this case, the second loading position is a position where the wafer exchange is performed on wafer stage WST2, and in the present fourth embodiment, the second loading position is to be set at the position where fine movement stage WFS2 (wafer stage WST2) is located such that measurement plate FM2 is positioned directly under primary alignment system AU.

During the wafer exchange described above, and after the wafer exchange, while wafer stage WST2 stops at the second loading position, main controller 20 executes reset (resetting of the origin) of second measurement head group 73 of fine movement stage position measuring system 70, or more specifically, encoders 55, 56 and 57 (and surface position measuring system 58), prior to start of wafer alignment (and the other pre-processing measurements) with respect to the new wafer W.

Although during the wafer exchange, in some case, vibration is generated at wafer stage WST2 according to the wafer exchange, surface plate 14A' and surface plate 14B' are mechanically separated in the present fourth embodiment, and therefore, there is no risk that the vibration affects surface plate 14B'. Further, there is no risk that the vibration affects wafer stage WST1 on surface plate 14B'.

When the wafer exchange (loading of the new wafer W) and the reset of encoders 55, 56 and 57 (and surface position measuring system 58) have been completed, main controller 20 detects the second fiducial mark on measurement plate FM2 using primary alignment system AL1. Then, main controller 20 detects the position of the second fiducial mark with the index center of primary alignment system AL1 serving as a reference, and based on the detection result and the result of position measurement of fine movement stage WFS2 by encoders 55, 56 and 57 at the time of the detection, computes the position coordinate of the second fiducial mark in the orthogonal coordinate system (alignment coordinate system) with reference axis La and reference axis LV serving as coordinate axes.

Figure 34:
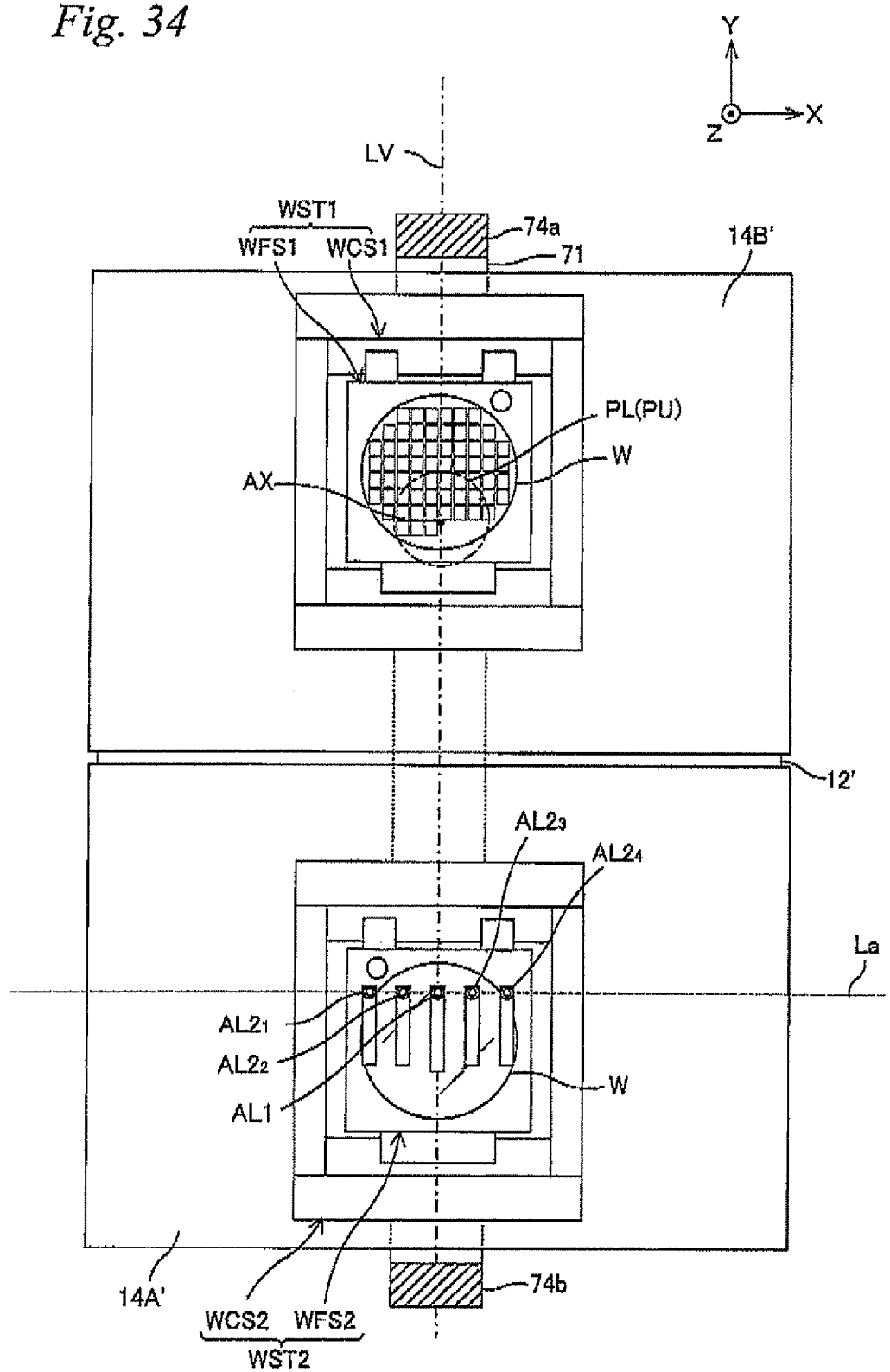
FIG. 34 is a view showing a state where exposure is performed on a wafer mounted on wafer stage WST1 and wafer alignment is performed with respect to a wafer mounted on wafer stage WST2 in the exposure apparatus of the fourth embodiment.

Next, main controller 20 performs the EGA while measuring the position coordinate of fine movement stage WFS2 (wafer stage WST2) in the alignment coordinate system using encoders 55, 56 and 57 (see FIG. 34). To be more specific, as disclosed in, for example, U.S. Patent Application Publication No. 2008/0088843 and the like, main controller 20 moves wafer stage WST2, or more specifically, coarse movement stage WCS2 that supports fine movement stage WFS2 in, for example, the Y-axis direction, and sets the position of fine movement stage WFS2 at a plurality of positions in the movement course, and at each position setting, detects the position coordinates, in the alignment coordinate system, of alignment marks at alignment shot areas (sample shot areas) using at least one of alignment systems AL1 and $AL2_2$ and $AL2_4$. FIG. 34 shows a state of wafer stage WST2 when the detection of the position coordinates of the alignment marks in the alignment coordinate system is performed.

In this case, in conjunction with the movement operation of wafer stage WST2 in the Y-axis direction described above, alignment systems AU and $AL2_2$ to $AL2_4$ respectively detect a plurality of alignment marks (sample marks) disposed along the X-axis direction that are sequentially placed within the detection areas (e.g. corresponding to the irradiation areas of detection light). Therefore, on the measurement of the alignment marks described above, wafer stage WST2 is not driven in the X-axis direction.

Then, based on the position coordinates of the plurality of alignment marks arranged at the sample shot areas on wafer W and the design position coordinates, main controller 20 executes statistical computation (EGA computation) disclosed in, for example, U.S. Pat. No. 4,780,617 and the like, and computes the position coordinates (arrangement coordinates) of the plurality of shot areas in the alignment coordinate system.

Further, in exposure apparatus 2000 of the present fourth embodiment, since measurement station 300 and exposure station 200 are spaced apart, main controller 20 subtracts the position coordinate of the second fiducial mark that has previously been detected from the position coordinate of each of the shot areas on wafer W that has been obtained as a result of the wafer alignment, thereby obtaining the position coordinates of the plurality of shot areas on wafer W with the position of the second fiducial mark serving as the origin.

In this case, according to the step movement of wafer stage WST2 in the Y-axis direction on the wafer alignment described above, surface plate 14A' exerts the function as the countermass, as previously described. Further, even if a reaction force of a drive force of wafer stage WST2 acts on surface plate 14A' there is no risk that the reaction force of the drive force affects surface plate 14B' because surface plate 14A' and surface plate 14B' are mechanically separated. Also, there is no risk that the reaction force affects wafer stage WST1 on surface plate 14B'.

Normally, the above-described wafer exchange and wafer alignment sequence is completed earlier than the exposure sequence. Therefore, when the wafer alignment has been completed, main controller 20 drives wafer stage WST2 in the +X direction to move wafer stage WST2 to a predetermined standby position on surface plate 14B'. In this case, when wafer stage WST2 is driven in the +X direction, fine movement stage WFS2 goes out of a measurable range of fine movement stage position measuring system 70 (i.e. the respective measurement beams irradiated from second measurement head group 73 move off from grating RG). Therefore, based on the measurement values of fine movement stage position measuring system 70 (encoders 55, 56 and 57) and the measurement values of relative position measuring system 663, main controller 20 obtains the position of coarse movement stage WCS2, and afterward, controls the position of wafer stage WST2 based on the measurement values of coarse movement stage position measuring system 68B. More specifically, position measurement of wafer stage WST2 within the XY plane is switched from the measurement using encoders 55, 56 and 57 to the measurement using coarse movement stage position measuring system 68B. Then, main controller 20 makes wafer stage WST2 wait at the predetermined standby position described above until exposure on wafer W on fine movement stage WFS1 is completed.

Figure 35:
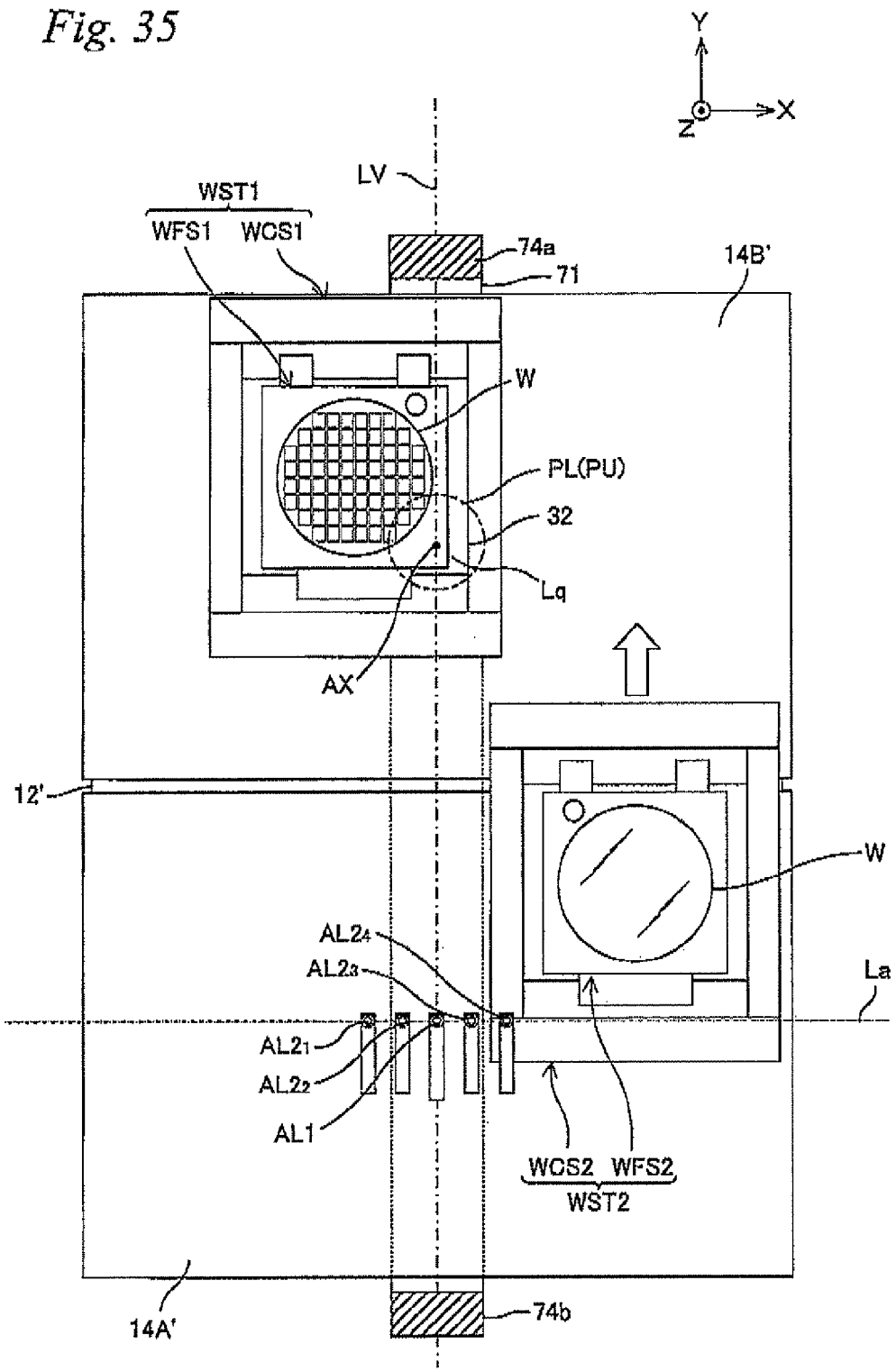
FIG. 35 is a view showing a state where wafer stage WST2 moves toward an exposure station on guide surface forming member 14B in the exposure apparatus of the fourth embodiment.

When the exposure on wafer W on fine movement stage WFS1 has been completed, in order to perform replacement of the wafer stage with respect to exposure station 200 (in this case, the replacement from wafer stage WST1 to wafer stage WST2), main controller 20 drives wafer stage WST1 in the –X direction to move wafer stage WST1 to the –X side on surface plate 14B' On this operation, fine movement stage WFS1 goes out of the measurable range of fine movement stage position measuring system 70 (encoders 51, 52 and 53 and surface position measuring system 54) (i.e. the measurement beams irradiated from first measurement head group 72 move off from grating RG). Therefore, based on the measurement values of fine movement stage position measuring system 70 (encoders 51, 52 and 53) and the measurement values of relative position measuring system 66A, main controller 20 obtains the position of coarse movement stage WCS1, and afterward, controls the position of wafer stage WST1 based on the measurement values of coarse movement stage position measuring system 68A. More specifically, main controller 20 switches position measurement of wafer stage WST1 within the XY plane from the measurement using encoders 51, 52 and 53 to the measurement using coarse movement stage position measuring system 68A. During this operation, main controller 20 measures the position of wafer stage WST2 using coarse movement stage position measuring system 68A, and based on the measurement result, as shown in FIG. 35, drives wafer stage WST2 in the +Y direction (see an outlined arrow in FIG. 35) on surface plates 14B' and 14A'. Owing to a reaction force of this drive force of wafer stage WST2, surface plates 14A' and 14B' sequentially function as the countermasses.

Subsequently, in order to move wafer stage WST1 to the first loading position shown in FIG. 37, main controller 20 moves wafer stage WST1 in the −Y direction on surface plates 14B' and 14A' and further in the +X direction on surface plate 14A' as shown in FIG. 36, while measuring the position of wafer stage WST using coarse movement stage position measuring system 68A. In this case, on the movement of wafer stage WST1 in the −Y direction, surface plates 14B' and 14A' sequentially function as the countermasses owing to a reaction force of the drive force.

Figure 37:
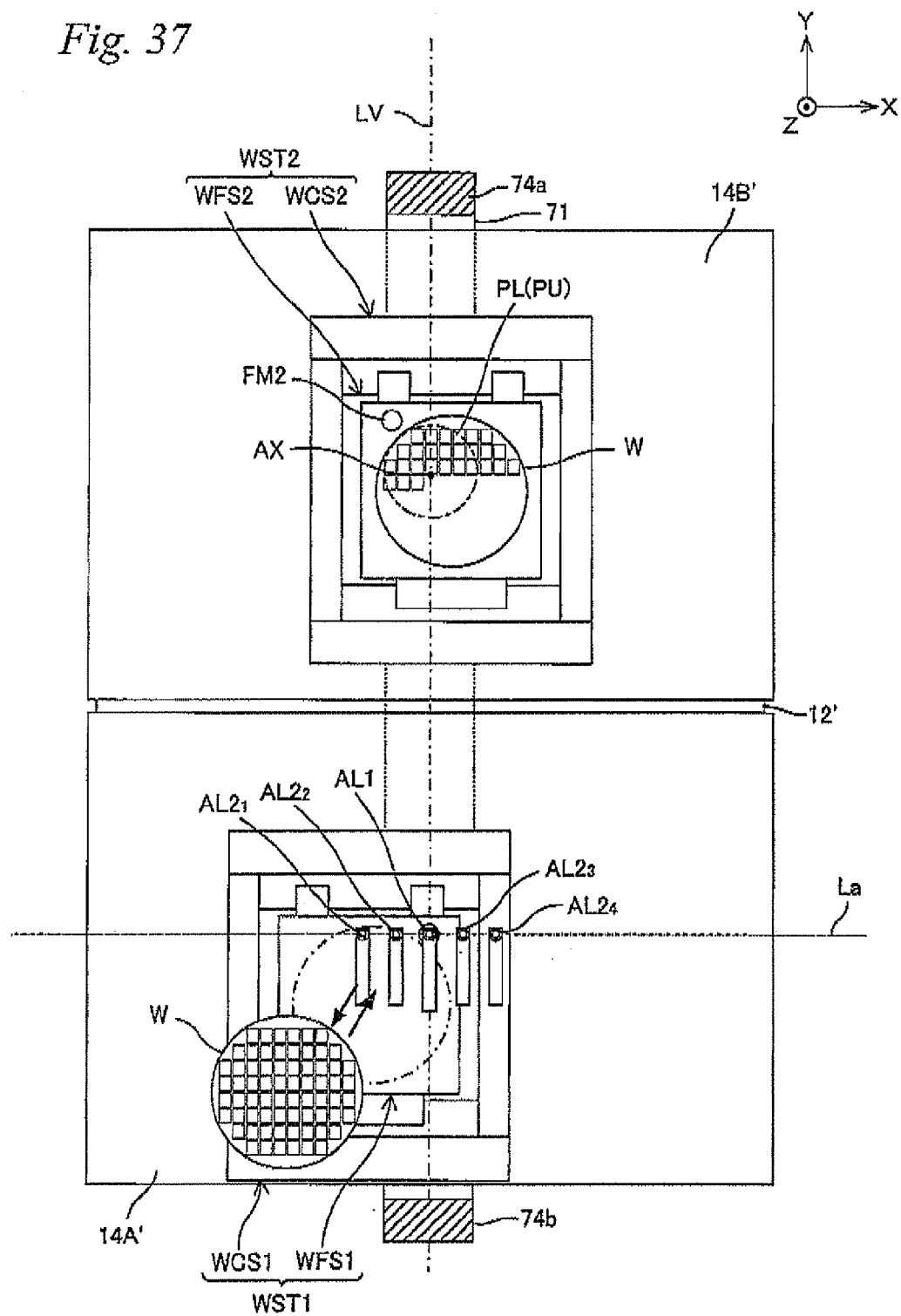
FIG. 37 is a view showing a state where exposure is performed on a wafer mounted on wafer stage WST2 and wafer exchange is performed on wafer stage WST1 in the exposure apparatus of the fourth embodiment.

After wafer stage WST1 has reached the first loading position shown in FIG. 37, main controller 20 switches position measurement of wafer stage WST1 within the XY plane from the measurement using coarse movement stage position measuring system 68A to the measurement using encoders 55, 56 and 57.

In parallel with the movement of wafer stage WST1 described above, as shown in FIG. 36, main controller 20 drives wafer stage WST2 in the −X direction and sets the position of measurement plate FM2 at a position directly under projection optical system PL. Prior to this operation, main controller 20 has switched position measurement of wafer stage WST2 within the XY plane from the measurement using coarse movement stage position measuring system 68B to the measurement using encoders 51, 52 and 53. Then, the pair of first fiducial marks on measurement plate FM2 are detected using reticle alignment systems $RA_1$ and $RA_2$ and the relative position of projected images, on the wafer, of the reticle alignment marks on reticle R that correspond to the first fiducial marks are detected.

Based on the relative positional information detected as above and the positional information of each of the shot areas on wafer W with the second fiducial mark on fine movement stage WFS2 serving as a reference that has been previously obtained, main controller 20 computes the relative positional relation between the projection position of the pattern of reticle R (the projection center of projection optical system PL) and each of the shot areas on wafer W mounted on fine movement stage WFS2. While controlling the position of fine movement stage WFS2 (wafer stage WST2) based on the computation results, main controller 20 transfers the pattern of reticle R onto each shot area on wafer W mounted on fine movement stage WFS2 by a step-and-scan method, which is similar to the case of wafer W mounted on fine movement stage WFS1 described earlier. FIG. 37 shows a state where the pattern of reticle R is transferred onto each shot area on wafer W in this manner.

In parallel with the above-described exposure operation on wafer W on fine movement stage WFS2, main controller 20 performs the wafer exchange between the wafer carrier mechanism (not illustrated) and wafer stage WST1 at the first loading position and mounts a new wafer W on fine movement stage WFS1. In this case, the first loading position is a position where the wafer exchange is performed on wafer stage WST1, and in the present embodiment, the first loading position is to be set at the position where fine movement stage WFS1 (wafer stage WST1) is located such that measurement plate FM1 is positioned directly under primary alignment system AL1.

Then, main controller 20 detects the second fiducial mark on measurement plate FM1 using primary alignment system AL1. Note that, prior to the detection of the second fiducial mark, main controller 20 executes reset (resetting of the origin) of second measurement head group 73 of fine movement stage position measuring system 70, or more specifically, encoders 55, 56 and 57 (and surface position measuring system 58), in a state where wafer stage WST1 is located at the first loading position. After that, main controller 20 performs wafer alignment (EGA) using alignment systems AL1 and $AL2_1$ to $AL2_4$, which is similar to the above-described one, with respect to wafer W on fine movement stage WFS1, while controlling the position of wafer stage WST1.

When the wafer alignment (EGA) with respect to wafer W on fine movement stage WFS1 has been completed and also the exposure on wafer W on fine movement stage WFS2 has been completed, main controller 20 drives wafer stage WST1 in the +Y direction on surface plates 14A' and 14B' and drives wafer stage WST2 in the −Y direction on surface plates 14B' and 14A', respectively, in order to perform replacement of the wafer stage with respect to exposure station 200 (in this case, the replacement from wafer stage WST2 to wafer stage WST1). Measurement of the position of wafer stage WST1 during the drive from measurement station 300 to exposure station 200 is performed in a similar procedure to that of the position measurement of wafer stage WST2 described earlier.

Then, main controller 20 starts exposure on wafer W on wafer stage WST1 in the procedure similar to the previously described procedure. In parallel with this exposure operation, main controller 20 drives wafer stage WST2 toward the second loading position in a manner similar to the previously described manner, exchanges wafer W that has been exposed on wafer stage WST2 with a new wafer W, and executes the wafer alignment with respect to the new wafer W.

After that, main controller 20 repeatedly executes the parallel processing operations using wafer stages WST1 and WST2 described above.

As described above, in exposure apparatus 2000 of the present fourth embodiment, the surface plate that sets the guide surface used when wafer stages WST1 and WST2 move along the n plane is configured of the two surface plates 14A' and 14B' so as to correspond to exposure station 200 and measurement station 300. Theses two surface plates 14A' and 14B' independently function as the countermasses when wafer stages WST1 and WST2 are driven by the planar motors (coarse movements stage driving systems 62A and 623). Therefore, even when wafer stage WST1 and wafer stage WST2 are each driven on surface plates 14A' and 14B', surface plates 14A' and 14B' can cancel the reaction forces that respectively act on the surface plates. Further, surface plates 14A' and 14B' are mechanically separated via a predetermined clearance with the position between exposure station 200 and measurement station 300 serving as the boundary, and therefore, when wafer exchange on one of the wafer stages is performed, vibration of the wafer stage and surface plate 14A' generated on the wafer exchange does not affect the other wafer stage. Further, when wafer alignment on one of the wafer stages is performed, even if a reaction force of a drive force of the wafer stage acts on surface plate 14A', the reaction force does not affect surface plate 14B" and the other wafer stage.

Further, reversely to the above-described case, when exposure on a wafer on one of the wafer stages is performed, even if a reaction force of a drive force of the wafer stage acts on surface plate 14B', the reaction force does not affect surface plate 14A' and the other wafer stage.

Further, since measurement bar 71 that has first measurement head group 72 and second measurement head group 73 is fixed in a suspended state to main frame BD to which barrel 40 is fixed, it becomes possible to perform high-precision position control of wafer stage WST1 (or WST2) with the optical axis of projection optical system PL held by barrel 40 serving as a reference. Further, since measurement bar 71 is in a mechanically noncontact state with the members other than main frame BD (e.g. surface plates 14A' and 14B', base board 12', and the like), vibration or the like, which is generated when wafer stages WST1 and WST2 and the like are driven, is not transmitted. Consequently, it becomes possible to perform high-precision measurement of the positional information of wafer stage WST1 (or WST2), by using first measurement head group 72 and second measurement head group 73.

Fifth Embodiment

Next, a fifth embodiment of the present invention is described with reference to FIGS. 38A to 39. Herein, the same or similar reference signs are used for the components that are the same as or similar to those in the fourth embodiment described previously, and the description thereabout is simplified or omitted.

Figure 38A:
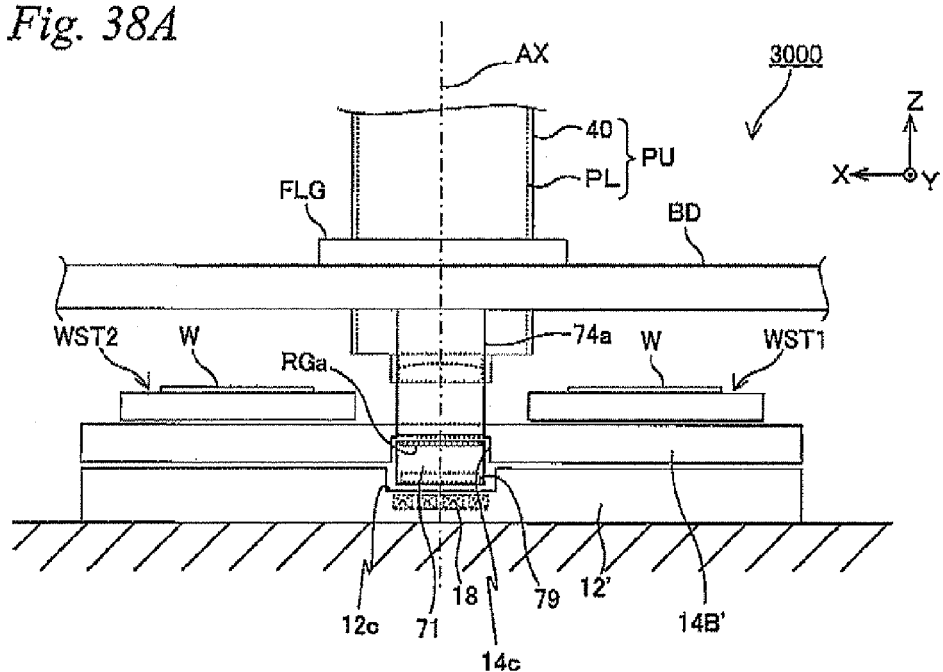
FIG. 38A is a side view of an exposure apparatus of a fifth embodiment when viewed from the +Y side.
Figure 38B:
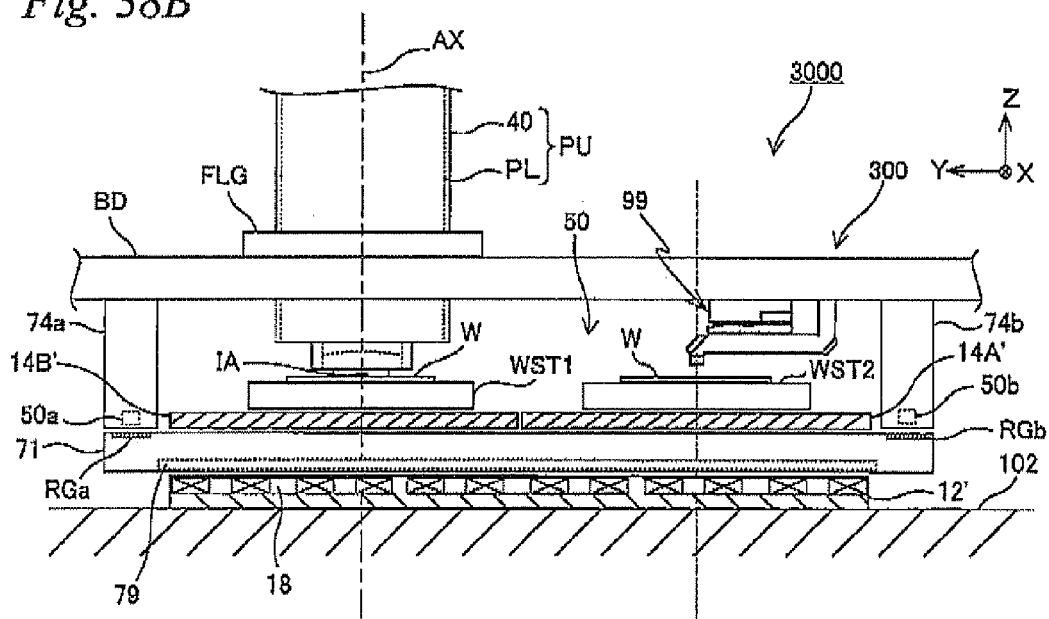
FIG. 38B is a side view (partial cross sectional view) of the exposure apparatus of FIG. 38A when viewed from the −X side.

FIG. 38A shows a side view of an exposure apparatus 3000 of the fifth embodiment when viewed from the +Y side, and FIG. 38B is a side view (partial cross sectional view) of exposure apparatus 3000 when viewed from the −X side. And, FIG. 39 shows input/output relations of a main controller which exposure apparatus 3000 is equipped with.

Figure 39:
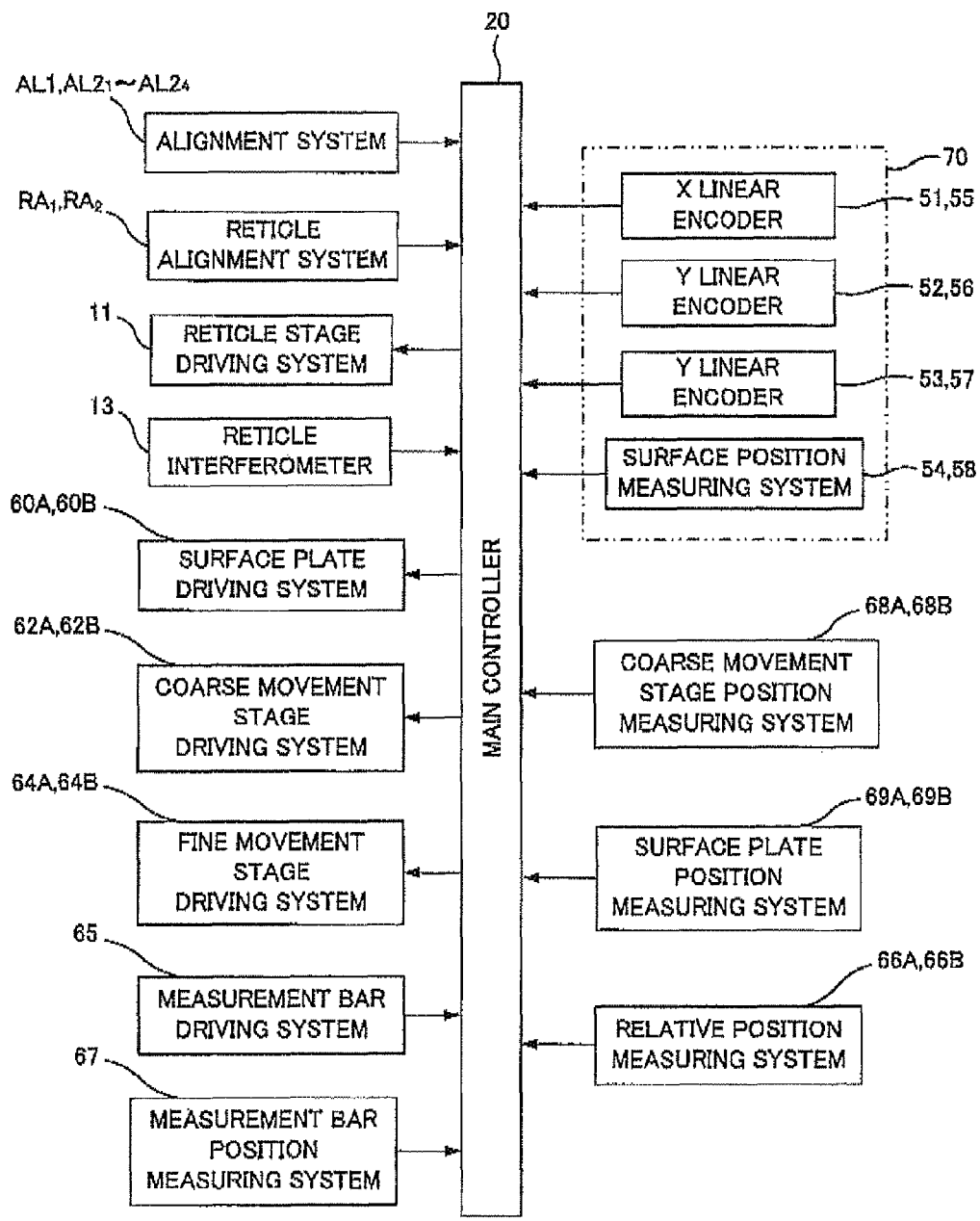

As can be seen when comparing the block diagram used to explain the input/output relations of main controller 20 shown in FIG. 39 and FIG. 32 described earlier, exposure apparatus 3000 is different from exposure apparatus 2000 of the fourth embodiment described earlier in that exposure apparatus 3000 is equipped with measurement bar position measuring system 67 and measurement bar driving system 65 which exposure apparatus 2000 is not equipped with. Exposure apparatus 3000 is described below, mainly focusing on the different point.

As shown in FIGS. 38A and 38B, on the lower side of the inner bottom surface of recessed section 12c of base board 12', coil unit 18 is housed that includes a plurality of coils placed in a matrix shape with the XY two-dimensional directions serving as a row direction and a column direction. The magnitude and direction of the electric current supplied to each of the coils that configure coil unit 18 are controlled by main controller 20 (see FIG. 39).

Further, inside (on the bottom portion of) of measurement bar 71 of fine movement stage position measuring system 70, magnetic unit 79 including a plurality of magnets is placed. Magnetic unit 79 and coil unit 18 described above configure measurement bar driving system 65 (see FIG. 39) made up of a planar motor by the electromagnetic force (Lorentz force) drive method that is capable of driving measurement bar 71 in the directions of six degrees of freedom.

Measurement bar 71 is supported by levitation (supported in a noncontact manner) above base board 12', by a drive force in the +Z direction generated by the planar motor that configures measurement bar driving system 65. The +Z side half (upper half) of measurement bar 71 is placed between surface plate 14A' and surface plate 14B', and the side half (lower half) is housed inside recessed section 12c formed at base board 12'. Further, a predetermined clearance is formed between measurement bar 71 and each of surface plates 14A" and 14B' and base board 12', and measurement bar 71 and each of surface plates 14A' and 14B' and base board 12' are in a state mechanically noncontact with each other.

In the present fifth embodiment as well, similarly to the third embodiment, measurement bar driving system 65 can be configured such that disturbance such as floor vibration is not transmitted to measurement bar 71. In the case where measurement bar driving system 65 cannot make the force in the Z-axis direction act on measurement bar 71, the disturbance such as vibration can be prevented, for example, by installing the member (coil unit 18 or magnetic unit 79) that is installed on the floor side, of the measurement bar driving system, via a vibration isolating mechanism. However, such configuration is not intended to be limiting.

Similarly to the first embodiment described earlier, in exposure apparatus 3000 of the present fifth embodiment, into the recessed sections formed on the upper surfaces of both ends of measurement bar 71 in the longitudinal direction, thin plate-shaped plates are respectively fitted, on which two-dimensional grating RGa and RGb (hereinafter, simply referred to as gratings RGa and RGb) are respectively formed (see FIG. 38B).

As shown in FIG. 38B, the lower ends of a pair of suspended support members 74a and 74b whose upper ends are each fixed to the lower surface of main frame BD, are respectively opposed, via a predetermined clearance, to gratings RGa and RGb placed at measurement bar 71. Inside the lower ends of the pair of suspended support members 74a and 74b, a pair of head units 50a and 50b are respectively housed, each of which includes a diffraction interference type encoder head having a configuration in which a light source, a photodetection system (including a photodetector) and various types of optical systems are unitized, which is similar to the encoder head disclosed in, for example, PCT International Publication No. 2007/083758 (the corresponding U.S. Patent Application Publication No. 2007/0288121) and the like. The pair of head units 50a and 50b each include a pair of X heads, a pair of Y heads and one Z head or two Z heads, and are configured similar to the pair of head units 50a and 50b in the first embodiment described earlier.

More specifically, the pair of Y heads respectively belonging to head units 50a and 50b configure a pair of Y linear encoders that measure the position of measurement bar 71 in the Y-axis direction with (the reference point on) main frame BD serving as a reference, and the pair of X heads respectively belonging to head units 50a and 50b configure a pair of X linear encoders that measure the position of measurement bar 71 in the X-axis direction with (the reference point on) main frame BD serving as a reference.

The measurement values of the pair of the X heads (X linear encoders) and the pair of the Y heads (Y linear encoders) are supplied to main controller 20 (see FIG. 39), and main controller 20 respectively computes the relative position of measurement bar 71 in the Y-axis direction with respect to (the reference point on) main frame BD based on the average value of the measurement values of the pair of Y linear encoders, and the relative position of measurement bar 71 in the X-axis direction with respect to (the reference point on) main frame BD based on the average value of the measurement values of the pair of X linear encoders. Further, main controller 20 computes the position in the θz direction (rotational amount around the Z-axis) of measurement bar 71 based on the difference between the measurement values of the pair of the X linear encoders.

Based on the measurement values of the three Z heads in total placed at the three noncollinear positions that are included in head units 50a and 50b, main controller 20 computes the position in the Z-axis direction and the rotational amount in the θx and θy directions of measurement bar 71 with (the measurement reference surface of) main frame BD serving as a reference. Incidentally, the surface position information of measurement bar 71 can be measured by, for example, an optical interferometer system that includes an optical interferometer. In such a case, the pipe (fluctuation preventing pipe) used to isolate the measurement beam irradiated from the optical interferometer from surrounding atmosphere, e.g., air can be fixed to suspended support members 74a and 74b.

In exposure apparatus 3000 of the present fifth embodiment, the plurality of the encoder heads (X linear encoders, Y linear encoders) described above and the Z heads (surface position measuring system), which head units 50a and 50b have, configure measurement bar position measuring system 67 (see FIG. 39) that measures the relative position of measurement bar 71 in the directions of six degrees of freedom with respect to main frame BD. Based on the measurement values of measurement bar position measuring system 67, main controller 20 constantly measures the relative position of measurement bar 71 with respect to main frame BD, and controls measurement bar driving system 65 to control the position of measurement bar 71 such that the relative position between measurement bar 71 and main frame BD does not vary (i.e. such that measurement bar 71 and main frame BD are in a state similar to being integrally configured).

The configuration of the other parts of exposure apparatus 3000 is similar to that of exposure apparatus 2000 of the fourth embodiment described earlier. According to exposure apparatus 3000 of the present fifth embodiment configured as described above, main controller 20 constantly controls the position in the directions of six degrees of freedom of measurement bar 71 that has first measurement head group 72 and second measurement head group 73 based on the measurement value of measurement bar measuring system 67 such that the relative position with respect to main frame BD does not vary. Consequently, exposure apparatus 3000 of the present fifth embodiment brings about the operations and effects equivalent to exposure 2000 of the fourth embodiment described earlier. In addition, since measurement bar 71 is placed below surface plates 14A' and 14B' so as to mechanically be separated from main frame BD, the measurement accuracy of the positional information of fine movement stage WFS1 (or WFS2) by fine movement stage position measuring system 70 is not degraded owing to deformation (e.g. twist) of measurement bar 71 caused by inner stress (including thermal stress) and transmission of vibration from main frame BD to measurement bar 71, and the like, which is different from the case where main frame BD and measurement bar 71 are integrated.

Incidentally, in the fourth and fifth embodiments above, the case has been described where measurement bar 71 that has first measurement head group 72 and second measurement head group 73 is placed along the Y-axis direction (the direction in which surface plates 14A' and 14B' are placed side by side). However, this is not intended to be limiting, and for example, it is also possible that a support member (referred to as a first measurement bar for the sake of convenience) that has only first measurement head group 72 and is similar to the measurement bar and a support member (referred to as a second measurement bar for the sake of convenience) that has only second measurement head group 73 and is similar to the measurement bar are prepared, and these support members are placed along the X-axis direction so as to respectively traverse an area directly under projection optical system PL and an area directly under the detection areas of alignment systems AL1 and $AL2_1$ to $AL2_4$. Or, only the first measurement bar can be arranged.

As a matter of course, also in the case of placing the measurement bars along the X-axis direction, it is desired that the substantial measurement center of first measurement head group 72 coincides with the foregoing exposure position that is the center of the irradiation area (exposure area IA) of illumination light IL irradiated on wafer W, and that substantial measurement center of second measurement head group 73 coincides with the detection center of primary alignment system AL1.

Further, in the case of placing the first measurement bar and the second measurement bar along the X-axis direction, it is also possible that at least one of the first and second measurement bars is placed so as to mechanically be separated from main frame BD, similarly to the fifth embodiment described above, and main controller 20 constantly controls the position (which is not limited to the position in the directions of six degrees of freedom, but can be the position in directions of three degrees of freedom that are X, Y and θz) of the at least one measurement bar based on the measurement result of the measurement bar position measuring system via measurement bar driving system 65 such that the relative position with respect to main frame BD does not vary. Or, at least one of the first and second measurement bars can be fixed to main frame BD, similarly to the fourth embodiment described earlier. In such a case as well, both ends of the at least one measurement bar can be fixed in a suspended state to main frame BD via the suspended support members.

Figure 40:
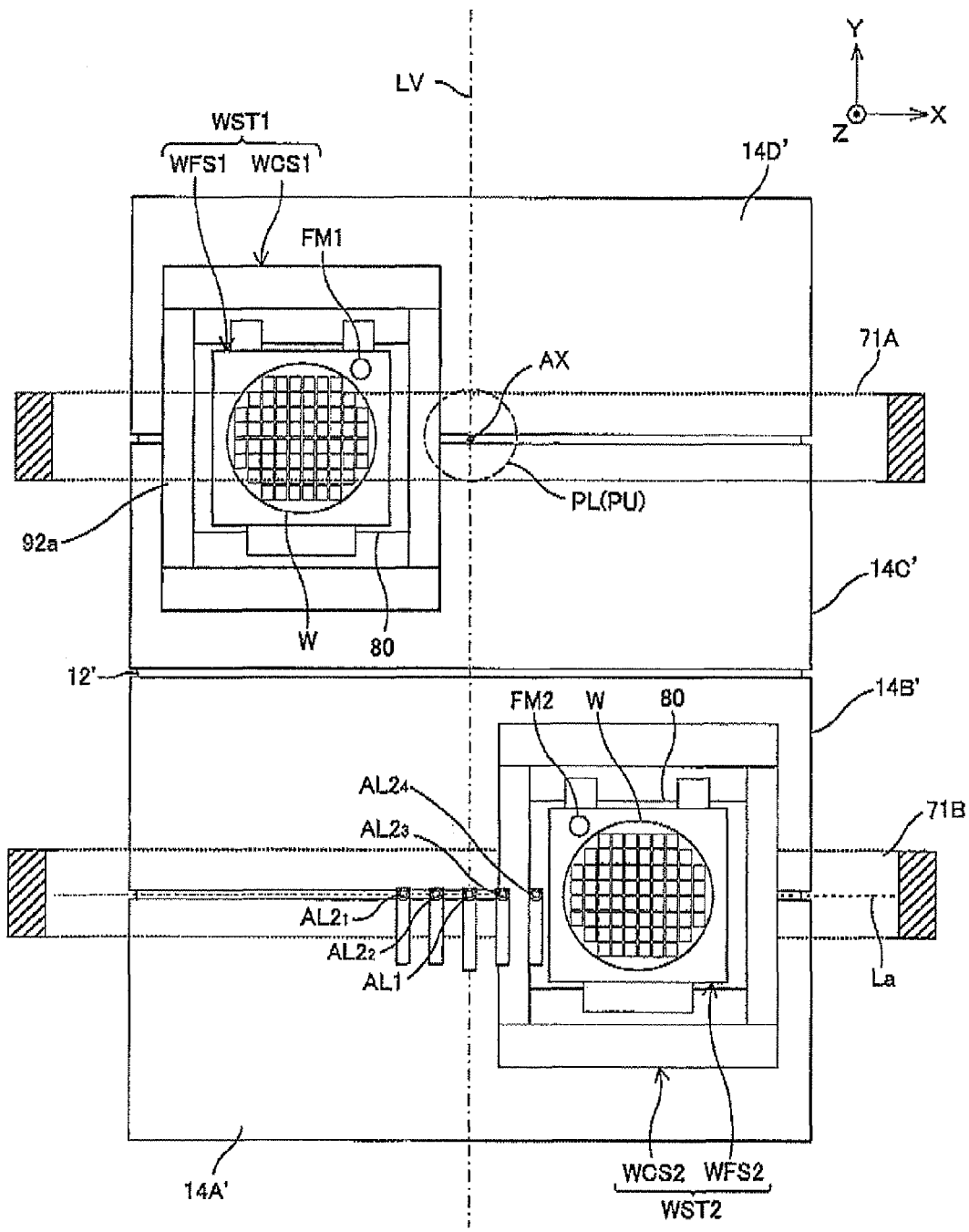
FIG. 40 is a plan view showing an exposure apparatus related to a modified example.

Further, in the exposure apparatuses of the fourth and fifth embodiments above, the position of the border line that separates the surface plate or the base member into a plurality of sections is not limited to the position as described above. The border line can be set at another position, for example, in the case where, if the boundary is located in the exposure station, the thrust of the planar motor at the portion where the boundary is located weakens. Further, while the exposure apparatus has the two surface plates, the number of the surface plates is not limited to two but three or more surface plates can be employed. As shown in FIG. 40, for example, it is also possible that a first measurement bar 71A that has only first measurement head group 72 and a second measurement bar 71B that has only second measurement head group 73 are placed along the X-axis direction so as to respectively traverse an area directly under projection optical system PL and an area directly under the detection areas of alignment systems AL1 and $AL2_1$ to $AL2_4$, and the four surface plates 14A', 14B', 14C' and 14D' are placed side by side on base board 12'. In an example shown in FIG. 40, there is a gap, which serves as the boundary between surface plates 14C' and 14D', above first measurement bar 71A, there is a gap, which serves as the boundary between surface plates 14C' and 14B', in substantially the center between the optical axis of projection optical system PL and the detection center of primary alignment system AL1, and there is a gap, which serves as the boundary between surface plates 14A' and 14B', above second measurement bar 71B.

Incidentally, in the case of arranging the four surface plates similarly to the examples shown in FIGS. 27 and 40, the four surface plates can be placed in a matrix shape with two rows and two columns.

Incidentally, in each of the embodiments above, the number of the wafer stages is also not limited to two, but one wafer stage or three or more wafer stages can be employed. For example, even in the case where one wafer stage is employed, if the guide surface used on movement of the wafer stage is set by a plurality of surface plates, each surface plate is easier to handle and also maintenance of the vicinity of the surface plates is easier to perform, compared with the case where the surface plates are integrated. Further, a measurement stage, for example, which has an aerial image measuring instrument, an uneven illuminance measuring instrument, an illuminance monitor, a wavefront aberration measuring instrument and the like, can be placed on the surface plate, which is disclosed in, for example, U.S. Patent Application Publication No. 2007/0201010.

Incidentally, in each of the embodiments above, while the case has been described where the coarse/fine movement stage composed of the coarse movement stage that moves in the XY two-dimensional directions within a predetermined range on the surface plate and the fine movement stage that is finely driven on the coarse movement stage is used as a wafer stage, this is not intended to be limiting, and the various modifications can be applied to the configuration of the wafer stage.

Further, in each of the embodiments above, the mid portion (which can be arranged at a plurality of positions) in the longitudinal direction of measurement bar 71 can be supported on the base board by an empty-weight canceller as disclosed in, for example. U.S. Patent Application Publication No. 2007/0201010.

Further, in each of the embodiments above, the motor to drive the surface plate on the base board is not limited to the planar motor by the electromagnetic force (Lorentz force) drive method, but for example, can be a planar motor (or a linear motor) by a variable magnetoresistance drive method. Further, the motor is not limited to the planar motor, but can be a voice coil motor that includes a mover fixed to the side surface of the surface plate and a stator fixed to the base board. Further, the surface plates can be supported on the base board via the empty-weight canceller as disclosed in, for example, U.S. Patent Application Publication No. 2007/0201010 and the like. Further, the drive directions of the surface plates are not limited to the directions of three degrees of freedom, but for example, can be the directions of six degrees of freedom, only the Y-axis direction, or only the XY two-axial directions. In this case, the surface plates can be levitated above the base board by static gas bearings (e.g. air bearings) or the like. Further, in the case where the movement direction of the surface plates can be only the Y-axis direction, the surface plates can be mounted on, for example, a Y guide member arranged extending in the Y-axis direction so as to be movable in the Y-axis direction.

Further, in each of the embodiments above, while the grating is placed on the lower surface of the fine movement stage, i.e., the surface that is opposed to the upper surface of the surface plate, this is not intended to be limiting, and the main section of the fine movement stage is made up of a solid member that can transmit light, and the grating can be placed on the upper surface of the main section. In this case, since the distance between the wafer and the grating is closer compared with the embodiment above, the Abbe error, which is caused by the difference in the Z-axis direction between the surface subject to exposure of the wafer that includes the exposure point and the reference surface (the placement surface of the grating) of position measurement of the fine movement stage by encoders 51, 52 and 53, can be reduced. Further, the grating can be formed on the back surface of the wafer holder.

In this case, even if the wafer holder expands or the attachment position with respect to the fine movement stage shifts during exposure, the position of the wafer holder (wafer) can be measured according to the expansion or the shift.

Further, in each of the embodiments above, while the case has been described as an example where the encoder system is equipped with the X head and the pair of Y heads, this is not intended to be limiting, and for example, one or two two-dimensional head(s) (2D head(s)) whose measurement directions are the two directions that are the X-axis direction and the Y-axis direction can be placed inside the measurement bar. In the case of arranging the two 2D heads, their detection points can be set at the two points that are spaced apart in the X-axis direction at the same distance from the exposure position as the center, on the grating. Further, in each of the embodiments above, while the number of the heads included in one head group is one X head and two Y heads, the number of the heads can further be increased. Moreover, first measurement head group 72 on the exposure station 300 side can further have a plurality of head groups. For example, on each of the sides (the four directions that are the +X, +Y, −X and −Y directions) on the periphery of the head group placed at the position corresponding to the exposure position (a shot area being exposed on wafer W), another head group can be arranged. And, the position of the fine movement stage (wafer W) just before exposure of the shot area can be measured in a so-called read-ahead manner. Further, the configuration of the encoder system that configures fine movement stage position measuring system 70 is not limited to the one in each of the embodiments above and an arbitrary configuration can be employed. For example, a 3D head can also be used that is capable of measuring the positional information in each direction of the X-axis, the Y-axis and the Z-axis.

Further, in each of the embodiments above, a temperature sensor, a pressure sensor, an acceleration sensor for vibration measurement, and the like can be arranged at measurement bar 71. Further, a distortion sensor, a displacement sensor and the like to measure deformation (such as twist) of measurement bar 71 can be arranged. Then, it is also possible to correct the positional information obtained by fine movement stage position measuring system 70 and/or coarse movement stage position measuring systems 68A and 68B, using the values obtained by these sensors.

Further, in each of the embodiments above, the measurement beams emitted from the encoder heads and the measurement beams emitted from the Z heads are irradiated on the gratings of the fine movement stages via a gap between the two surface plates or the light-transmitting section formed at each of the surface plates. In this case, as the light-transmitting section, holes each of which is slightly larger than a beam diameter of each of the measurement beams are formed at each of the two surface plates taking the movement range of the surface plate as the countermass into consideration, and the measurement beams can be made to pass through these multiple opening sections. Further, for example, it is also possible that pencil-type heads are used as the respective encoder heads and the respective Z heads, and opening sections in which these heads are inserted are formed at each of the surface plates.

Incidentally, in each of the embodiments above, similarly to the first embodiment, while each of X heads $75x$ and $77x$ and Y heads $75ya$, $75yb$, $77ya$ and $77yb$ has the light source, the photodetection system (including the photodetector) and the various types of optical systems (none of which are illustrated) that are unitized and placed inside measurement bar 71, the configuration of the encoder head is not limited thereto. For example, the light source and the photodetection system can be placed outside the measurement bar. In such a case, the optical systems placed inside the measurement bar, and the light source and the photodetection system are connected to each other via, for example, an optical fiber or the like. Further, a configuration can also be employed in which the encoder head is placed outside the measurement bar and only a measurement beam is guided to the grating via an optical fiber placed inside the measurement bar. Further, the rotational information of the wafer in the θz direction can be measured using a pair of the X liner encoders (in this case, there should be one Y linear encoder). Further, the surface position information of the fine movement stage can be measured using, for example, an optical interferometer. Further, instead of the respective heads of first measurement head group 72 and second measurement head group 73, three encoder heads in total, which include at least one XZ encoder head whose measurement directions are the X-axis direction and the Z-axis direction and at least one YZ encoder head whose measurement directions are the Y-axis direction and the Z-axis direction, can be arranged in the placement similar to that of the X head and the pair of Y heads described earlier.

Further, measurement bar 71 can be divided into a plurality of sections. For example, it is also possible that measurement bar 71 is divided into a section having first measurement head group 72 and a section having second measurement head group 73, and the respective sections (measurement bars) detect the relative position with main frame BD, with (the measurement reference surface of) main frame BD serving as a reference and perform control such that the positional relation is constant. In this case, a head unit, which includes a plurality of encoder heads and Z heads (surface position measuring system), is arranged at both ends of the respective sections (measurement bars), and the positions in the Z-axis direction and the rotational amount in the θx and θy directions of the respective sections (measurement bars) can be computed.

Further, in each of the embodiments above, the measurement surface (grating RG) is arranged at fine movement stages WFS1 and WFS2 and first measurement head group 72 (and second measurement head group 73) composed of the encoder heads (and the Z heads) is arranged at the measurement bar 71. However, this is not intended to be limiting, reversely to the above-described case, it is also possible that the encoder heads (and the Z heads) are arranged at fine movement stage WFS1 and the measurement surface (grating RG) is formed at measurement bar 71. The place where grating RG is arranged on the measurement bar 71 side can be, for example, measurement bar 71, or a plate of a nonmagnetic material or the like that is arranged on the entire surface or at least one surface on the surface plate.

Further, while the case has been described where each of the embodiments above is applied to stage device (wafer stages) 50 of the exposure apparatus, this is not intended to be limiting, and the each of the embodiments above can also be applied to reticle stage RST.

Incidentally, in each of the embodiments above, grating RG can be covered with a protective member, e.g. a cover glass, so as to be protected. The cover glass can be arranged to cover the substantially entire surface of the lower surface of main section 80, or can be arranged to cover only a part of the lower surface of main section 80 that includes grating RG. Further, while a plate-shaped protective member is desirable because the thickness enough to protect grating RG is required, a thin film-shaped protective member can also be used depending on the material.

Besides, it is also possible that a transparent plate, on one surface of which grating RG is fixed or formed, has the other surface that is placed in contact with or in proximity to the back surface of the wafer holder and a protective member (cover glass) is arranged on the one surface side of the transparent plate, or the one surface of the transparent plate on which grating RG is fixed or formed is placed in contact with or in proximity to the back surface of the wafer holder without arranging the protective member (cover glass). Especially in the former case, grating RG can be fixed or formed on an opaque member such as ceramics instead of the transparent plate, or grating RG can be fixed or formed on the back surface of the wafer holder. In the latter case, even if the wafer holder expands or the attachment position with respect to the fine movement stage shifts during exposure, the position of the wafer holder (wafer) can be measured according to the expansion or the shift. Or, it is also possible that the wafer holder and grating RG are merely held by the conventional fine movement stage. Further, it is also possible that the wafer holder is formed by a solid glass member, and grating RG is placed on the upper surface (wafer mounting surface) of the glass member.

Incidentally, in each of the embodiments above, while the case has been described as an example where the wafer stage is a coarse/fine movement stage that is a combination of the coarse movement stage and the fine movement stage, this is not intended to be limiting. Further, in the each of embodiments above, while fine movement stages WFS1 and WFS2 can be driven in all the directions of six degrees of freedom, this is not intended to be limiting, and the fine movement stages should be moved at least within the two-dimensional plane parallel to the XY plane. Moreover, fine movement stages WFS1 and WFS2 can be supported in a contact manner by coarse movement stages WCS1 and WCS2. Consequently, the fine movement stage driving system to drive fine movement stage WFS1 or WFS2 with respect to coarse movement stage WCS1 or WCS2 can be a combination of a rotary motor and a ball screw (or a feed screw).

Incidentally, the fine movement stage position measuring system can be configured such that the position measurement can be performed in the entire area of the movement range of the wafer stages. In such a case, the coarse movement stage position measuring systems become unnecessary.

Incidentally, the wafer used in the exposure apparatus of each of the embodiments above can be any one of wafers with various sizes, such as a 450-mm wafer or a 300-mm wafer.

Incidentally, the exposure apparatus in each of the embodiments above can be either of a wet type (liquid immersion type) exposure apparatus that is disclosed in, for example, PCT International Publication No 99/49504, U.S. Patent Application Publication No. 2005/0259234 and the like, or a dry type exposure apparatus that performs exposure of wafer W without liquid (water).

Incidentally, in each of the embodiments above, while the case has been described where the exposure apparatus is a scanning stepper, this is not intended to be limiting, and each of the embodiments above can also be applied to a static exposure apparatus such as a stepper. Even in the stepper or the like, occurrence of position measurement error caused by air fluctuation can be reduced to almost zero by measuring the position of a stage on which an object that is subject to exposure is mounted using an encoder. Therefore, it becomes possible to set the position of the stage with high precision based on the measurement values of the encoder, and as a consequence, high-precision transfer of a reticle pattern onto the object can be performed. Further, each of the embodiments above can also be applied to a reduced projection exposure apparatus by a step-and-stitch method that synthesizes a shot area and a shot area.

Further, the magnification of the projection optical system in the exposure apparatus in each of the embodiments above is not only a reduction system, but also can be either an equal magnifying system or a magnifying system, and the projection optical system is not only a dioptric system, but also can be either a catoptric system or a catadioptric system, and in addition, the projected image can be either an inverted image or an erected image.

Further, illumination light IL is not limited to ArF excimer laser light (with a wavelength of 193 nm), but can be ultraviolet light such as KrF excimer laser light (with a wavelength of 248 nm), or vacuum ultraviolet light such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser with a fiber amplifier doped with, for example, erbium (or both erbium and ytteribium), and by converting the wavelength into ultraviolet light using a nonlinear optical crystal, can also be used as vacuum ultraviolet light.

Further, in each of the embodiments above, illumination light IL of the exposure apparatus is not limited to the light having a wavelength more than or equal to 100 nm, and it is needless to say that the light having a wavelength less than 100 nm can be used. For example, each of the embodiments above can be applied to an EUV (Extreme Ultraviolet) exposure apparatus that uses EUV light in a soft X-ray range (e.g. a wavelength range from 5 to 15 nm). In addition, the each of the embodiments above can also be applied to an exposure apparatus that uses charged particle beams such as an electron beam or an ion beam.

Further, in the embodiment above, a light transmissive type mask (reticle) is used, which is obtained by forming a predetermined light-shielding pattern (or a phase pattern or a light-attenuation pattern) on a light-transmitting substrate, but instead of this reticle, as disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display element (spatial light modulator) or the like) on which a light-transmitting pattern, a reflection pattern, or an emission pattern is formed according to electronic data of the pattern that is to be exposed can also be used. In the case of using such a variable shaped mask, a stage on which a wafer, a glass plate or the like is mounted is scanned relative to the variable shaped mask, and therefore the equivalent effect to the embodiment above can be obtained by measuring the position of this stage using an encoder system.

Further, as disclosed in, for example, PCT International Publication No. 2001/035168, each of the embodiments above can also be applied to an exposure apparatus (a lithography system) in which line-and-space patterns are formed on wafer W by forming interference fringes on wafer W.

Moreover, each of the embodiments above can also be applied to an exposure apparatus that synthesizes two reticle patterns on a wafer via a projection optical system and substantially simultaneously performs double exposure of one shot area on the wafer by one scanning exposure, as disclosed in, for example, U.S. Pat. No. 6,611,316.

Incidentally, an object on which a pattern is to be formed (an object subject to exposure on which an energy beam is irradiated) in each of the embodiments above is not limited to a wafer, but may be another object such as a glass plate, a ceramic substrate, a film member, or a mask blank.

The usage of the exposure apparatus is not limited to the exposure apparatus used for manufacturing semiconductor devices, but the present invention can be widely applied also to, for example, an exposure apparatus for manufacturing liquid crystal display elements in which a liquid crystal display element pattern is transferred onto a rectangular glass plate, and to an exposure apparatus for manufacturing organic EL, thin-film magnetic heads, imaging devices (such as CCDs), micromachines, DNA chips or the like. Further, each of the embodiments above can also be applied to an exposure apparatus that transfers a circuit pattern onto a glass substrate, a silicon wafer or the like not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

Incidentally, the disclosures of all publications, the PCT International Publications, the U.S. Patent Application Publications and the U.S. Patents that are cited in the description so far related to exposure apparatuses and the like are each incorporated herein by reference.

Electron devices such as semiconductor devices are manufactured through the following steps: a step where the function/performance design of a device is performed; a step where a reticle based on the design step is manufactured; a step where a wafer is manufactured using a silicon material; a lithography step where a pattern of a mask (the reticle) is transferred onto the wafer with the exposure apparatus (pattern formation apparatus) of the embodiment described earlier and the exposure method thereof; a development step where the exposed wafer is developed; an etching step where an exposed member of an area other than an area where resist remains is removed by etching; a resist removing step where the resist that is no longer necessary when the etching is completed is removed; a device assembly step (including a dicing process, a bonding process, and a packaging process); an inspection step; and the like. In this case, in the lithography step, the exposure method described earlier is executed using the exposure apparatus of the embodiment above and device patterns are formed on the wafer, and therefore, the devices with high integration degree can be manufactured with high productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes an object with an energy beam via an optical system supported by a first support member, the apparatus comprising:

a movable body that is movable along a two-dimensional plane that includes a first axis and a second axis orthogonal to each other, while holding the object;

a guide surface forming member which has a first section and a second section that are placed side by side with, at least one border line serving as a boundary, within the two-dimensional plane, the first section and the second section forming a guide surface used on movement of the movable body;

a second support member that is placed on a side opposite to the optical system via the guide surface forming member so as to be away from the guide surface forming member, and has a positional relation with the first support member maintained in a predetermined relation; and a measurement system which includes a measurement member that irradiates a measurement surface parallel to the two-dimensional plane with a measurement beam and receives light from the measurement surface, and which obtains positional information of the movable body at least within the two-dimensional plane based on an output of the measurement member, the measurement surface being arranged at one of the movable body and the second support member and at least a part of the measurement member being arranged at the other of the movable body and the second support member.

2. The exposure apparatus according to claim 1, wherein the border line is parallel to at least one of the first axis and the second axis.

3. The exposure apparatus according to claim 1, wherein the second support member is placed with a direction parallel to one of the first axis and the second axis serving as its longitudinal direction.

4. The exposure apparatus according to claim 1, wherein the guide surface forming member is separable into the first section and the second section with the border line as a boundary.

5. The exposure apparatus according to claim 4, wherein the border line is parallel to the longitudinal direction of the second support member.

6. The exposure apparatus according to claim 4, wherein the first section and the second section are respectively configured of a first surface plate and a second surface plate that are placed via a predetermined clearance corresponding to the border line.

7. The exposure apparatus according to claim 4, further comprising:
a base member that supports the first section and the second section such that the first section and the second section are movable within a plane parallel to the two-dimensional plane.

8. The exposure apparatus according to claim 7, further comprising:
a surface plate driving system that individually drives the first section and the second section with respect to the base member.

9. The exposure apparatus according to claim 7, wherein the second support member is in a noncontact state with all of the first section, the second section and the base member.

10. The exposure apparatus according to claim 7, wherein the base member is made up of two sections that individually support the first section and the second section.

11. The exposure apparatus according to claim 10, wherein at least one of the two sections of the base member is movable in a direction orthogonal to the two-dimensional plane.

12. The exposure apparatus according to claim 11, wherein one of the two sections of the base member is relatively movable with respect to the other of the two sections in a direction along the two-dimensional plane.

13. The exposure apparatus according to claim 1, wherein at least one of the first section and the second section is relatively movable with respect to the second support member in a direction parallel to a third axis that is orthogonal to the two-dimensional plane.

14. The exposure apparatus according to claim 1, wherein the second support member has a positional relation with the optical system that is maintained constant.

15. The exposure apparatus according to claim 14, wherein the second support member is integrally fixed to the first support member.

16. The exposure apparatus according to claim 15, wherein both ends of the second support member in the longitudinal direction are fixed to the first support member in a suspended state.

17. The exposure apparatus according to claim 1, wherein the second support member is placed so as to be mechanically separated from the first support member,
the exposure apparatus further comprising;
an adjustment device that adjusts a position of the second support member so as to maintain a relative position of the second support member with respect to the first support member.

18. The exposure apparatus according to claim 17, wherein the adjustment device includes a relative position measuring system that obtains relative positional information of the second support member with respect to the first support member, a drive system that drives the second support member at least along the two-dimensional plane, and a controller that controls the drive system using measurement information of the relative position measuring system.

19. The exposure apparatus according to claim 18, wherein the relative position measuring system obtains the positional information of the second support member with respect to the first support member in directions of six degrees of freedom, and
the drive system drives the second support member in the directions of six degrees of freedom.

20. The exposure apparatus according to claim 18, wherein the relative position measuring system has a sensor that irradiates a target section with a measurement beam and detects return light from the target section, and obtains the relative positional information of the second support member with respect to the first support member using an output of the sensor, the sensor being attached to one of the first support member and the second support member and a target section being arranged at the other of the first support member and the second support member.

21. The exposure apparatus according to claim 20, wherein the sensor includes at least one of an encoder system and an optical interferometer system.

22. The exposure apparatus according to claim 1, wherein the movable body has a first surface opposed to the guide surface forming member and parallel to the two-dimensional plane, on which the measurement surface is placed, and a second surface on a side opposite to the first surface and parallel to the two-dimensional plane, on which the object is mounted.

23. The exposure apparatus according to claim 1, wherein on the measurement surface, a grating whose periodic direction is in a direction parallel to the two-dimensional plane is placed, and
the measurement member includes an encoder head that irradiates the grating with a measurement beam and receives diffraction light from the grating.

24. The exposure apparatus according to claim 1, wherein the measurement system has the measurement member whose substantial measurement center coincides with an exposure position that is a center of an irradiation area of the energy beam irradiated on the object.

25. The exposure apparatus according to claim 24, further comprising:
a mark detecting system that detects a mark placed on the object, wherein
the measurement system further has another measurement member whose substantial measurement center coincides with a detection center of the mark detecting system.

26. The exposure apparatus according to claim 1, wherein the border line extends in a direction parallel to the first axis.

27. The exposure apparatus according to claim 26, comprising:
an exposure processing section in which exposure processing of irradiating the object with the energy beam is performed; and
a measurement processing section which is placed on one side in the direction parallel to the first axis so as to be away from the exposure processing section and in which measurement processing on the object is performed.

28. The exposure apparatus according to claim 27, wherein a first and a second movable bodies at each of which the measurement surface is arranged and which are independently movable along the guide surface while each holding the object are provided as the movable body,
the exposure apparatus further comprising:
a first drive system that drives the first and second movable bodies.

29. The exposure apparatus according to claim 28, wherein the guide surface forming member has a plurality of sections that include the first section and the second section, and the plurality of sections are respectively configured of a plurality of surface plates that are placed via a predetermined clearance corresponding to the border line,
the exposure apparatus further comprising:
a base member that supports the plurality of surface plates such that the plurality of surface plates are movable within a plane parallel to the two-dimensional plane.

30. The exposure apparatus according to claim 29, further comprising:
a surface plate driving system that includes a stator arranged at the base member and a mover arranged at each of the plurality of surface plates, and drives the plurality of surface plates with respect to the base member by a drive force generated between the mover and the stator.

31. The exposure apparatus according to claim 29, wherein the second support member is in a noncontact state with all of the plurality of surface plates and the base member.

32. The exposure apparatus according to claim 28, wherein the second support member has a longitudinal direction in the direction parallel to the first axis.

33. The exposure apparatus according to claim 32, wherein the second support member is integrally fixed to the first support member.

34. The exposure apparatus according to claim 33, wherein both ends of the second support member in the longitudinal direction are fixed to the first support member in a suspended state.

35. The exposure apparatus according to claim 32, wherein the second support member is placed so as to be mechanically separated from the first support member,
the exposure apparatus further comprising:
an adjustment device that adjusts a position of the second support member so as to maintain a relative position of the second support member with respect to the first support member.

36. The exposure apparatus according to claim 35, wherein the adjustment device includes a relative position measuring system that obtains relative positional information of the second support member with respect to the first support member, a second drive system that drives the second support member at least on the two-dimensional plane, and a controller that controls the second drive system using measurement information of the relative position measuring system.

37. The exposure apparatus according to claim 36, wherein the relative position measuring system obtains the positional information of the second support member with respect to the first support member in directions of six degrees of freedom, and
the second drive system drives the second support member in the directions of six degrees of freedom.

38. The exposure apparatus according to claim 36, wherein the relative position measuring system has a pair of sensors that are integrally attached to the first support member, and
the pair of sensors irradiate measurement beams respectively on one end and the other end of the second support member in the longitudinal direction and measure the relative positional information of the second support member with respect to the first support member.

39. The exposure apparatus according to claim 38, wherein the sensor includes at least one of an encoder system and an optical interferometer system.

40. The exposure apparatus according to claim 28, wherein on at least one of the plurality of surface plates that is opposed to the second support member, a light-transmitting section which the measurement beam can pass through is formed.

41. The exposure apparatus according to claim 28, wherein the first and second movable bodies are driven by the first drive system in the directions of six degrees of freedom on the surface plates.

42. The exposure apparatus according to claim 28, wherein each of the first and second movable bodies has a first surface opposed to the surface plates and parallel to the two-dimensional plane, on which the measurement surface is placed, and a second surface on a side opposite to the first surface and parallel to the two-dimensional plane, on which the object is mounted.

43. The exposure apparatus according to claim 28, wherein on the measurement surface of each of the first and second movable bodies, a grating whose periodic direction is in a direction parallel to the two-dimensional plane is placed, and
the measurement member includes an encoder head that irradiates the grating with a measurement beam and receives diffraction light from the grating.

44. The exposure apparatus according to claim 28, wherein the measurement system can further obtain positional information of the first and second movable bodies in a direction orthogonal to the two-dimensional plane.

45. The exposure apparatus according to claim 44, wherein the measurement system obtains the positional information of the first and second movable bodies in the direction orthogonal to the two-dimensional plane, at least at three noncollinear positions.

46. The exposure apparatus according to claim 28, wherein each of the first and second movable bodies includes a first movable member that is driven on the surface plates by the first drive system and a second movable member that holds the object and is supported by the first movable member so as to be relatively movable with respect to the first movable member, and the measurement surface is placed at the second movable member.

47. The exposure apparatus according to claim 46, wherein each of the first and second movable bodies further includes a third drive system that drives the second movable member with respect to the first movable member in directions of six degrees of freedom that include a first axis direction and a second axis direction orthogonal to each other within the two-dimensional plane.

48. The exposure apparatus according to claim 28, wherein the plurality of sections of the guide surface forming member include a first area surface plate that forms a first movement area in which each of the first and second movable bodies moves when exposure on the object is performed, and a second area surface plate that forms a second movement area in which each of the first and second movable bodies moves back and forth during a period after the exposure on the object is completed until exposure on a next object is started.

49. The exposure apparatus according to claim 27, wherein the measurement system has the measurement member whose substantial measurement center coincides with an exposure position that is a center of an irradiation area of the energy beam irradiated on the object.

50. The exposure apparatus according to claim 49, further comprising:
a mark detecting system that detects a mark placed on the object, wherein
the measurement system further has another measurement member whose substantial measurement center coincides with a detection center of the mark detecting system.

51. The exposure apparatus according to claim 1, wherein the border line extends in a direction parallel to the second axis.

52. The exposure apparatus according to claim 51, comprising:
an exposure processing section in which exposure processing of irradiating the object with the energy beam is performed; and
a measurement processing section which is placed on one side in the direction parallel to the first axis so as to be away from the exposure processing section and in which measurement processing on the object is performed, wherein
the border line is located between the exposure processing section and the measurement processing section.

53. The exposure apparatus according to claim 51, wherein both ends of the second support member in the longitudinal direction are fixed to the first support member in a suspended state.

54. The exposure apparatus according to claim 51, wherein the second support member is mechanically separated from the first support member,
the exposure apparatus further comprising:
an adjustment device that adjusts a position of the second support member so as to maintain a relative position of the second support member with respect to the first support member.

55. The exposure apparatus according to claim 54, wherein the adjustment device includes a relative position measuring system that obtains positional information of the second support member with respect to the first support member, and a drive system that drives the second support member at least along the two-dimensional plane.

56. The exposure apparatus according to claim 55, wherein the relative position measuring system obtains the positional information of the second support member with respect to the first support member in directions of six degrees of freedom, and
the drive system drives the second support member in the directions of six degrees of freedom.

57. The exposure apparatus according to claim 55, wherein the relative position measuring system has a pair of sensors that are integrally attached to the first support member, and
the pair of sensors irradiate measurement beams respectively on one end and the other end of the second support member in the longitudinal direction and obtain the positional information of the second support member with respect to the first support member.

58. The exposure apparatus according to claim 57, wherein the sensor includes at least one of an encoder system and an optical interferometer system.

59. The exposure apparatus according to claim 51, wherein the measurement system can further obtain positional information in a direction orthogonal to the two-dimensional plane of the movable body located in the exposure processing section.

60. The exposure apparatus according to claim 59, wherein the measurement system obtains the positional information in the direction orthogonal to the two-dimensional plane of the movable body located in the exposure processing section, at least at three noncollinear positions.

61. The exposure apparatus according to claim 51, wherein the movable body includes a first movable member that is driven on the guide surface and a second movable member that holds the object and is supported by the first movable member so as to be relatively movable with respect to the first movable member, and
the measurement surface is placed at the second movable member.

62. The exposure apparatus according to claim 61, wherein the movable body further includes a drive system that drives the second movable member with respect to the first movable member in directions of six degrees of freedom that include a first axis direction and a second axis direction orthogonal to each other within the two-dimensional plane.

63. The exposure apparatus according to claim 51, wherein the movable body has a first surface capable of being opposed to the guide surface forming member and parallel to the two-dimensional plane, on which the measurement surface is placed, and a second surface on a side opposite to the first surface and parallel to the two-dimensional plane, on which the object is mounted.

64. The exposure apparatus according to claim 51, wherein a substantial measurement center of the measurement member coincides with an exposure position that is a center of an irradiation area of the energy beam irradiated on the object.

65. The exposure apparatus according to claim 51, further comprising:
a control system that controls a position of the movable body using the positional information of the movable body obtained by the measurement system.

66. The exposure apparatus according to claim 51, wherein the second support member has a longitudinal direction in the direction parallel to the first axis.

67. The exposure apparatus according to claim 66, wherein the measurement surface is arranged at the movable body, and
the measurement system has the measurement member a part of which is fixed to the second support member, and obtains positional information at least within the two-dimensional plane of the movable body located in the exposure processing section based on an output of the measurement member, the part of the measurement member including an optical system that irradiates the measurement surface of the movable body with a measurement beam from below when the movable body is located in the exposure processing section and receives light from the measurement surface.

68. The exposure apparatus according to claim 67, wherein the measurement system further has another measurement member a part of which is fixed to the second support member, and further obtains positional information at least within the two-dimensional plane of the movable body located in the measurement processing section based on an output of the another measurement member, the part of the another measurement member including an optical system that irradiates the measurement surface of the movable body with a measurement beam from below when the movable body is located in the measurement processing section and receives light from the measurement surface.

69. The exposure apparatus according to claim 68, wherein the second support member is made up of a plurality of support members, and includes a support member at which the measurement member is arranged that obtains the positional information of the movable body at least within the two-dimensional plane when the movable body is located in the exposure processing section and a support member at which the another measurement member is arranged that obtains the positional information of the movable body at least within the two-dimensional plane when the movable body is located in the measurement processing section.

70. The exposure apparatus according to claim 67, wherein on the measurement surface of the movable body, a grating whose periodic direction is in a direction parallel to the two-dimensional plane is placed, and
the measurement member includes an encoder head that irradiates the grating with a measurement beam and receives diffraction light from the grating.

71. The exposure apparatus according to claim 67, wherein the plurality of sections are respectively configured of a plurality of surface plates that are placed via a predetermined clearance corresponding to the border line,
the exposure apparatus further comprising:
a base member that supports the plurality of surface plates that configure the plurality of sections such that the plurality of surface plates are movable within a plane parallel to the two-dimensional plane.

72. The exposure apparatus according to claim 71, further comprising:
a surface plate driving system that includes a stator arranged at the base member and a mover arranged at each of the plurality of surface plates, and drives the plurality of surface plates with respect to the base member by a drive force generated between the mover and the stator.

73. The exposure apparatus according to claim 71, wherein the second support member is in a noncontact state with all of the plurality of surface plates and the base member.

74. The exposure apparatus according to claim 71, wherein on at least one of the plurality of surface plates that is opposed to the second support member, a light-transmitting section which the measurement beam from the measurement member can pass through is formed.

75. The exposure apparatus according to claim 51, wherein the second support member has a longitudinal direction in the direction parallel to the second axis.

76. A device manufacturing method, comprising:
exposing an object using the exposure apparatus according to claim 1; and
developing the exposed object.

77. An exposure apparatus that exposes an object with an energy beam via an optical system supported by a first support member, the apparatus comprising:
a movable body which is movable along a predetermined two-dimensional plane that includes a first axis and a second axis orthogonal to each other, while holding the object, and at which a measurement surface parallel to the two-dimensional plane is arranged;
an exposure processing section in which exposure processing of irradiating the object with the energy beam is performed;
a measurement processing section which is placed on one side in a direction parallel to the first axis within the two-dimensional plane so as to be away from the exposure processing section and in which measurement processing on the object is performed;
a plurality of guide surface forming members which include a first and a second guide surface forming members that are adjacently placed via a predetermined clearance extending in a direction parallel to the second axis between the exposure processing section and the measurement processing section, and which form a guide surface used when the movable body moves along the two-dimensional plane; and
a measurement system which has a first measurement member that includes at least a part of an optical system placed below the plurality of guide surface forming members and that has a constant positional relation with the first support member, and which obtains positional information within the two-dimensional plane of the movable body located in the exposure processing section based on an output of the first measurement member, the optical system irradiating the measurement surface of the movable body with a measurement beam from below when the movable body is located in the exposure processing section and receiving light from the measurement surface.

78. The exposure apparatus according to claim 77, further comprising:
a base member that supports the plurality of guide surface forming members such that the plurality of guide surface forming members are movable within a plane parallel to the two-dimensional plane.

79. The exposure apparatus according to claim 78, further comprising:
a guide surface forming member driving system that includes a stator arranged at the base member and a mover arranged at each of the plurality of guide surface forming members, and drives the plurality of guide surface forming members with respect to the base member by a drive force generated between the mover and the stator.

80. The exposure apparatus according to claim 77, wherein the measurement system further has a second measurement member that includes at least a part of an optical system placed below the plurality of guide surface forming members and that has a constant positional relation with the first support member, and further obtains positional information within the two-dimensional plane of the movable body located in the measurement processing section based on an output of the second measurement member, the optical system irradiating the measurement surface of the movable body with a measurement beam from below when the movable body is located in the measurement processing section and receiving light from the measurement surface.

81. The exposure apparatus according to claim 80, further comprising:
a first measurement member supporting member that has a constant positional relation with the first support member at which the at least apart of the second measurement member is placed, and has a longitudinal direction in the direction parallel to the second axis.

82. The exposure apparatus according to claim 81, wherein the first measurement member supporting member is in a noncontact state with all of the plurality of guide surface forming members and the base member.

83. The exposure apparatus according to claim 81, wherein both ends of the first measurement member supporting member in the longitudinal direction are fixed to the first support member in a suspended state.

84. The exposure apparatus according to claim 81, wherein the first measurement member supporting member is mechanically separated from the first support member, the exposure apparatus further comprising:
a first adjustment device that adjusts a position of the first measurement member supporting member so as to maintain a relative position of the first measurement member supporting member with respect to the first support member.

85. The exposure apparatus according to claim 84, wherein the first adjustment device includes a first relative position measuring system that obtains positional information of the first measurement member supporting member with respect to the first support member, and a drive system that drives the first measurement member supporting member along the two-dimensional plane.

86. The exposure apparatus according to claim 85, wherein the first relative position measuring system obtains the positional information of the first measurement member supporting member with respect to the first support member in directions of six degrees of freedom, and the drive system drives the first measurement member supporting member in the directions of six degrees of freedom.

87. The exposure apparatus according to claim 85, wherein the first relative position measuring system has a pair of sensors that are integrally attached to the first support member, and
the pair of sensors irradiate measurement beams respectively on one end and the other end of the first measurement member supporting member in the longitudinal direction and obtain the positional information of the first measurement member supporting member with respect to the first support member.

88. The exposure apparatus according to claim 87, wherein the sensor includes at least one of an encoder system and an optical interferometer system.

89. The exposure apparatus according to claim 81, wherein on at least one of the plurality of guide surface forming members that is opposed to the first measurement member supporting member, a light-transmitting section which the measurement beam from the second measurement member can pass through is formed.

90. The exposure apparatus according to claim 80, wherein on the measurement surface of the movable body, a grating whose periodic direction is in a direction parallel to the two-dimensional plane is placed, and
the second measurement member includes an encoder head that irradiates the grating with a measurement beam and receives diffraction light from the grating.

91. The exposure apparatus according to claim 80, further comprising:
a mark detecting system that detects a mark placed on the object, wherein
a substantial measurement center of the second measurement member coincides with a detection center of the mark detecting system.

92. The exposure apparatus according to claim 80, further comprising:
a second measurement member supporting member that has a constant positional relation with the first support member at which the at least a part of the first measurement member is placed, and has a longitudinal direction in the direction parallel to the second axis.

93. The exposure apparatus according to claim 92, wherein the second measurement member supporting member is in a noncontact state with all of the plurality of guide surface forming members and the base member.

94. The exposure apparatus according to claim 92, wherein both ends of the second measurement member supporting member in the longitudinal direction are fixed to the first support member in a suspended state.

95. The exposure apparatus according to claim 92, wherein the second measurement member supporting member is mechanically separated from the first support member, the exposure apparatus further comprising:
a second adjustment device that adjusts a position of the second measurement member supporting member so as to maintain a relative position of the second measurement member supporting member with respect to the first support member.

96. The exposure apparatus according to claim 95, wherein the second adjustment device includes a second relative position measuring system that obtains positional information of the second measurement member supporting member with respect to the first support member, and a drive system that drives the second measurement member supporting member along the two-dimensional plane.

97. The exposure apparatus according to claim 96, wherein
the second relative position measuring system obtains the positional information of the second measurement member supporting member with respect to the first support member in directions of six degrees of freedom, and
the drive system drives the second measurement member supporting member in the directions of six degrees of freedom.

98. The exposure apparatus according to claim 96, wherein
the second relative position measuring system has a pair of sensors that are integrally attached to the first support member, and
the pair of sensors irradiate measurement beams respectively on one end and the other end of the second measurement member supporting member in the longitudinal direction and measure the positional information of the second measurement member supporting member with respect to the first support member.

99. The exposure apparatus according to claim 98, wherein
the sensor includes at least one of an encoder system and an optical interferometer system.

100. The exposure apparatus according to claim 92, wherein
on at least one of the plurality of guide surface forming members that is opposed to the second measurement member supporting member, a light-transmitting section which the measurement beam from the first measurement member can pass through is formed.

101. The exposure apparatus according to claim 77, wherein
on the measurement surface of the movable body, a grating whose periodic direction is in a direction parallel to the two-dimensional plane is placed, and
the first measurement member includes an encoder head that irradiates the grating with a measurement beam and receives diffraction light from the grating.

102. The exposure apparatus according to claim 77, wherein
the measurement system can further obtain positional information in a direction orthogonal to the two-dimensional plane of the movable body located in the exposure processing section.

103. The exposure apparatus according to claim 102, wherein
the measurement system obtains the positional information in the direction orthogonal to the two-dimensional plane of the movable body located in the exposure processing section, at least at three noncollinear positions.

104. The exposure apparatus according to claim 77, wherein
the movable body includes a first movable member that is driven on the guide surface forming members and a second movable member that holds the object and is supported by the first movable member so as to be relatively movable with respect to the first movable member, and
the measurement surface is placed at the second movable member.

105. The exposure apparatus according to claim 104, wherein
the movable body further includes a drive system that drives the second movable member with respect to the first movable member in directions of six degrees of freedom that include a first axis direction and a second axis direction orthogonal to each other within the two-dimensional plane.

106. The exposure apparatus according to claim 77, wherein
the movable body has a first surface capable of being opposed to the plurality of guide surface forming members and parallel to the two-dimensional plane, on which the measurement surface is placed, and a second surface on a side opposite to the first surface and parallel to the two-dimensional plane, on which the object is mounted.

107. The exposure apparatus according to claim 77, wherein
a substantial measurement center of the first measurement member coincides with an exposure position that is a center of an irradiation area of the energy beam irradiated on the object.

108. The exposure apparatus according to claim 77, further comprising:
a control system that controls a position of the movable body using the positional information of the movable body obtained by the measurement system.

109. A device manufacturing method, comprising:
exposing an object using the exposure apparatus according to claim 77; and
developing the exposed object.

110. An exposure method of exposing an object with an energy beam via an optical system supported by a first support member, the method comprising:
moving a movable body that is movable along a two-dimensional plane that includes a first axis and a second axis orthogonal to each other, while holding the object, on a guide surface formed by a first section and a second section of a guide surface forming member, the guide surface forming member having the first section and the second section that are placed side by side with at least one border line serving as a boundary, within the two-dimensional plane; and
obtaining positional information of the movable body at least within the two-dimensional plane, based on an output of a measurement member that irradiates a measurement surface parallel to the two-dimensional plane with a measurement beam and receives light from the measurement surface, the measurement surface being arranged at one of a second support member that is placed on a side opposite to the optical system via the guide surface forming member so as to be away from the guide surface forming member and having a positional relation with the first support member maintained in a predetermined relation and the movable body, and at least a part of the measurement member being arranged at the other of the second support member and the movable body.

111. A device manufacturing method, comprising:
exposing an object using the exposure method according to claim 110; and
developing the exposed object.

112. An exposure method of exposing an object with an energy beam via an optical system supported by a first support member, the method comprising:

moving a movable body that is movable along a two-dimensional plane that includes a first axis and a second axis orthogonal to each other, while holding the object, on a guide surface formed by a plurality of guide surface forming members which include a first and a second guide surface forming members that are adjacently placed via a predetermined clearance extending in a direction parallel to the second axis, between an exposure processing section and a measurement processing section, the exposure processing section being a section in which exposure processing of irradiating the object with the energy beam is performed and the measurement processing section being a section in which measurement processing on the object is performed, and the exposure processing section and the measurement processing section being placed apart in a direction parallel to the first axis within the two-dimensional plane; and obtaining positional information within the two-dimensional plane of the movable body located in the exposure processing section based on an output of a first measurement member that includes at least a part of an optical system placed below the plurality of guide surface forming members and that has a constant positional relation with the first support member, the optical system irradiating a measurement surface arranged at the movable body with a measurement beam from below when the movable body is located in the exposure processing section and receiving light from the measurement surface.

113. A device manufacturing method, comprising:

exposing an object using the exposure method according to claim 112; and developing the exposed object.

* * * * *